(12) United States Patent
Odagawa et al.

(10) Patent No.: US 7,005,691 B2
(45) Date of Patent: Feb. 28, 2006

(54) MAGNETORESISTANCE ELEMENT AND MAGNETORESISTANCE STORAGE ELEMENT AND MAGNETIC MEMORY

(75) Inventors: Akihiro Odagawa, Nara (JP); Masayoshi Hiramoto, Ikoma (JP); Nozomu Matsukawa, Nara (JP); Masahiro Deguchi, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 335 days.

(21) Appl. No.: 10/470,670

(22) PCT Filed: Jun. 4, 2002

(86) PCT No.: PCT/JP02/05494
§ 371 (c)(1),
(2), (4) Date: Jul. 29, 2003

(87) PCT Pub. No.: WO02/099906
PCT Pub. Date: Dec. 12, 2002

(65) Prior Publication Data
US 2004/0052006 A1 Mar. 18, 2004

(30) Foreign Application Priority Data
Jun. 4, 2001 (JP) .............. 2001-167971
Jun. 4, 2001 (JP) .............. 2001-167973

(51) Int. Cl.
*H01L 31/119* (2006.01)

(52) U.S. Cl. ............ 257/295; 257/296; 257/421; 257/422; 257/903; 257/904; 365/158; 365/171; 438/3; 438/257

(58) Field of Classification Search ........... 257/295, 257/296, 421, 422, 903, 904, 905, 906, 907, 257/908; 438/3, 48, 50, 104, 238, 239, 241, 438/257, 672, 692; 365/158, 171, 173
See application file for complete search history.

(56) References Cited

U.S. PATENT DOCUMENTS

| 5,986,858 A | * 11/1999 | Sato et al. ............ 360/324.2 |
| 6,252,749 B1 | 6/2001 | Hayakawa |
| 6,325,900 B1 | 12/2001 | Komuro et al. |
| 6,327,107 B1 | 12/2001 | Komuro et al. |
| 6,496,338 B1 | * 12/2002 | Hasegawa et al. ..... 360/324.12 |
| 6,570,744 B1 | 5/2003 | Fujikata et al. |
| 6,667,860 B1 | 12/2003 | Granstrom et al. |

FOREIGN PATENT DOCUMENTS

| EP | 0 913 830 | 5/1999 |
| EP | 0953849 | 11/1999 |

(Continued)

OTHER PUBLICATIONS

L.J. Schwee (1972), "Proposal on Cross–Tie Wall and Bloch Line Propagation in Thin Magnetic Films" in Intermag Conference, Kyoto, pp. 405–407.

(Continued)

*Primary Examiner*—David Nelms
*Assistant Examiner*—Long Tran
(74) *Attorney, Agent, or Firm*—Merchant & Gould P.C.

(57) ABSTRACT

A magnetoresistance element, wherein a first electric conductor is so formed as to contact almost the center of the surface opposite to a non-magnetic layer of a first ferromagnetic layer so formed as to sandwich, along with a second ferromagnetic layer, the non-magnetic layer, and an insulator so formed as to cover at least the side surface of the first ferromagnetic layer and the non-magnetic layer is formed so as to cover the peripheral edge of the surface of the first ferromagnetic layer, whereby it is possible to prevent a leakage current from flowing from the first electric conductor to a second electric conductor along the side surfaces of the first ferromagnetic layer, the non-magnetic layer and the second ferromagnetic layer, and to make uniform a bias current running from the first electric conductor to the second electric conductor to thereby restrict variations in magnetoresistance characteristics such as MR value and junction resistance.

3 Claims, 31 Drawing Sheets

FOREIGN PATENT DOCUMENTS

| | | |
|---|---|---|
| EP | 1061592 | 12/2000 |
| EP | 1182713 | 2/2002 |
| JP | 11-316919 | 11/1999 |
| JP | 2000-340859 | 8/2000 |
| JP | 2000-331473 | 11/2000 |
| JP | 2000-340857 | 12/2000 |
| JP | 2001-43518 | 2/2001 |
| JP | 2002-092824 | 3/2002 |
| JP | 2003520419 | 7/2003 |
| WO | WO 01/25807 A2 | 4/2001 |

OTHER PUBLICATIONS

A.V. Pohm et al. (Sep. 1992), "A High Output Mode For Submicron M–R Memory Cells" in IEEE Trans. On Magn. vol. 28, No. 5, pp 2356–2358.

M.N. Baibich et al. (Nov. 21, 1988), "Giant Magnetoresistance of (001) Fe/(001)Cr Magnetic Superlattices" in Physical Review Letter, vol. 61, No. 21 pp 2472–2475.

K.T.M. Tanmuthu et al. (Nov. 1993), "New Low Current Memory Modes With Giant Magneto–Resistance Materials" in IEEE Trans. on Magn. vol. 29, No. 6, pp 2593–2595.

B. Dieny et al. (1991), "Spin–valve effect in soft ferromagnetic sandwiches" in Journal of Magnetism and Magnetic Materials, 93, pp 101–104.

H. Sakakima et al. (Dec. 1, 1994), "Spin–Valve Effect in [{Co–Pt/CU/Ni–Fe–Co}/Cu] Multilayers", Jpn. J Appl. Phys. vol. 34, Part 2, No. 4A, L415–417.

Y. Irie et al. (Apr. 1, 1995), "Spin–Valve Memory Elements Using [{Co–Pt/CU/Ni–Fe–Co}/Cu] Multilayer", Jpn. J. Appl. Phys. vol. 34, Part 2, No. 4A, L415–517.

W.J. Gallagher et al. (Apr. 15, 1997) "Microstructured magnetic tunnel junctions (invited)" in J. Appl. Phys. 81(8), pp 3741–3746.

S. S. P. Parkin et al. (Apr. 15, 1999) Exchange–biased magnetic tunnel junctions and application to nonvolatile magnetic random access memory (invited) in J. Appl. Phys. vol. 85, No. 8, pp 5828–5833.

J.S. Moodera et al (Apr. 17, 1995), "Large Magnetoresistance at Room Temperature in Ferromagnetic Thin Film Tunnel Junctions" in Physical Review Letters, vol. 74, No. 16, pp 3273–3276.

J.S. Moodera et al. (Jul. 29, 1996), Geometrically enhanced magnetoresistance in ferromagnet–insulator–ferromagnet tunnel junctions in Appl. Phys. Lett. 69 (5), pp 708–710.

* cited by examiner

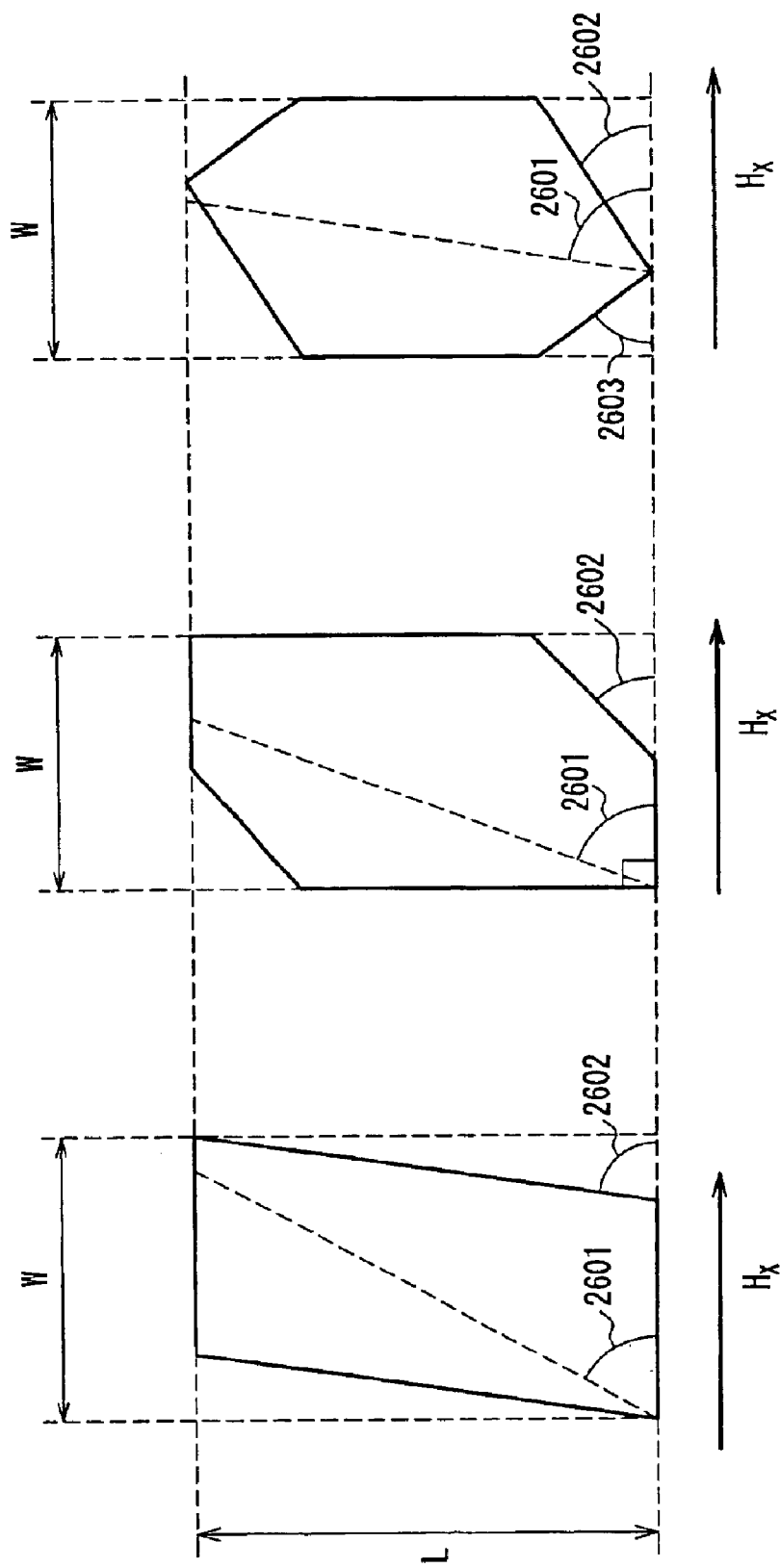

| Sample Number | MR [%] Average | MR [%] Dispersion | MR [%] Standard Deviation | RA [Ω μm²] Average | RA [Ω μm²] Dispersion | RA [Ω μm²] Standard Deviation | Bias Value [mV] | Current Density [$10^4$ A/cm²] | Shape |
|---|---|---|---|---|---|---|---|---|---|
| — | — | — | — | — | — | — | — | — | — |
| 1 | 30.5 | 0.21 | 0.46 | 22.2 | 3.24 | 1.80 | 200 | 255 | B |
| 2 | 30.3 | 0.30 | 0.55 | 18.5 | 4.50 | 2.12 | 200 | 250 | B |
| 3 | 31.2 | 3.12 | 1.77 | 18.5 | 45.3 | 6.73 | 180 | 4.35 | A |
| 4 | 30.5 | 0.32 | 0.57 | 37.6 | 4.90 | 2.21 | 200 | 121 | B |
| 5 | 29.3 | 1.80 | 1.34 | 46.0 | 16.8 | 4.10 | 200 | 89.3 | C |
| 6 | 30.1 | 0.35 | 0.59 | 40.5 | 5.10 | 2.26 | 200 | 136 | B |
| 7 | 30.5 | 0.35 | 0.59 | 257 | 7.25 | 2.69 | 200 | 78.5 | B |
| 8 | 30.2 | 0.25 | 0.50 | 284 | 6.11 | 2.47 | 200 | 65.0 | B |
| 9 | 28.6 | 0.92 | 0.96 | 998 | 17.3 | 4.16 | 200 | 12.4 | C |
| 10 | 29.4 | 1.10 | 1.05 | 1054 | 55.6 | 7.46 | 200 | 6.55 | C |
| 11 | 29.8 | 2.65 | 1.63 | 1302 | 70.3 | 8.38 | 200 | 1.11 | A |
| 12 | 30.2 | 3.11 | 1.76 | 1886 | 66.2 | 8.14 | 200 | 3.65 | A |
| 13 | 30.5 | 0.33 | 0.57 | 4236 | 12.2 | 3.49 | 200 | 198 | B |

FIG. 12

MAGNETORESISTANCE ELEMENT AND MAGNETORESISTANCE STORAGE ELEMENT AND MAGNETIC MEMORY

TECHNICAL FIELD

The present invention relates to a fine-shaped magnetoresistance element, a fine-shaped magnetoresistance storage element and a magnetic memory, and to a high-density magnetoresistance effect type storage device in which the above-mentioned magnetoresistance element, magnetoresistance storage element and magnetic memory are arranged in a matrix.

BACKGROUND ART

A solid-state magnetic memory device (MRAM) using a magnetoresistance effect (MR) film was proposed by L. J. Schwee in Proc. INTERMAG Conf. IEEE Trans. on Magn. Kyoto (1972) 405 and various types of MRAMs having a configuration including a word line that is a current line for generating recording magnetic field and a sense line for reading by the use of a MR film has been studied.

An example of such studies includes a study by A. V. Pohm et al. (IEEE Trans. on Magn. 28 (1992) 2356). These memory devices generally use a NiFe film, etc. having a MR change rate of about 2% and exhibiting an anisotropic MR effect (AMR). In such devices, there was a problem to improve the value of signals to be output.

There is a description of an artificial lattice film made of two magnetic films that are exchange-coupled to sandwich a non-magnetic film having a giant magnetoresistance effect (GMR) in M. N. Baibich et al., Phys. Rev. Lett. 61 (1988) 2472. Furthermore, a MRAM using such a GMR film has been proposed in K. T. M. Ranmuthu et al., IEEE Trans. on Magn. 29 (1993) 2593. However, although such a GMR film made of an antiferromagnetic exchange-coupling magnetic films has a large MR change rate, a larger magnetic field is required to be applied as compared with the above-mentioned AMR film. Therefore, there is a problem that a large current for recording and reading information is necessary.

In contrast to the above-mentioned exchange-coupling GMR film, as a nonexchange-coupling type GMR film, a spin bulb film using an antiferromagnetic film is described (B. Dieny et al., J. Magn. Magn. Mater. 93 (1991) 101). Furthermore, there is a description of a nonexchange-coupling type GMR film (spin bulb film) using a (semi)-hard magnetic film (H. Sakakima et al., Jpn. J. Appl. Phys. 33 (1994) L1668). This nonexchange-coupling type GMR film (spin bulb film) has the same low magnetic field as that of the AMR film and has a MR change rate larger than that of the AMR film. Furthermore, there is a description of a storage element having a nondestructive read out (NDRO) property in the MRAM using a spin bulb film of an anti-ferromagnetic film or a hard magnetic film (Y. Irie et al., Jpn. J. Appl. Phys. 34 (1995) L415). The present invention relates to this technology.

The non-magnetic film of the above-mentioned nonexchange-coupling type GMR film is a conductor film of Cu, etc. However, tunnel-type GMR films (TMR films) using an insulating film of oxide such as $Al_2O_3$ or $MgO$, etc. for a non-magnetic film have been studied increasingly and MRAMs using this TMR film have been proposed.

In the nonexchange-coupling type GMR film, it is known that the MR effect in the case where a current is allowed to flow perpendicular to the film surface (CPPMR) is larger than the MR effect in the case where a current is allowed to flow in parallel to the film surface (CIPMR). Furthermore, since the TMR film has a high impedance, by using the TMR film, a higher output can be expected.

However, when actually forming a magnetic memory or a magnetic head using a magnetoresistance element or a magnetoresistance storage element including such a spin bulb film, it is important to minimize variations in magnetoresistance properties of the element between elements and between processed wafers. In particular, it is important to restrict variations in a MR value (The MR value is defined by (Rap−Rp)/Rp, wherein Rp represents a resistance value when the magnetization directions of two ferromagnetic layers sandwiching a non-magnetic layer are placed in parallel with each other; and Rap represents a resistance value when the magnetization directions of two ferromagnetic layers sandwiching a non-magnetic layer are placed in non-parallel with each other. The MR resistance value becomes maximum when the resistance value is represented by Rap and the direction of magnetization of the two ferromagnetic layers are anti-parallel with each other.), a junction resistance value (The junction resistance value is represented generally by Rp×A, wherein A represents a junction area of elements) and variations in a bias dependency of the MR value and the junction resistance value.

When the size of the element becomes of a sub-micron order as a result of making the element to be fine, variations in the junction resistance value become significant. This is because the reduction of the junction area of the elements makes an electric contact between an element and an electrode material substantially difficult, thus making the distribution of the state of the electric contact on the junction surface to be uniform.

With the foregoing in mind, it is an object of the present invention to restrict variations in the magnetoresistance properties such as the MR value, the junction resistance value, etc. in a fine-patterned magnetoresistance element, magnetoresistance storage element and magnetic memory.

DISCLOSURE OF THE INVENTION

The magnetoresistance element of the present invention includes a non-magnetic layer, a first ferromagnetic layer and a second ferromagnetic layer formed so as to sandwich the non-magnetic layer, a first electric conductor formed so as to be brought into contact with substantially the center of the surface opposite to the non-magnetic layer of the first ferromagnetic layer, a second electric conductor formed so as to be brought into contact with the surface opposite to the non-magnetic layer of the second ferromagnetic layer, and an insulator formed so as to cover at least the side surfaces of the first ferromagnetic layer and the non-magnetic layer. In the magnetoresistance element, at least one of the first ferromagnetic layer and the second ferromagnetic layer is magnetized along the direction parallel to the first ferromagnetic layer and the second ferromagnetic layer. The magnetization of one of the first ferromagnetic layer and the second ferromagnetic layer is easily inverted by a magnetic field applied from the outside and another is not easily inverted by a magnetic field applied from the outside. The magnetoresistance element is operated by a current flowing from the first electric conductor to the second electric conductor through the first ferromagnetic layer, the non-magnetic layer and the second ferromagnetic layer. The first electric conductor and the second electric conductor are electrically insulated from each other by the insulator except that the first electric conductor is kept in electric contact with the second electric conductor by a current flowing through the first ferromagnetic layer, the non-magnetic layer and the second ferromagnetic layer. The insulator is formed so as to cover the peripheral edge of the surface of the first ferromagnetic layer.

The magnetoresistance storage element of the present invention includes a non-magnetic layer, a first ferromagnetic layer and a second ferromagnetic layer formed so as to sandwich the non-magnetic layer, a first electric conductor formed so as to be brought into contact with substantially the center of the surface opposite to the non-magnetic layer of the first ferromagnetic layer, a second electric conductor formed so as to be brought into contact with the surface opposite to the non-magnetic layer of the second ferromagnetic layer, and an insulator formed so as to cover at least the side surfaces of the first ferromagnetic layer and the non-magnetic layer. In the magnetoresistance storage element, at least one of the first ferromagnetic layer and the second ferromagnetic layer is magnetized along the direction parallel to the first ferromagnetic layer and the second ferromagnetic layer. The magnetization of one of the first ferromagnetic layer and the second ferromagnetic layer is easily inverted by a magnetic field applied from the outside and another is not easily inverted by a magnetic field applied from the outside. The magnetoresistance storage element is operated by a current flowing from the first electric conductor to the second electric conductor through the first ferromagnetic layer, the non-magnetic layer and the second ferromagnetic layer. The magnetoresistance storage element has at least two or more magnetization stable states in which the magnetization direction of the first ferromagnetic layer and the magnetization direction of the second ferromagnetic layer are parallel or non-parallel to each other, thereby exhibiting at least two or more storage states. The first electric conductor and the second electric conductor are electrically insulated from each other by the insulator except that the first electric conductor is kept in electric contact with the second electric conductor by a current flowing through the first ferromagnetic layer, the non-magnetic layer and the second ferromagnetic layer. The insulator is formed so as to cover the peripheral edge of the surface of the first ferromagnetic layer.

The magnetic memory of the present invention includes a non-magnetic layer, a first ferromagnetic layer and a second ferromagnetic layer formed so as to sandwich the non-magnetic layer, a first electric conductor formed so as to be brought into contact with substantially the center of the surface opposite to the non-magnetic layer of the first ferromagnetic layer, a second electric conductor formed so as to be brought into contact with the surface opposite to the non-magnetic layer of the second ferromagnetic layer, an insulator formed so as to cover at least the side surfaces of the first ferromagnetic layer and the non-magnetic layer, and a non-magnetic conductive layer provided for inverting the magnetization of only the first ferromagnetic layer, or the magnetization of both the first ferromagnetic layer and the second ferromagnetic layer and arranged in a position that is not in electric contact with the first ferromagnetic layer, the second ferromagnetic layer, the first electric conductor and the second electric conductor. In the magnetic memory, at least one of the first ferromagnetic layer and the second ferromagnetic layer is magnetized along the direction parallel to the first ferromagnetic layer and the second ferromagnetic layer. The magnetization of one of the first ferromagnetic layer and the second ferromagnetic layer is easily inverted by a magnetic field applied from the outside and another is not easily inverted by a magnetic field applied from the outside. The magnetic memory is operated by a current flowing from the first electric conductor to the second electric conductor through the first ferromagnetic layer, the non-magnetic layer and the second ferromagnetic layer. The magnetoresistance storage element has at least two or more magnetization stable states in which the magnetization direction of the first ferromagnetic layer and the magnetization direction of the second ferromagnetic layer are parallel or non-parallel to each other, thereby exhibiting at least two or more storage states. The first electric conductor and the second electric conductor are electrically insulated from each other by the insulator except that the first electric conductor is kept in electric contact with the second electric conductor by a current flowing through the first ferromagnetic layer, the non-magnetic layer and the second ferromagnetic layer. The insulator is formed so as to cover the peripheral edge of the surface of the first ferromagnetic layer.

Another magnetoresistance element of the present invention includes a non-magnetic layer, a first ferromagnetic layer and a second ferromagnetic layer formed so as to sandwich the non-magnetic layer, a first electric conductor formed so as to be brought into contact with substantially the center of the surface opposite to the non-magnetic layer of the first ferromagnetic layer, a second electric conductor formed so as to be brought into contact with the surface opposite to the non-magnetic layer of the second ferromagnetic layer, and an insulator formed so as to cover at least the side surfaces of the first ferromagnetic layer and the non-magnetic layer. In the magnetoresistance element, at least one of the first ferromagnetic layer and the second ferromagnetic layer is magnetized along the direction parallel to the first ferromagnetic layer and the second ferromagnetic layer. The magnetization of one of the first ferromagnetic layer and the second ferromagnetic layer is easily inverted by a magnetic field applied from the outside and another is not easily inverted by a magnetic field applied from the outside. The magnetoresistance element is operated by a current flowing from the first electric conductor to the second electric conductor through the first ferromagnetic layer. The non-magnetic layer and the second ferromagnetic layer, the first electric conductor and the second electric conductor are electrically insulated from each other by the insulator except that the first electric conductor is kept in electric contact with the second electric conductor by a current flowing through the first ferromagnetic layer, the non-magnetic layer and the second ferromagnetic layer. The insulator covers the peripheral edge of the surface of the first ferromagnetic layer so that the magnetoresistance element operates by at least $1 \times 10^5$ amperes/cm$^2$ or more of current flowing from the first electric conductor to the second electric conductor through the first ferromagnetic layer, the non-magnetic layer and the second ferromagnetic layer.

Another magnetoresistance storage element of the present invention includes a non-magnetic layer, a first ferromagnetic layer and a second ferromagnetic layer formed so as to sandwich the non-magnetic layer, a first electric conductor formed so as to be brought into contact with substantially the center of the surface opposite to the non-magnetic layer of the first ferromagnetic layer, a second electric conductor formed so as to be brought into contact with the surface opposite to the non-magnetic layer of the second ferromagnetic layer, an insulator formed so as to cover at least the side surfaces of the first ferromagnetic layer and the non-magnetic layer, and a non-magnetic conductive layer provided for inverting the magnetization of only the first ferromagnetic layer, or the magnetization of both the first ferromagnetic layer and the second ferromagnetic layer and arranged in a position that is not in electric contact with the first ferromagnetic layer, the second ferromagnetic layer, the first electric conductor and the second electric conductor. In magnetoresistance storage element, at least one of the first ferromagnetic layer and the second ferromagnetic layer is magnetized along the direction parallel to the first ferromagnetic layer and the second ferromagnetic layer. The magnetization of one of the first ferromagnetic layer and the second ferromagnetic layer is easily inverted by a magnetic field applied from the outside and another is not easily inverted by a magnetic field applied from the outside. The magnetoresistance storage element has at least two or more magnetization stable states in which the magnetization direction of the first ferromagnetic layer and the magnetization direction of the second ferromagnetic layer are parallel or non-parallel to each other, thereby exhibiting at least two or more storage states. The first electric conductor and the second electric conductor are electrically insulated from each other by the insulator except that the first electric conductor is kept in electric contact with the second electric conductor by a current flowing through the first ferromagnetic layer, the non-magnetic layer and the second ferromagnetic layer. The magnetoresistance storage element reads out a storage state by detecting the change in the magnetoresistance by allowing a first current to flow from the first electric conductor to the second electric conductor through the first ferromagnetic layer, the non-magnetic layer and the second ferromagnetic layer; writes a storage state by a magnetic field generated by allowing a second current to flow through the non-magnetic conductive layer; or writes the storage state by a resultant magnetic field generated by allowing a second current to flow through the non-magnetic conductive layer and a third current, in synchronization with the second current, to flow through the first conductor or the second conductor. The insulator covers the peripheral edge of the surface of the first ferromagnetic layer so as to read out the storage state by at least $1 \times 10^5$ amperes/cm$^2$ or more of the first current flowing from the first electric conductor to the second electric conductor through the first ferromagnetic layer, the non-magnetic layer, and the second ferromagnetic layer.

Another magnetic memory of the present invention includes a storage element array in which magnetoresistance storage elements are arranged two-dimensionally or three-dimensionally, a first transistor connected to the first electric conductor or the second electric conductor for selectively reading out the information stored in the storage element array, a sensitivity amplifier connected to a bit line outputting the change in the magnetoresistance of the magnetoresistance storage element, a second transistor connected to the non-magnetic conductor for selectively writing information to be stored in the storage element array, and a current source connected to the non-magnetic conductor connected to the non-magnetic conductor. The magnetoresistance storage elements includes a non-magnetic layer, a first ferromagnetic layer and a second ferromagnetic layer formed so as to sandwich the non-magnetic layer, a first electric conductor formed so as to be brought into contact with substantially the center of the surface opposite to the non-magnetic layer of the first ferromagnetic layer, a second electric conductor formed so as to be brought into contact with the surface opposite to the non-magnetic layer of the second ferromagnetic layer, an insulator formed so as to cover at least the side surfaces of the first ferromagnetic layer and the non-magnetic layer, and a non-magnetic conductive layer provided for inverting the magnetization of only the first ferromagnetic layer, or the magnetization of both the first ferromagnetic layer and the second ferromagnetic layer and arranged in a position that is not in electric contact with the first ferromagnetic layer, the second ferromagnetic layer, the first electric conductor and the second electric conductor. In the electromagnetic storage element, at least one of the first ferromagnetic layer and the second ferromagnetic layer is magnetized along the direction parallel to the first ferromagnetic layer and the second ferromagnetic layer. The magnetization of one of the first ferromagnetic layer and the second ferromagnetic layer is easily inverted by a magnetic field applied from the outside and another is not easily inverted by a magnetic field applied from the outside. The magnetoresistance storage element has at least two or more magnetization stable states in which the magnetization direction of the first ferromagnetic layer and the magnetization direction of the second ferromagnetic layer are parallel or non-parallel to each other, thereby exhibiting at least two or more storage states. The first electric conductor and the second electric conductor are electrically insulated from each other by the insulator except that the first electric conductor is kept in electric contact with the second electric conductor by a current flowing through the first ferromagnetic layer, the non-magnetic layer and the second ferromagnetic layer. The magnetoresistance storage element reads out a storage state by detecting the change in the magnetoresistance by allowing a first current to flow from the first electric conductor to the second electric conductor through the first ferromagnetic layer, the non-magnetic layer and the second ferromagnetic layer; writes a storage state by a magnetic field generated by allowing a second current to flow through the non-magnetic conductive layer; or writes the storage state by a resultant magnetic field generated by allowing a second current to flow through the non-magnetic conductive layer and a third current, in synchronization with the second current, to flow through the first conductor or the second conductor.

BRIEF DESCRIPTION OF THE DRAWINGS

FIGS. 10A to 10C are top views showing the shapes of the element according to Embodiment 3 of the present invention.

FIG. 12 is a table showing the evaluation results of the magnetoresistance element according to Embodiment 3 of the present invention.

BEST MODE OF CARRYING OUT THE INVENTION

Figure 1A:
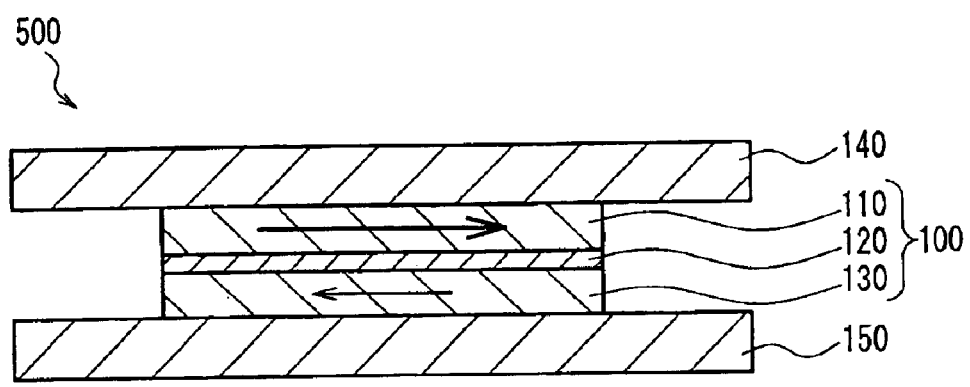
FIGS. 1A and 1B are cross-sectional views showing a magnetoresistance storage element according to Embodiment 1 of the present invention.

In the magnetoresistance element according to the present invention, a first electric conductor is formed so as to be brought into contact with substantially the center of the surface opposite to a non-magnetic layer of a first ferromagnetic layer so formed as to sandwich, along with a second ferromagnetic layer, a non-magnetic layer; and an insulator so formed as to cover at least the side surfaces of the first ferromagnetic layer and the non-magnetic layer is formed so as to cover the peripheral edge of the surface of the first ferromagnetic layer. Therefore, it is possible to prevent a leakage current from flowing from the first electric conductor to a second electric conductor along the side surface of the first ferromagnetic layer, the non-magnetic layer and the second ferromagnetic layer. Therefore, a bias current can flow uniformly from the first electric conductor to the second electric conductor via the first ferromagnetic layer, the non-magnetic layer and the second ferromagnetic layer. As a result, it is possible to restrict variations in magnetoresistance properties such the MR value and the junction resistance value, and the like.

It is preferable that the ratio of the area of the surface of the first ferromagnetic layer covered with the insulator is 5% or more and 60% or less relative to the area of the entire surface of the first ferromagnetic layer. It is advantageous because it is possible to restrict variations in the MR value and the junction resistance value in the magnetoresistance element significantly. If the ratio of the area of the surface of the first ferromagnetic layer to be covered with the insulator is less than 5%, a leakage current flows from the surface of the first ferromagnetic layer along the sides surface of the first ferromagnetic layer, the non-magnetic layer and the second ferromagnetic layer, to thus make uniform a bias current flowing through the first ferromagnetic layer, the non-magnetic layer and the second ferromagnetic layer, thereby causing the variations in the MR value and the junction resistance value. If the ratio of the area of the surface of the first ferromagnetic layer to be covered with an insulator is more than 60%, the less significant effect of restricting variations in the MR value and the junction resistance value is obtained as compared with the case where the ratio of the area is 5% or more and 60% or less.

It is preferable that at the end of the insulator that is formed so as to cover the peripheral edge of the surface of the first ferromagnetic layer, a slope having an angle with respect to the surface of the first ferromagnetic layer of 5° or more and less than 90° is formed. It is advantageous because it is possible to restrict variations in the MR value and the junction resistance value of the magnetoresistance element more significantly. In particular, when the angle is 30° or more and less than 80°, it is possible to restrict variations even more significantly.

It is preferable that the end of the insulator formed so as to cover the peripheral edge of the surface of the first ferromagnetic layer has a thickness of at least 1 nm or more with respect to the surface of the first ferromagnetic layer. It is advantageous because it is possible to prevent a leakage current from flowing through the surface of the first ferromagnetic layer.

It is preferable that at the end of the insulator formed so as to cover the peripheral edge of the surface of the first ferromagnetic layer, a curve having a radius of curvature of 5 nm or more is formed. It is advantageous because it is possible to form an insulator to cover the peripheral edge of the surface of the first ferromagnetic layer.

It is preferable that the ratio of the area of the surface of the first ferromagnetic layer that is brought into contact with the first electric conductor is larger than 40% and smaller than 95% of the area of the entire surface of the first ferromagnetic layer. It is advantageous because it is possible to restrict variations in the MR value and the junction resistance value of the magnetoresistance element more significantly. If the ratio of the area of the surface of the first ferromagnetic layer that is brought into contact with the first electric conductor is 95% or more, a leakage current flows from the surface of the first ferromagnetic layer along the side surfaces of the first ferromagnetic layer, the non-magnetic layer and the second ferromagnetic layer, to thus make a bias current flowing through the first ferromagnetic layer to be uniform, the non-magnetic layer and the second ferromagnetic layer, causing variations in the MR value and the junction resistance value. If the ratio of the area of the surface of the first ferromagnetic layer that is in contact with the first electric conductor is 40% or less, the less significant effect of restricting variations in the MR value and the junction resistance value can be obtained compared with the case where the ratio of the area is more than 40% and less than 95%.

It is preferable that at the end of the insulator formed so as to cover the peripheral edge of the surface of the first ferromagnetic layer, a slope having an angle with respect to the surface of the first ferromagnetic layer of 90° or more and less than 180° is formed. It is advantageous because it is possible to restrict variations in the MR value and the junction resistance value of the magnetoresistance element more significantly. In particular, when the angle is 90° or more and less than 140°, it is possible to restrict variations even more significantly.

In the magnetoresistance storage element of the present invention, a first electric conductor is so formed as to be brought into contact with substantially the center of the surface opposite to a non-magnetic layer of a first ferromagnetic layer so formed as to sandwich, along with a second ferromagnetic layer, a non-magnetic layer, and an insulator so formed as to cover at least the side surfaces of the first ferromagnetic layer and the non-magnetic layer is formed so as to cover the peripheral edge of the surface of the first ferromagnetic layer. Therefore, it is possible to prevent a leakage current from flowing from the first electric conductor to a second electric conductor along the side surface of the first ferromagnetic layer, the non-magnetic layer and the second ferromagnetic layer. Therefore, a bias current can flow uniformly from the first electric conductor to the second electric conductor via the first ferromagnetic layer, the non-magnetic layer and the second ferromagnetic layer. As a result, it is possible to restrict variations in magnetoresistance properties such the MR value and the junction resistance value, and the like.

In the magnetic memory of the present invention, a first electric conductor is so formed as to be brought into contact with substantially the center of the surface opposite to a non-magnetic layer of a first ferromagnetic layer so formed as to sandwich, along with a second ferromagnetic layer, a non-magnetic layer, and an insulator so formed as to cover at least the side surfaces of the first ferromagnetic layer and the non-magnetic layer is formed so as to cover the peripheral edge of the surface of the first ferromagnetic layer. Therefore, it is possible to prevent a leakage current from flowing from the first electric conductor to a second electric conductor along the side surface of the first ferromagnetic layer, the non-magnetic layer and the second ferromagnetic layer. Therefore, a bias current can flow uniformly from the first electric conductor to the second electric conductor via the first ferromagnetic layer, the non-magnetic layer and the second ferromagnetic layer. As a result, it is possible to restrict variations in magnetoresistance properties such the MR value and the junction resistance value, and the like.

Hereinafter, the embodiments of the present invention will be explained with reference to drawings.

(Embodiment 1)

Figure 1B:
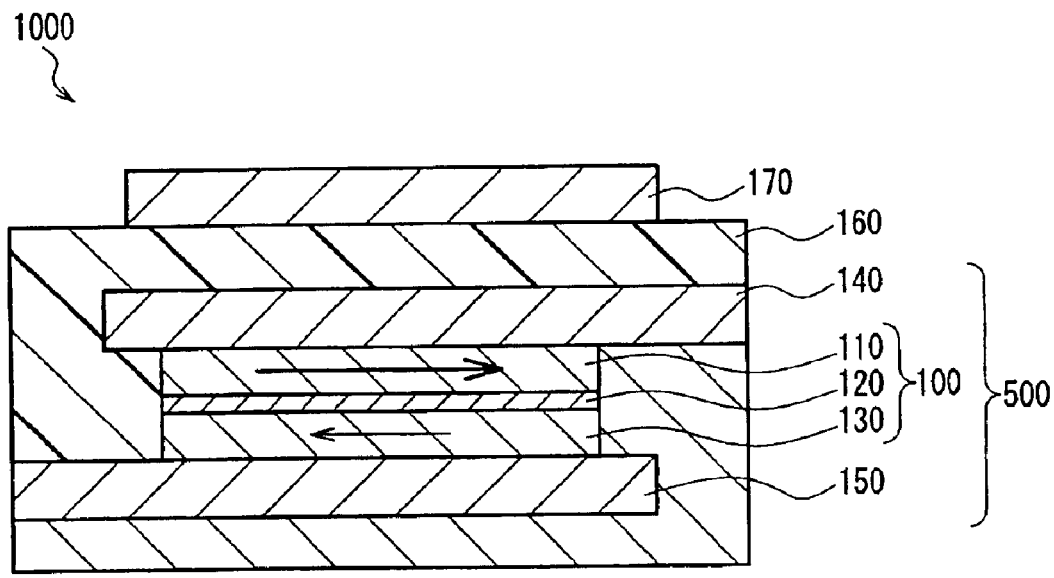

FIGS. 1A and 1B are cross-sectional views showing a magnetoresistance element 500 according to Embodiment 1 of the present invention.

The magnetoresistance element 500 is a spin bulb type magnetoresistance element using a hard magnetic film (referred to as "a HM spin bulb type", hereinafter).

In the HM spin bulb type magnetoresistance element 500, a MR element part 100 is formed of a hard magnetic film 110 (first ferromagnetic layer), a non-magnetic insulating film 120 and a soft magnetic film 130 (second ferromagnetic layer). The magnetization of the soft magnetic film 130 is rotated by an external magnetic field more easily than that of the hard magnetic film 110. The MR element part 100 is connected to the conductive films 140 and 150 constituting a sense line and a bit line, respectively. Furthermore, the conductive film 170 constituting a word line is provided on the upper part of the MR element part 100 via the insulating film 160.

In the explanation of the present invention, an arrow shown in each magnetic film shows one example of the magnetization direction of each magnetic film. However, the magnetization direction of each magnetic film is not necessarily limited to the direction shown in the drawing and may be varied in various Embodiments.

The writing operation and read-out operation with a magnetoresistance element can be varied in various Embodiments.

In the magnetoresistance storage element 1000 using the HM spin bulb type magnetoresistance element 500, information is written by inverting the magnetization of the hard magnetic film 110 by a magnetic field generated due to a current flowing through the conductive film 170 (word line). Information is read out by inverting the magnetization of only the soft magnetic film 130 without inverting the magnetization of the hard magnetic film 110. Furthermore, a magnetic field may be generated by allowing a current to flow not only through the conductive film 170 but also through the conductive film 140 or 150 (sense line). In this case, it is preferable that the respective wirings made of the conductive films 170 and 140 (150) are located perpendicular to each other.

By carrying out such writing and read-out operations, the magnetoresistance storage element 1000 enables a nondestructive read out (NDRO). Furthermore, in this case, as a threshold value of the magnetic field for inverting the magnetization, two threshold values, i.e. a recording threshold value Hh and a read-out threshold value Hs, correspond to the coercive force of the hard magnetic film 110 and the coercive force of the soft magnetic film 130.

Figure 2A:
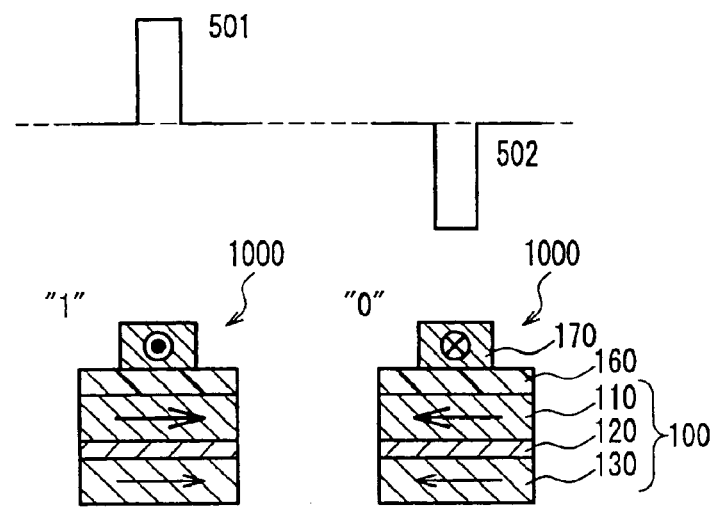
FIGS. 2A and 2B are views showing the principle of operation of the magnetoresistance storage element according to Embodiment 1 of the present invention.
Figure 2B:
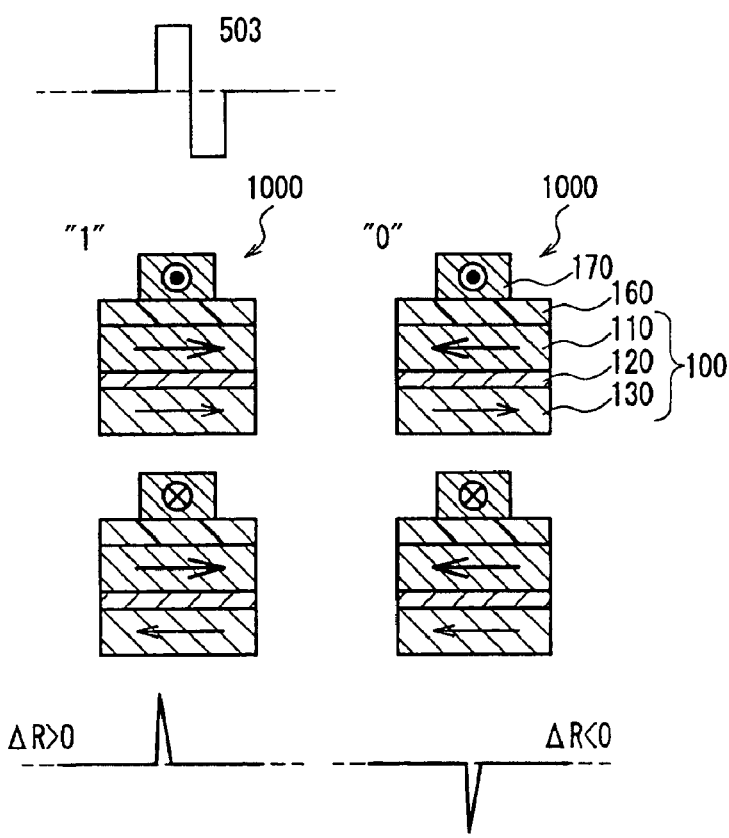

FIGS. 2A and 2B show the principle of operation of the magnetoresistance storage element 1000 using the HM spin bulb type magnetoresistance element 500. Signals are recorded into the magnetoresistance storage element 1000 by allowing a positive pulse current 501 or a negative pulse current 502 to flow through the conductive film 170 as shown in FIG. 2A, applying a magnetic field beyond the recording threshold value Hh of the hard magnetic film 110 to the hard magnetic film 110 so as to invert the magnetization of the hard magnetic film 110, and recording a signal of "1" or "0" in accordance with the magnetization direction of the hard magnetic film 110.

The recorded signals are read out by allowing a weak current pulse to flow through the conductive film 170 in a state in which a constant current is allowed to flow through the conductive films 140 and 150 (FIGS. 1A and 1B) to generate a magnetic field that is not less than the read-out threshold value Hs of the soft magnetic film 130 and not more than the recording threshold value Hh of the hard magnetic film 110, and determining whether or not the magnetization of the soft magnetic film 130 is inverted. In this case, in accordance with the change of the resistance values of the MR electric portion 100 monitored by the conductive films 140 and 150, the storage state "1" or "0" is discriminated.

For example, in the storage states "1" and "0" shown in FIG. 2A, in the case where a pulse current that is the same as the positive pulse current 501 is allowed to flow through the conductive film 170, in the magnetoresistance storage element 1000 in a storage state "1", the resistance value does not change. Furthermore, in the magnetoresistance storage element 1000 in a storage state "0", the resistance value increases. In the case where a pulse current that is the same as the negative pulse current 502 is allowed to flow through the conductive film 170, the resistance value changes in an opposite manner to the above-mentioned change.

Furthermore, as shown in FIG. 2B, when a pulse current 503 combining positive to negative pulses (wherein the pulse current 503 has such a magnitude that inverts the magnetization of only the soft magnetic film 130 without inverting the magnetization of the hard magnetic film 110) is allowed to flow, in the magnetoresistance storage element 1000 whose storage state is "1", the change rate ($\Delta R_1/\Delta t$) becomes positive because the resistance changes from zero to positive value; and on the contrary, in the magnetoresistance storage element 1000 whose storage state is "0", the change rate ($\Delta R_1/\Delta t$) becomes negative.

In the principle of the operation as mentioned above, a signal from the magnetoresistance storage element 1000 can be read out. The features of the HM spin bulb type storage element such as the magnetoresistance storage element 1000 are that the magnetization state of the hard magnetic film 110 does not change during the read out, thus enabling the NDRO.

Note here that a semi-hard magnetic film may be used instead of the hard magnetic film 110.

Furthermore, the hard magnetic film 110 and the soft magnetic film 130 may be placed in an opposite way. In particular, in order to apply a magnetic field by using the conductive film 170 effectively, preferably the soft magnetic film 130 to be used as a free layer is placed closer to the conductive film 170.

Furthermore, this embodiment shows an example of a so-called constant current mode, in which a resistance value change when a constant current is applied is detected as a voltage change. However, the recorded information may be detected by a so-called constant voltage mode in which the resistance change is detected as a current change.

Furthermore, the configuration of the magnetoresistance storage element 1000 may be used as a magnetoresistance effect element. In this case, the magnetoresistance effect element having a configuration of the magnetoresistance storage element 1000 can be used as a magnetic head and a magnetic field applied from a recording medium, etc. is detected by a MR element part 100. Furthermore, if the magnetoresistance effect element is used as a magnetic head, the conductive film 170 need not be provided.

(Embodiment 2)

Figure 3A:
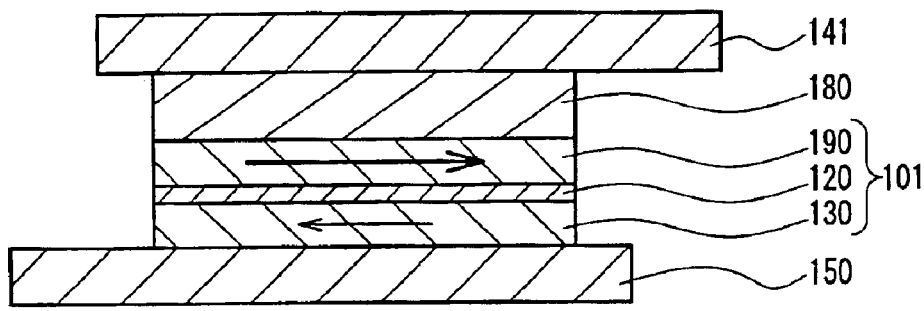
FIGS. 3A and 3B are cross-sectional views showing a magnetoresistance storage element according to Embodiment 2 of the present invention.
Figure 3B:
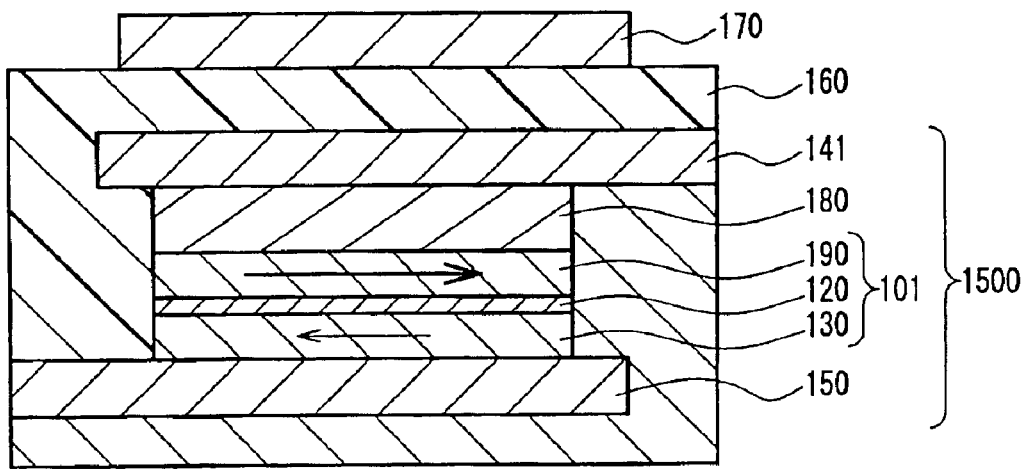

FIGS. 3A and 3B are cross-sectional views showing a magnetoresistance element 1500 and a magnetoresistance storage element 2000 according to Embodiment 2 of the present invention. The same component elements of the magnetoresistance element 500 and the magnetoresistance storage element 1000 explained in Embodiment 1 are given the same numbers and the explanations therefor are omitted herein.

The magnetoresistance element 1500 is a spin bulb type magnetoresistance element using an antiferromagnetic film (referred to as an AF spin bulb type, hereinafter) and the magnetoresistance storage element 2000 using the magnetoresistance element 1500 is an AF spin bulb type magnetoresistance storage element.

In the magnetoresistance storage element 2000, a MR element part 101 is formed of a ferromagnetic film 190 (first ferromagnetic layer) exchange-coupled to an antiferromagnetic film 180, a non-magnetic insulating film 120 and a soft magnetic film 130 (second ferromagnetic layer). To the MR element part 101, the conductive films 141 and 150, constituting a sense line and a bit line respectively, are connected. The magnetization of the soft magnetic film 130 is rotated by an external magnetic field more easily than that of the ferromagnetic film 190.

The magnetization of the ferromagnetic film 190 is not inverted by a magnetic field generated by a current flowing through the conductive film 170 (word line) and only the magnetization of the soft magnetic film 130, which is magnetically separated from the ferromagnetic film 190 via the non-magnetic insulating film 120, is inverted. Therefore, information is written and read out only by the magnetization inversion of the soft magnetic film 130, and thereby NDRO is difficult. However, since there is one threshold value of the magnetic field for inverting the magnetization, the principle of operation is simpler than that of the magnetoresistance storage element 100 mentioned in Embodiment 1.

Figure 4A:
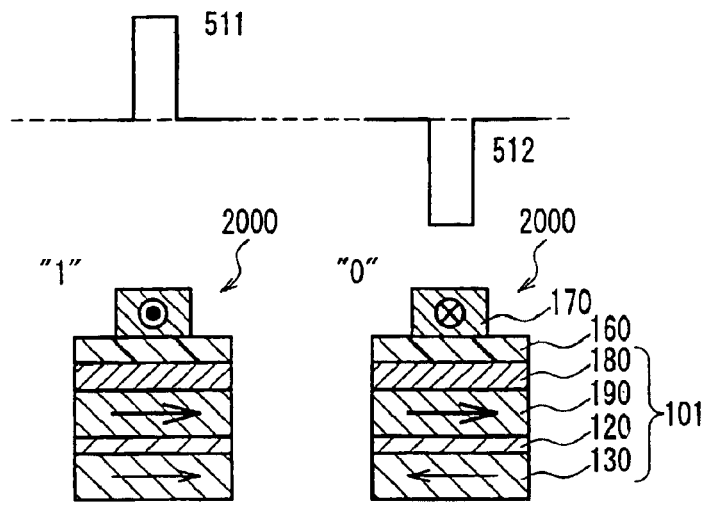
FIGS. 4A to 4C are views showing the principle of operation of the magnetoresistance storage element according to Embodiment 2 of the present invention.
Figure 4B:
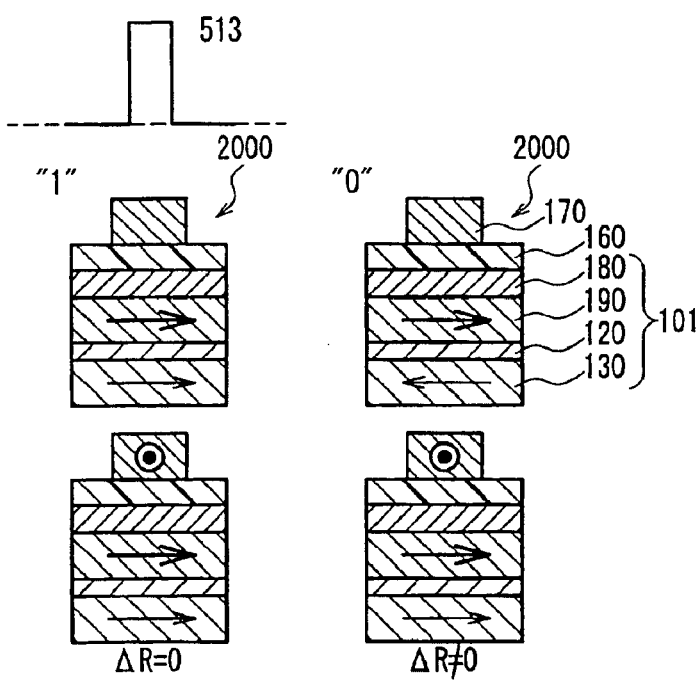

FIGS. 4A and 4B show the principle of operation of the magnetoresistance storage element 2000 that is an AF spin bulb type storage element.

In the magnetoresistance storage element 2000, since the ferromagnetic film 190 is exchange-coupled to the antiferromagnetic film 180, the magnetization of the ferromagnetic film 190 is pinned in one direction.

Signals are recorded into the magnetoresistance storage element 2000 by allowing a positive pulse current 511 or a negative pulse current 512 to flow through the conductive film 170 as shown in FIG. 4A, applying a magnetic field of Hs or more of the soft magnetic film 130 to the soft magnetic film 130 so as to invert the magnetization of the soft magnetic film 130, thereby recording the signal of "1" or "0" in accordance with the magnetization direction of the soft magnetic film 130.

The recorded signals are read out by allowing a positive or negative weak current pulse to flow through the conductive film 170 in a state in which a constant current is allowed to flow through the conductive films 141 and 150 (FIGS. 3A and 3B) to generate a magnetic field that is not less than the read-out threshold value Hs of the soft magnetic film 130, and determining whether or not the magnetization of the soft magnetic film 130 is inverted. In this case, in accordance with the change of the resistance values of the MR element part 101 monitored by the conductive films 141 and 150, the storage state "1" or "0" is discriminated.

For example, in a storage state "1" and "0" shown in FIG. 4B, when a positive pulse current 513 (the pulse current 513 has such a magnitude that can invert the magnetization of only the soft magnetic film 130 without inverting the magnetization of the ferromagnetic film 190) is allowed to flow through the conductive film 170, the resistance value does not change ($\Delta R=0$) with respect to the magnetoresistance storage element 2000 in the storage state "1". Furthermore, when a positive pulse 513 is allowed to flow through the conductive film 170, the resistance value changes ($\Delta R \neq 0$) with respect to the magnetoresistance storage element 2000 in a storage state "0". On the contrary, when a negative pulse current (not shown) is allowed to flow through the conductive film 170, the change of the resistance values occurs in the opposite way.

The above-mentioned principle of operation enables signals to be read out from the magnetoresistance storage element 2000. In the AF spin bulb type storage element such as the magnetoresistance storage element 2000, since the recorded signals are destroyed when reading out signals, the NDRO is difficult.

Figure 4C:
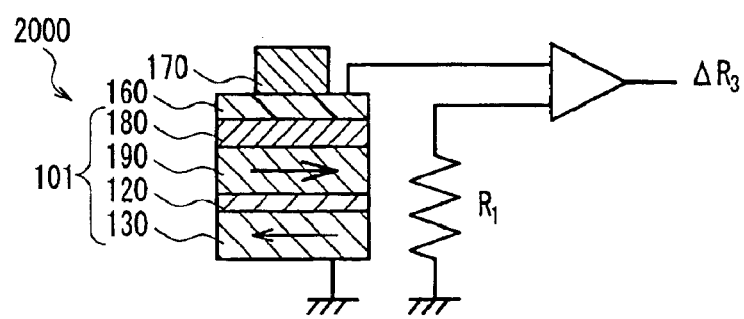

However, also in the AF spin bulb type storage element such as the magnetoresistance storage element 2000, the NDRO is possible. Specifically, as shown in FIG. 4C, by reading out signals by a method for detecting the difference $\Delta R_3$ between the resistance value of the MR element part 101 and the reference resistance $R_1$, it is possible to read out the storage state "1" or "0" without allowing a pulse current to flow through the conductive film 170. In this case, since the recorded signals are not destroyed at the time of reading out signals, the NDRO is possible. It is preferable that the resistance value of the reference resistance $R_1$ used at this time is a value within the changing values of the resistance value of the MR element part 101 to be compared. If the magnetoresistance storage element 2000 is integrated, it is preferable that one of the magnetoresistance storage elements 2000 is used as the reference resistance $R_1$.

Furthermore, the ferromagnetic film 190 and the soft magnetic film 130 may be placed in an opposite manner.

Furthermore, as in Embodiment 1, the configuration of the magnetoresistance storage element 2000 may be used also for the magnetoresistance effect element.

The hard magnetic film 110 and the ferromagnetic film 190, explained respectively in Embodiment 1 and this Embodiment correspond to a fixed layer of the magnetoresistance effect element. As a metal magnetic film used for the hard magnetic film 110 and the ferromagnetic film 190, materials such as Co or Co—Fe, Ni—Fe, Ni—Fe—Co alloys, etc. are excellent. In particular, since Co or Co—Fe alloy is excellent for obtaining a large MR ratio, it is desirable that Co-rich materials are used for an interface facing a non-magnetic film 120.

Furthermore, in addition, since a Mn-based Heusler alloy or a perovskite Mn oxide (including layered perovskite Mn oxide), Sr—Fe—Mo based double perovskite type oxide, and a half metal material such as $CrO_2$, $Fe_3O_4$, etc. have high magnetization polarizability, when they are used to configure a MR element, it is possible to obtain a large MR ratio.

As the oxide magnetic films used for the hard magnetic film 110 and the ferromagnetic film 190, $MFe_2O_4$ (M is one or two kinds or more of elements selected from the group consisting of Fe, Co and Ni) is preferable. These exhibit ferromagnetism also at relatively high temperatures, and as compared with Fe-rich materials, Co, Ni-rich materials have an extremely high resistance value. Furthermore, since the Co-rich material has the property of a magnetic anisotropy being large, by adjusting the composition ratio these materials, it is possible to obtain the hard magnetic film 110 and the ferromagnetic film 190 having desirable properties.

Note here that a total film thickness of the hard magnetic film 110 and the ferromagnetic film 190 preferably ranges from 1 nm or more and 10 nm or less.

Furthermore, an example of the magnetization spinning suppression layer used for the antiferromagnetic film 180 that is in contact with the ferromagnetic film 190 includes a metal layer made of a random alloy, Ir—Mn, Rh—Mn, Ru—Mn, Cr—Pt—Mn, etc. Such a metal layer has advantages that by forming such a film in magnetic field, it can be exchange-coupled with the ferromagnetic film 190, thus making the process simple. On the other hand, an ordered alloy of Ni—Mn, Pt—(Pd)—Mn, etc. needs a thermal treatment so as to have a state of an ordered alloy. However, they are excellent in the thermal stability and Pt—Mn is particularly preferable.

The soft magnetic film 130 explained respectively in Embodiment 1 and this Embodiment corresponds to a free layer of the magnetoresistance effect element. As the soft magnetic film 130, materials such as Co or Co—Fe, Ni—Fe, Ni—Fe—Co alloys, etc. are excellent. Furthermore, in the case where a Ni—Fe—Co film is used for the soft magnetic film 130, a Ni-rich soft magnetic film has the following atomic composition ratio:

$Ni_xFe_yCo_z$ $0.6 \leq x \leq 0.9$ $0 \leq y \leq 0.3$ $0 \leq z \leq 0.4$ or a Co-rich film has the following atom composition ratio:

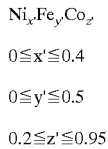

$Ni_{x'}Fe_{y'}Co_{z'}$ $0 \leq x' \leq 0.4$ $0 \leq y' \leq 0.5$ $0.2 \leq z' \leq 0.95$.

These composition films have a low magnetic distortion property ($1 \times 10^{-5}$) required for a sensor or a MR head.
(Embodiment 3)

FIGS. 5A to 5E show the state of arrangement of the ferromagnetic layer 801, an electric conductor 802 used as an electrode and an interlayer insulator 160 in the magnetoresistance element according to Embodiment 3. The following Embodiment 3 shows that a method for an electric contact between the electric conductor 802 used as an electrode and the ferromagnetic layer 801 greatly affects the degree of restricting variations of the MR value, the junction resistance value, or the bias dependency of such values, and that the configuration of the present invention restricts these variations effectively.

Figure 5A:
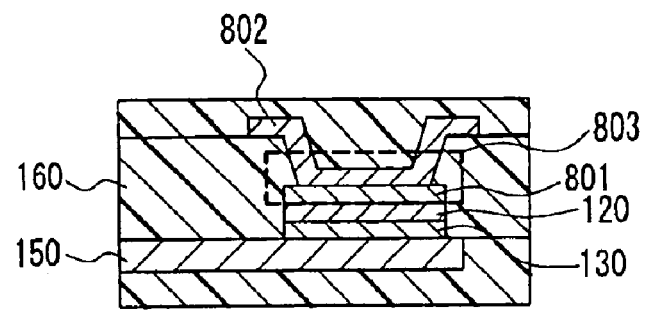
FIGS. 5A to 5E are cross-sectional views showing an element according to Embodiment 3 of the present invention.

FIG. 5A is a cross-sectional view showing a configuration of the magnetoresistance element according to Embodiment 3. The ferromagnetic layer 801 herein corresponds to the hard ferromagnetic film 110 mentioned in Embodiment 1 or corresponds to a layer combining the antiferromagnetic film 180 and the ferromagnetic film 190 mentioned in Embodiment 2. When oxide is selected as the antiferromagnetic film 180, the electric conductor 802 is disposed so that it is brought into electric contact with the ferromagnetic layer 190. Herein, the electric conductor 802 corresponds to the electrodes 140 and 141 mentioned in Embodiment 1 and Embodiment 2.

Note here that the ferromagnetic layer 801 herein also includes a protecting film provided on the ferromagnetic layer.

For example, when the element part is formed of Si/SiO$_2$/Ta(5)/Cu(50)/Ta(5)/PtMn(20)/CoFe(3)/Ru(0.9)/CoFe(1)/FePt(2)/Al—O(1.0)/FePt(2)/NiFe(1)/Ru(0.7)/NiFe(2)/Pt(10), a portion of Ta(5)/Cu(50)/Ta(5) represents the conductive film 150 in FIG. 5A; PtMn(20)/CoFe(3)/Ru(0.9)/CoFe(1)/FePt(2) represents the ferromagnetic layer 130; Al—O(1.0) represents the non-magnetic layer 120; and FePt(2)/NiFe(1)/Ru(0.7)/NiFe(2)/Pt(10) represents the ferromagnetic layer 801.

Figure 5B:
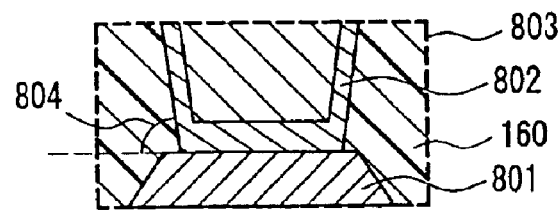
Figure 5C:
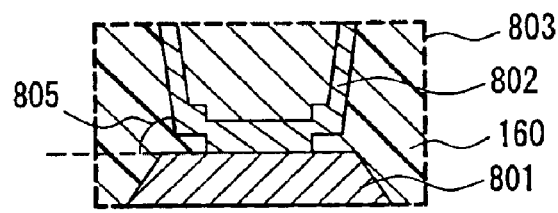
Figure 5D:
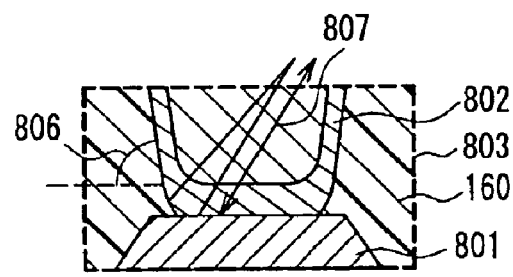

FIGS. 5B to 5D show in detail the state of the arrangement of the ferromagnetic layer 801, the electric conductor 802 used as the electrode and the interlayer insulator 160 shown in FIG. 5A as a region 803 surrounded by a broken line. In FIG. 5B, an element part is processed so as to have a slope having an angle 804 made by the top surface of the ferromagnetic layer 801 and the end of the interlayer insulator 160 of 5° or more and less than 90° and the effect on the element properties was examined. Furthermore, at this time, the effect on the element properties was examined by varying the covering rates of the interlayer insulating layer 160 with respect to the top surface of the fine-processed ferromagnetic layer 801.

Figure 6:
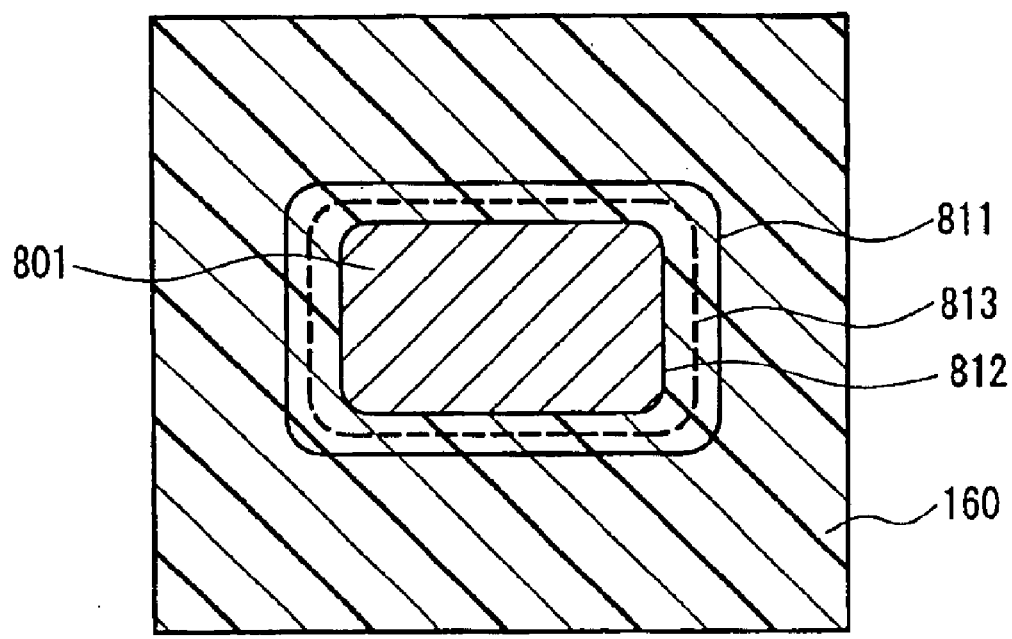
FIG. 6 is a top view showing the element according to Embodiment 3 of the present invention.
Figure 7:
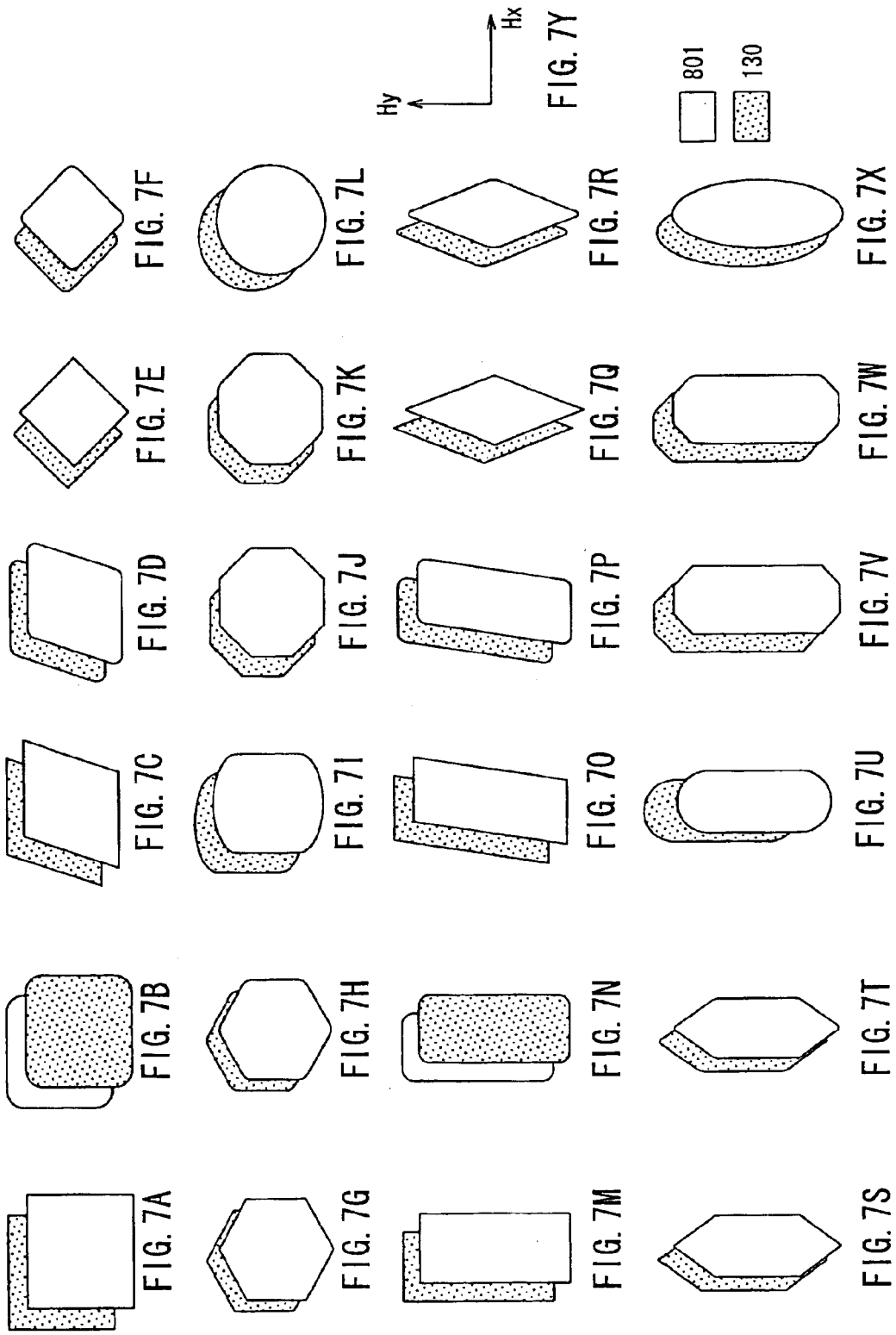
FIGS. 7A to 7X are top views showing the shapes of the element according to Embodiment 3 of the present invention.
FIG. 7Y is a top view showing a coordinate of the shape of the element according to Embodiment 3 of the present invention.
Figure 8:
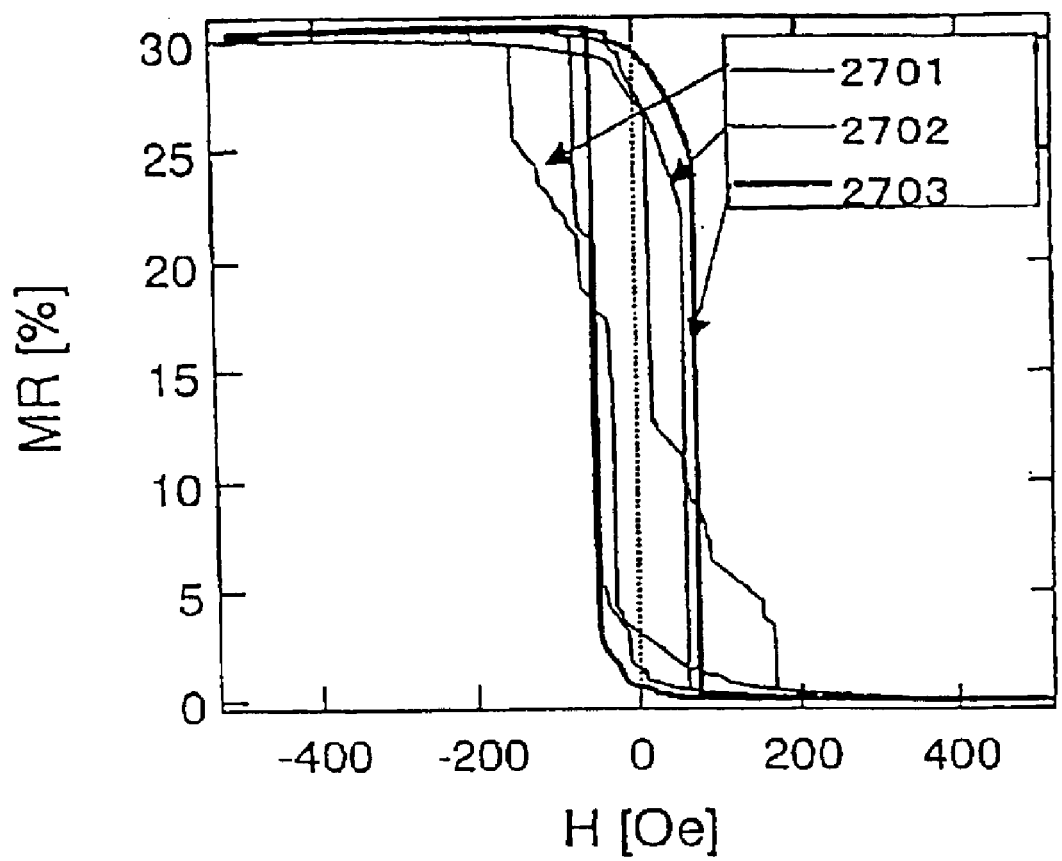
FIG. 8 is a graph showing the relationship between the change of a magnetic field and the properties of the change rate of the magnetic resistance according to Embodiment 3 of the present invention.
Figure 9A:
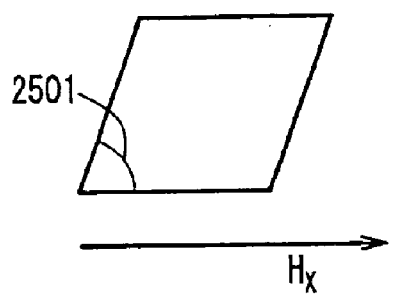
FIGS. 9A to 9D are top views showing the shapes of the element according to Embodiment 3 of the present invention.
Figure 9B:
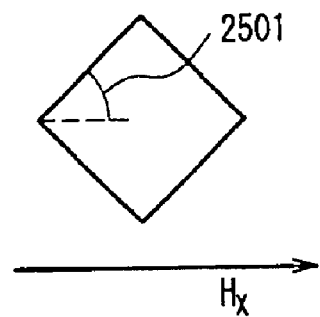
Figure 9C:
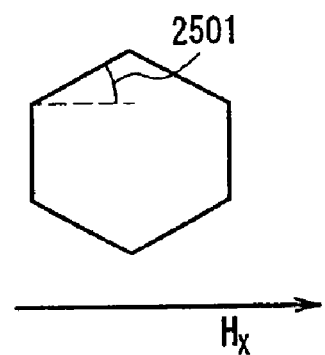
Figure 9D:
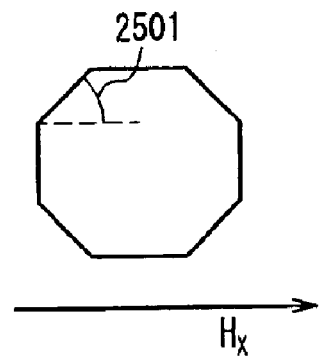

FIG. 6 is a top view showing in detail the state of the arrangement of the ferromagnetic layer 801 and the interlayer insulator 160 shown in FIG. 5B. This Figure shows the state right after a window for electric contact is formed as an interlayer insulator 160 on the ferromagnetic layer 801. Herein, 811 is located at an outer side with respect to 813, however, depending on the changes of the covering rate or the angle of the end of the interlayer insulator 160, 811 may be located at an inner side of 813. The element part is formed on a 6-inch wafer substrate that is a typical size while varying the size of the element part to be fine-processed from 0.06 microns to 10 microns. The shapes of the formed element are shown in FIGS. 7A to 7X. In FIGS. 7A to 7X, the first ferromagnetic layer 801 and the second ferromagnetic layer 130 are shown as displaced for convenience. The shapes of the element having a shape anisotropy as shown in FIGS. 7M to 7X are more preferable than the shapes of the element shown in FIGS. 7A to 7L because the former shapes are suitable to the magnetoresistance storage element and the magnetic memory and because the magnetoresistance changes occur more rapidly in the former shapes, and storing stability is more excellent in the former shapes than in the latter shapes. Furthermore, the evaluation results shows that the aspect ratio of the element shape is preferably 1.5 or more. FIG. 8 shows a state of the MR change in the case where the element is formed by the shape shown in FIG. 7B and the shape shown in FIG. 7N. The aspect ratio of the element shape is 1 (curve 2701), 1.5 (curve 2702) and 5 (curve 2703), respectively.

Furthermore, in FIGS. 7B, 7D, 7F, 7H, 7I, 7K, 7L, 7N, 7P, 7R, 7T, 7U, 7W and 7X, since the circumferential part is formed in a round shape, respectively, it is advantageous and preferable in magnetization rotation. As shown in FIG. 7Y, when the magnetization is rotated by applying two-axis magnetic fields Hx and Hy, as shown in FIGS. 7C, 7D, 7E, 7F, 7G, 7H, 7I, 7J, 7K, 7L, 7O, 7P, 7Q, 7R, 7S, 7T, 7U, 7V, 7W and 7X, it is preferable that on the circumferential part, the element is formed in a shape having sides that are not parallel to the direction of the magnetic field Hx and the magnetic field Hy, because it is more excellent in the rapidness of the magnetization rotation. In the case where the magnetic field Hx and the magnetic field Hy are perpendicular to each other, as shown in FIGS. 9A to 9D, it is preferable that the angle 2501 made by the above-mentioned side and magnetic field Hx satisfies: 20°≦|angle 2501|≦70°.

Furthermore, it is preferable that the angle 2601 made by the magnetization direction operating the element having various shapes as shown in FIGS. 10A to 10C and the magnetic field Hx satisfies: 50°≦|angle 2601| or (90°−|angle 2601|)≦85°. In the case where the aspect ratio (L/W) of the element shape was 1.5 or more and 3 or less, the preferable angle 2601 in the element shape shown in FIG. 10A was 50° or more and 75° or less (wherein the angle 2602 was 50° or more 85° or less); the preferable angle 2601 in the element shape shown in FIG. 10B was 55° or more and 80° or less (wherein the angle 2602 was 25° or more 80° or less); and the preferable angle 2601 in the element shape shown in FIG. 10C is 60° or more and 85° or less (wherein the angle 2602 and 2603 were 25° or more 80° or less).

Note here that in Embodiment 2, the element was formed by carrying out an exposure to a light source such as electron or excimer laser or UV, etc. by the use of a resist mask and/or a metal mask, and the like, and processing by a reactive ion etching (RIE) or ion milling or laser patterning, etc. For processing fine patterns on the element part, a mushroom shaped resist for lift off was used in some cases.

FIGS. 11A to 11E are cross-sectional views showing a configuration of a typical element when the covering rates are changed.

Figure 11A:
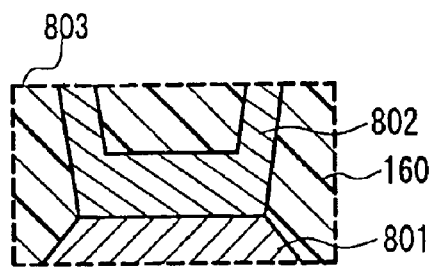
FIGS. 11A to 11D are cross-sectional views showing the element according to Embodiment 3 of the present invention.
Figure 11B:
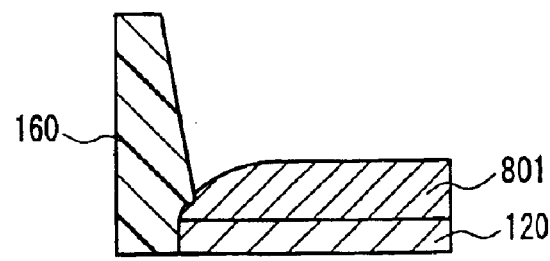
Figure 11C:
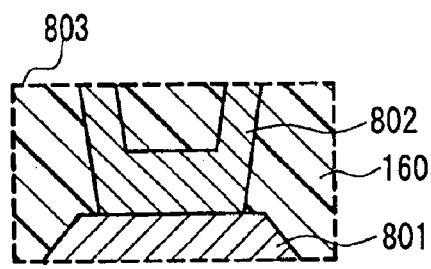

FIG. 11A shows the case where the covering rate is 0% and this state is the most ideal in principle. However, depending upon the shape of the end of the ferromagnetic layer 801, the shape of the end of the interlayer insulator 160 may not be smooth as shown in FIG. 11B. It was found that, in such a case, a bias current flowing to the element became uniform, resulting in the occurrence of variations in properties between the elements. Or, as shown in FIG. 11E, it was found that also in the case where the shape of the end of the interlayer insulator 160 was not smooth, the leakage or uniformity of a bias current occurred, resulting in the occurrence of the variations in properties between the elements. FIG. 11C shows the case where the covering rate is 5% or more and 60% or less. In this case, it was confirmed that variations in both the MR value and the junction resistance RA value inside the 6-inch wafer were restricted as compared with the case where the covering rate was less than 5%. This is thought to occur because the uniformity of the bias current flowing through the junction part of the element was improved. Furthermore, the effect of restricting variations was confirmed when a slope has an angle with respect to the end of the interlayer insulator 160 of about 5° or more and about less than 90°. In particular, when the angle was in the range of 30° or more and less than 80°, the effect of restricting was furthermore improved. The degree of variations in the best state that was confirmed in the 6-inch wafer was, for example, σ value when the MR value is 35% or less, RA value is 1.6 k$\Omega\cdot\mu m^2$ or less, and the calculated σ value was compared with that of the case where the covering rate is less than 5%, that is, σ (covering rate of 5% or more and 60% or less)/σ (covering rate of less than 5%)~0.1 (MR value), 0.12 (junction resistance RA value). Consequently, it was found that at least about an 8 fold effect of restricting variations was obtained. Herein, σ denotes the standard deviation.

Figure 11D:
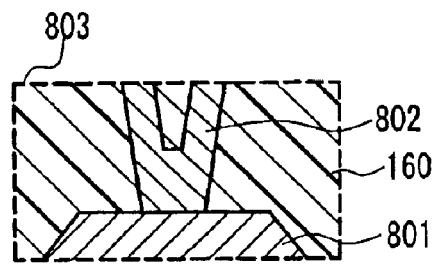
Figure 11E:
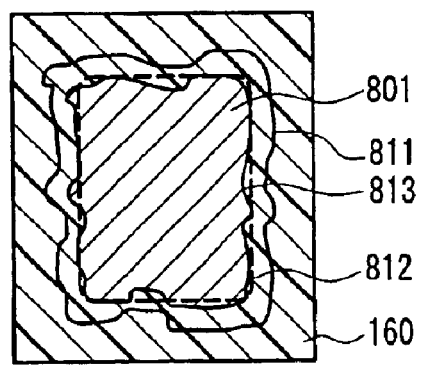
FIG. 11E is a top view showing the element according to Embodiment 3 of the present invention.

FIG. 11D shows the case where the covering rate is more than 60%. In this case, it was found that variations in the MR value and the junction resistance RA value inside the 6-inch wafer were restricted as compared with the case where the covering rate is less than 5%, but a significant effect of restricting variations could not be obtained as compared with the case where the covering rate is 5% or more and the 60% or less.

Furthermore, as to the MR value and the junction resistance value RA value, when the bias dependency of the element was evaluated from 0 to 2V, it was found that variations of the bias dependency in the range from 0V to 1V were most restricted when the covering rate is 5% or more and 60% or less. Also, as to the voltage resistance property, it was found that the resistance against voltage of the element was exhibited to about 5V.

That is, it was found that when the covering rate is 5% or more and 60% or less, the degree of variations of the magnetoresistance properties including the MR value, junction resistance RA value and the bias dependency of both values were improved, and the present invention was effective.

As mentioned above, according to Embodiment 2, an electric conductor 802 (first electric conductor) is formed so as to be brought into contact with substantially the center of the surface opposite to a non-magnetic insulating film 120 of a ferromagnetic layer 801 (first ferromagnetic layer) so formed as to sandwich, along with a soft magnetic film 130 (second ferromagnetic layer), the non-magnetic insulating layer 120 (non-magnetic layer), and an interlayer insulator 160 so formed as to cover at least the side surfaces of the ferromagnetic layer 801 and the non-magnetic layer 120 is formed so as to cover the peripheral edge of the surface of the ferromagnetic layer 801. Therefore, since it is possible to prevent a leakage current from flowing from the electric conductor 802 to the conductive film 150 along the side surface of the ferromagnetic layer 801, the non-magnetic insulating film 120 and the soft magnetic film 130, a bias current flows uniformly from the electric conductor 802 to the electric conductor 150 through the ferromagnetic layer 801, the non-magnetic insulating layer 120 and the soft magnetic film 130. As a result, it is possible to restrict variations in the magnetoresistance properties such as the MR value, the junction resistance value, etc. in the magnetoresistance element.

It is preferable that the ratio of the area of the surface of the ferromagnetic layer 801 covered with the interlayer insulator 160 is 5% or more and 60% or less relative to the area of the entire surface of the ferromagnetic layer 801. It is advantageous because it is possible to restrict variations in the MR value and the junction resistance value in the magnetoresistance element more significantly.

Furthermore, the effect of restricting variations was confirmed when a slope has an angle with respect to the end of the interlayer insulator 160 of about 5° or more and about less than 90°. In particular, when the angle was in the range of 30° or more and less than 80°, the effect of restricting was further improved.

FIG. 5C is a cross-sectional view showing a state in which an element part is processed so as to cover a part of the top surface of the ferromagnetic layer 801 with an insulating layer having a thickness of 1 nm or more and furthermore so as to have a slope having an angle 805 made by the top surface of the ferromagnetic layer 801 and the end of the interlayer insulator 160 of 5° or more and less than 90°. Such an element can be formed by firstly covering a part of the top surface of the ferromagnetic layer 801 with an insulating layer having a thickness of 1 nm or more, and then placing the interlayer insulator 160 so as to have a slope having an angle 805 made by the top surface of the ferromagnetic layer 801 and the end of the interlayer insulator 160 of 5° or more and less than 90°. Alternatively, the shape shown in FIG. 5C can be obtained with a single etching treatment by using materials whose rate of etching is different between the upper part and the lower part of the resist used as an etching mask when forming a window for electric contact on the interlayer insulator 160 to the top surface of the ferromagnetic layer 801. According to the configuration of FIG. 5C, it was found to be particularly preferable that when the element part is processed so as to have a slope having an angle 805 made by the top surface of the ferromagnetic layer 801 and the end of the interlayer insulator 160 of 40° or more and less than 90°, variations of the properties of the formed element are more restricted as compared with the condition in which the angle is less than 40°.

Figure 5E:
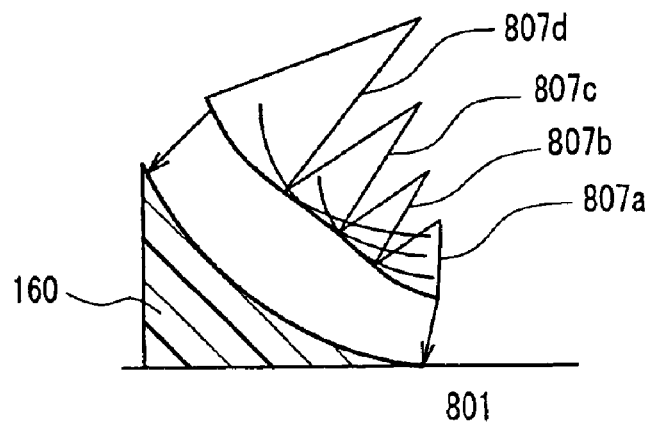

FIG. 5D is a cross-sectional view showing a state in which an element part is processed so that when covering a part of the top surface of the ferromagnetic layer 801, the end of the interlayer insulator 160 forms a skirt with a radius of curvature 807 of 5 nm or more. Such an element can have the shape shown in FIG. 5D by once etching treatment by using materials whose rate to be etched is different between the upper part and the lower part of the resist used as an etching mask when forming a window for electric contact on the interlayer insulator 160 with respect to the top surface of the ferromagnetic layer 801. It is important that the shape of the end of the interlayer insulator 160 has a radius of curvature 807 of 5 nm or more and this configuration is not necessary to be realized with a single radius of curvature. That is, a shape shown in FIG. 5E may be realized by combining some shapes each having a radius of curvature 807 of 5 nm or more. FIG. 5E is a cross-sectional view showing a case where the end of the interlayer insulator 160 has a curve that combines arc shapes having the radius of curvature 807a to 807d. Processing of such a shape can be realized easily by carrying out a deposition so that a deposition angle of the interlayer insulating film 160 becomes in the range from 0° to 45° when the angle of the magnetic layer 801 in the direction perpendicular to the top surface is defined as 0° by the use of a mushroom-shaped lift-off resist. According to the configuration of FIG. 5D, the element can be formed most easily when the covering rate with respect to the ferromagnetic layer 801 is 5% or more and 60% or less. That is, it was found that in order to improve the degree of variations between elements in magnetoresistance properties including the MR value, the junction resistance RA value and the bias dependency of both values, this configuration is most suitable.

It was found that this case also had a particularly preferable arrangement because when the element part is processed so as to have a slope having an angle 806 made by the top surface of the ferromagnetic layer 801 and the end of the interlayer insulator 160 of 5° or more and less than 90°, variations in the magnetoresistance properties of the formed element were further restricted as compared with the case where the angle is less than 40°.

In the case where the end of the interlayer insulator 160 was formed with the radius of curvature 807 of less than 5 nm, the shape of the interlayer insulator 160 itself varied, thus causing variations in properties of the element. In this case, the effect of restricting variations could not be confirmed.

As to the magnetoresistance element having the cross-sectional shapes of the element as shown in FIGS. 5A and 5D and being formed as shown in FIGS. 7A to 7X, the magnetoresistance change rate (MR), the junction resistance (RA) value, the bias dependency of both values and further the critical current capacitance were evaluated so as to evaluate the degree of variations inside the wafer. The evaluation results are shown in FIG. 12.

Figure 13A:
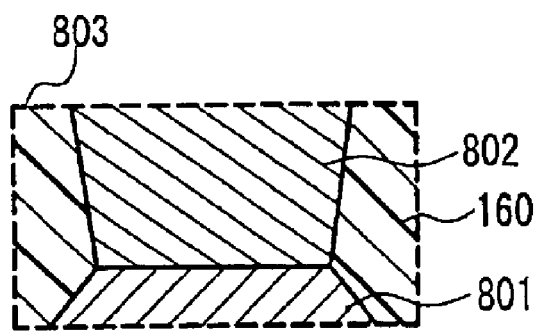
FIGS. 13A to 13C are cross-sectional views showing the element according to Embodiment 3 of the present invention.
Figure 13B:
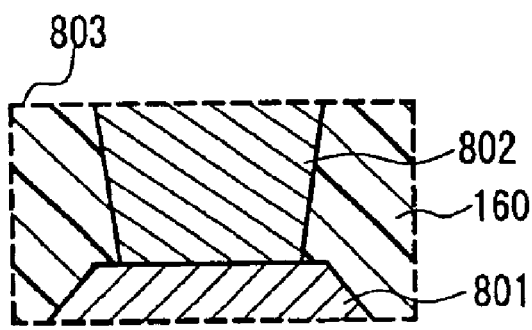
Figure 13C:
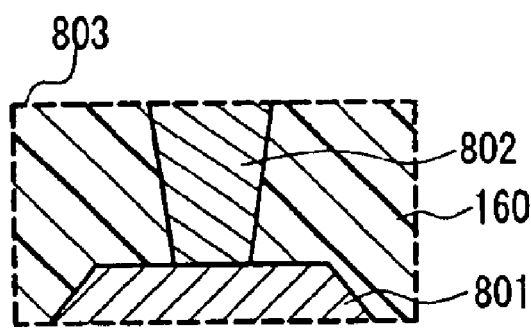

The number of populations of samples represented by each sample number is about 1500 to 2500 per wafer. A, B and C shown in the column of the shape correspond to the cross-sectional shapes of the elements shown in FIGS. 13A, 13B and 13C, respectively. From the evaluation results shown in FIG. 12, it is read that there is a correlation between the degree of variations of the magnetoresistance property inside wafer and the critical current capacitance value (current density). That is, in the case where the element having a large critical current capacitance value (current density) is formed inside the wafer, it can be said that the degree of variations is restricted in general. Furthermore, if attention was paid to the samples whose critical current capacitance value (current density) is $1 \times 10^5$ A/cm$^2$ or more, it was found that it is more effective to realize the element so that it has the cross-sectional shape as shown in FIG. 13B for restricting variations of the magnetoresistance property.

Furthermore, with respect to the MR value and the junction resistance RA value, when the bias dependency of a bias current flowing through the element was evaluated in the range from 0 to 2V, in the range from 0V to 1V, it was found that as to the bias dependency, the degree of restricting variations was high in the case where the critical current capacitance value was high, that is, $1 \times 10^5$ A/cm$^2$ or more. It was found that such an element exhibited a high resistance property to about 5V even in the direct resistance property.

Figure 14A:
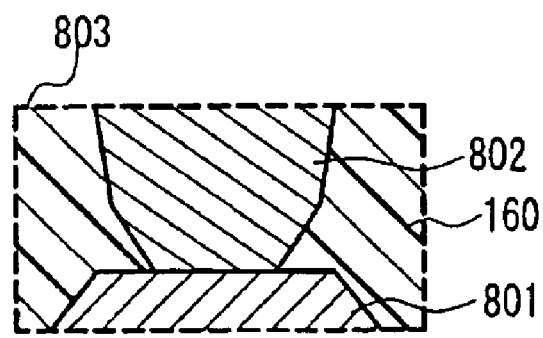
FIG. 14A is a cross-sectional view showing the element according to Embodiment 3 of the present invention.
Figure 14B:
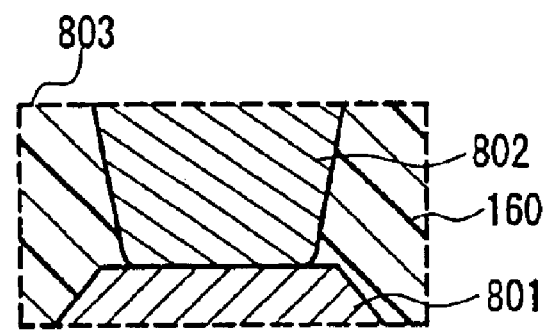
FIGS. 14B and 14C are cross-sectional views showing the element according to Embodiment 4 of the present invention.
Figure 14C:
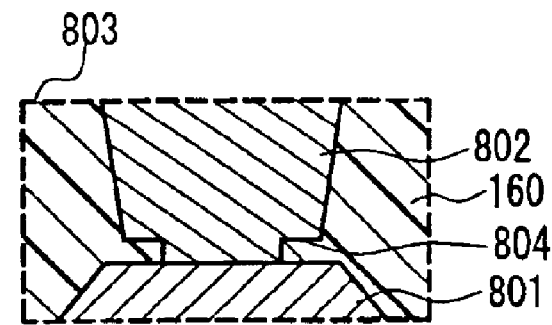

Then, the cross-sectional views of the element are shown in FIGS. 14A to 14C, in which the critical current capacitance value is high, that is, $1 \times 10^5$ A/cm$^2$ or more. By realizing the cross-sectional structure shown in FIGS. 14A or 14B, the element having an almost constantly high critical current capacitance value can be realized. Furthermore, as shown in the end 804 of FIG. 14C, in the end 804 of the interlayer insulator 160, firstly, by widely covering the peripheral edge of the top surface of the ferromagnetic layer 801 with the interlayer insulator 160 having a film thickness of 1 nm or more, and then forming the interlayer insulator 160 thereon, the same effect also can be obtained.

(Embodiment 4)

FIGS. 15A to 15D respectively show the state of the arrangement of the ferromagnetic layer 801, an electric conductor 902 used as an electrode and an interlayer insulator 160 in the magnetoresistance element according to Embodiment 4. The following Embodiment 4 shows that a method for electric contact between the electric conductor 902 used as an electrode and the ferromagnetic layer 801 greatly affects the degree of restricting variations of the MR value, the junction resistance value, or the bias dependency of such values, and that the configuration of the present invention restricts these variations effectively.

Figure 15A:
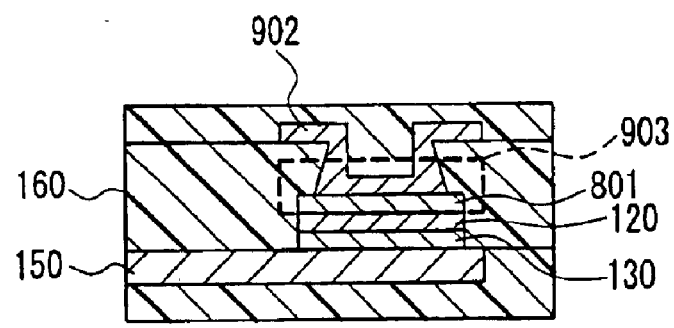
FIGS. 15A to 15D are cross-sectional views showing the element according to Embodiment 4 of the present invention.

FIG. 15A is a cross-sectional view showing a configuration of the magnetoresistance element according to Embodiment 4. The ferromagnetic layer 801 herein corresponds to the hard ferromagnetic film 110 mentioned in Embodiment 1 or corresponds to a layer combining the antiferromagnetic film 180 and the ferromagnetic film 190 mentioned in Embodiment 2. When oxide is selected as the antiferromagnetic film 180, the electric conductor 902 is disposed so that it is brought into electric contact with the ferromagnetic layer 190. Herein, the electric conductor 902 corresponds to the electrodes 140 and 141 mentioned in Embodiment 1 and Embodiment 2.

Figure 15B:
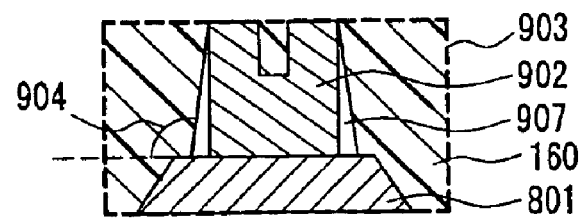
Figure 15C:
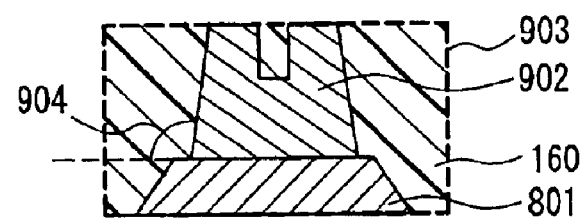
Figure 15D:
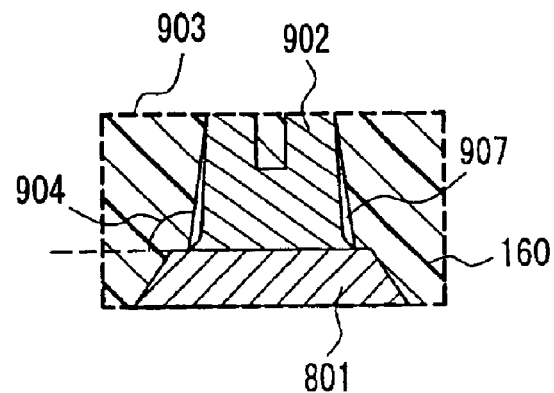

FIGS. 15B to 15D show in detail the state of the arrangement of the ferromagnetic layer 801, the electric conductor 902 used as an electrode and the interlayer insulator 160 shown in FIG. 15A as a region 803 surrounded by a broken line. In FIG. 15B, an element part is processed so as to have a slope having an angle 904 made by the top surface of the ferromagnetic layer 801 and the end of the interlayer insulator 160 of 90° or more and less than 180° and then the effect on the element properties was examined. Furthermore, at this time, the effect on the element properties was examined by varying the covering rates of the interlayer insulating layer 160 with respect to the top surface of the fine-processed ferromagnetic layer 801, or the rate of contact area between the top surface of the ferromagnetic layer and the electric conductor 902. In the examples shown in FIGS. 15B and 15D, a gap 907 is formed between the electric conductor and the interlayer insulator 160.

The element part was formed on a 6-inch wafer substrate that is a typical size while varying the size of the element part to be subjected to fine processing from 0.06 microns to 10 microns.

Note here that the element in this Embodiment is formed by exposure to a light source such as electron or excimer laser or UV by the use of a resist mask and/or a metal mask and processing was carried out by a reactive ion etching (RIE) or ion milling, laser patterning, chemical wet etching methods, etc. For processing a fine pattern on, for example, the element part, a mushroom shaped resist for lift off was used in some cases.

In the configuration of FIG. 15B, the effect on the element properties was examined when the rate of contact area between the top surface of the ferromagnetic layer 801 and the electric conductor 902 is more than 40% and less than 95%. Herein, the rate of contact area corresponds to the case where the covering rate is 5% or more and 60% or less.

Furthermore, the electric conductor 902 may have some configurations as shown in FIGS. 15B to 15D depending on the depositing methods, and preferably the configurations are used appropriately in order to realize the desired rate of contact area. When variations in the MR value and the junction resistance RA value inside the 6-inch wafer were examined, it was confirmed that variations could be more restricted as compared with the case where the rate of contact area was 95% or more and 40% or less. This is thought to occur because the uniformity of the bias current flowing through the junction part of the element was improved. Furthermore, as to an angle 904 of the end of the interlayer insulator 160 at this time, according to this Embodiment, the effect of restricting variations was confirmed when a slope has an angle with respect to the end of the interlayer insulator 160 of about 90° or more and less than 150°. In particular, when the angle was in the range of 90° or more and less than 140°, the effect of restricting was further improved.

Furthermore, as to the MR value and the junction resistance value RA value, when the bias dependency on the element was evaluated from 0 to 2V, it were found that variations of the bias dependency in the range from 0V to 1V were most restricted when the rage of contact area was 40% or more and 95% or less. Also as to the voltage resistance property, it was found that the resistance of the element against voltage to about 5V was exhibited. Furthermore, it was confirmed that in the configuration shown in FIGS. 15A to 15D of the present invention the size of the element part to be fine-processed is in the range from 0.06 to 10 microns. As to the element having the size of about 1 micron or less, it was found that the effect of restricting variations is greater as compared with the configurations shown in FIGS. 11A to 11E.

That is, it was found that when the rate of contact area is more than 40% and less than 95%, the degree of variations in the magnetoresistance properties including the MR value, the junction resistance RA value and the bias dependency of both values is improved, showing that the present invention was effective. Furthermore, as to an angle 904 of the end of the interlayer insulator 160 at this time, according to this Embodiment, the effect of restricting variations was confirmed when a slope has an angle with respect to the end of the interlayer insulator 160 of about 90° or more and less than 150°. In particular, when the angle was in the range of 90° or more and less than 140°, the effect of restricting was further improved.

Figure 16A:
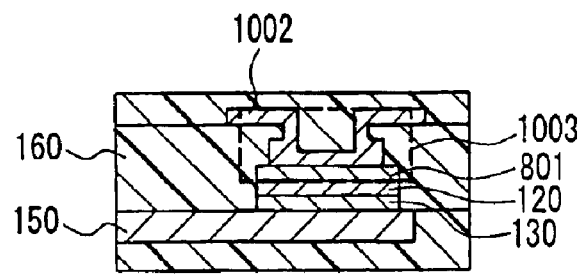
FIGS. 16A to 16G are cross-sectional views showing the element according to Embodiment 4 of the present invention.
Figure 16B:
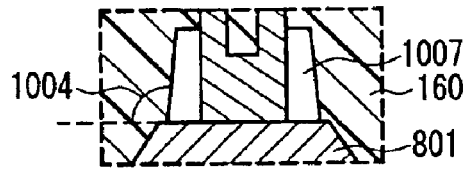
Figure 16C:
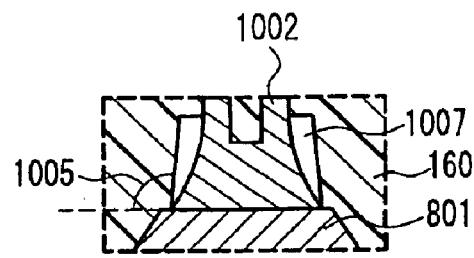
Figure 16D:
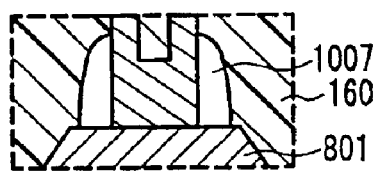
Figure 16E:
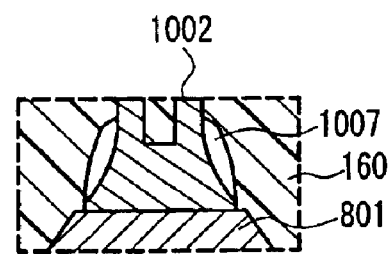
Figure 16F:
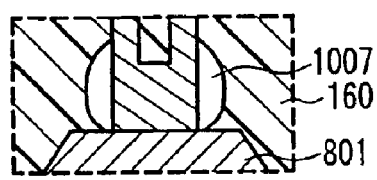

FIGS. 16A to 16G are cross-sectional views showing the state in which an element is formed so as to have a slope having an angle 1004 made by the top surface of the ferromagnetic layer 801 and the end of the interlayer insulator 160 of 90° or more and less than 180° or to have the end of the interlayer insulator 160 having a curved line as shown in FIG. 16D or 16F. In the examples shown in FIGS. 16B to 16G, a gap 1007 is formed between the electric conductor 1002 and the interlayer insulator 160. Furthermore, the electric conductor 1002 may be any types as shown in, for example, FIGS. 16D, 16E, 16F, 16G, etc. depending upon the deposition methods, and preferably these types are respectively used in realizing the desired rate of the contact area. Such an element as shown in FIGS. 16B and 16C can be formed by firstly forming a slope having an angle 1005 made by the top surface of the ferromagnetic layer 801 and the end of the interlayer insulator 160 of 90° or more and less than 150°; then placing additional interlayer insulator 160 thereon. Alternatively, such an element can be formed by previously depositing a resist mask on the top surface of the ferromagnetic layer 801; and depositing the interlayer insulator 160 thereon, followed by carrying out the lift-off process. When forming the window for electric contact by the chemical wet etching, it is possible to obtain various shapes as shown in FIGS. 16B to 16G by a single etching process.

Figure 16G:
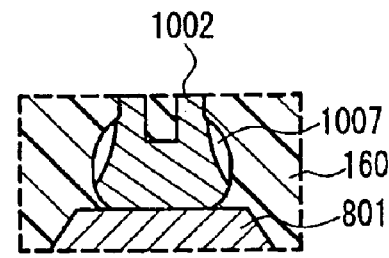

As shown in FIG. 5D explained in Embodiment 3, FIGS. 16F and 16G are cross-sectional views showing the state in which the element part is processed/placed so that when covering a part of the top surface of the ferromagnetic layer 801, the end of the interlayer insulator 160 forms a skirt. Such an element can have the shape shown in FIGS. 16F and 16G by a single etching treatment by using materials whose rate of etching is different between the upper part and the lower part of the resist used as an etching mask when forming a window for electric contact on the interlayer insulator 160 to the top surface of the ferromagnetic layer 801. It is important that the shape of the end of the interlayer insulator 160 has a radius of curvature 807 of 5 nm or more and this configuration is not necessary to be realized with a single radius of curvature. That is, a shape shown in FIG. 5E may be realized by combining several shapes, each having a radius of curvature of 5 nm or more. According to the configuration of FIG. 16D, the element can be formed most easily when the ferromagnetic layer 801 is covered with the covering rate of 5% or more and 60% or less. That is, it is found that in order to improve the degree of variations between elements in magnetoresistance properties including the MR value, the junction resistance RA value and the bias dependency of both values, this configuration was most suitable.

FIGS. 17A to 17F are cross-sectional views showing the state in which the ferromagnetic layer 801, and the electrode and interlayer insulator 160 are arranged when processing the end thereof.

Also in the cross-sectional shapes of the junction parts as shown in FIGS. 17A, 17B, 17C, 17D, 17E and 17F, if the end of the interlayer insulator 160 on the top surface of the ferromagnetic layer 801 has an end structure shown in FIGS. 13A to 13C and 14A to 14c, the element having the almost constant high critical current capacitance value can be achieved.

Figure 17A:
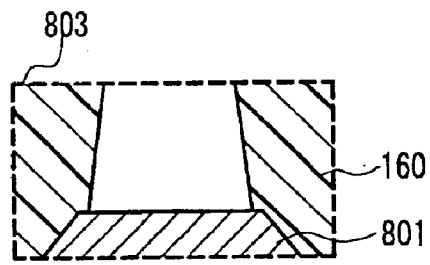
FIGS. 17A to 17F are cross-sectional views showing the element according to Embodiment 4 of the present invention.
Figure 17B:
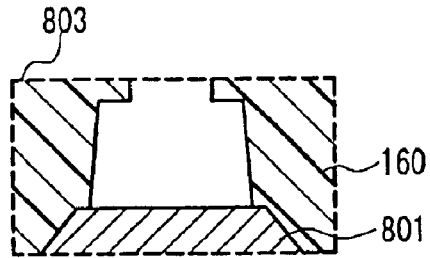
Figure 17C:
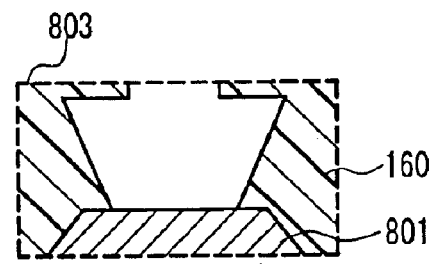
Figure 17D:
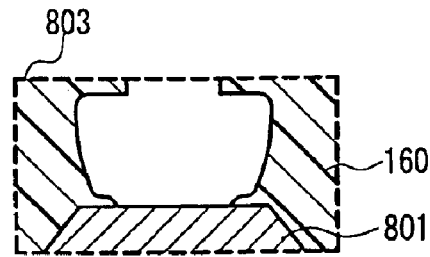
Figure 17E:
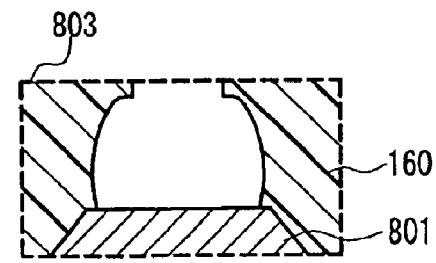
Figure 17F:
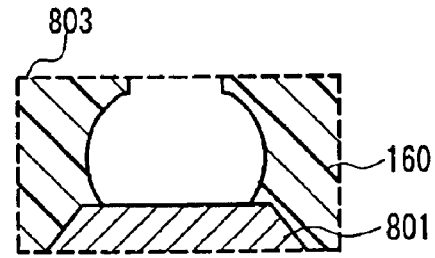
Figure 18A:
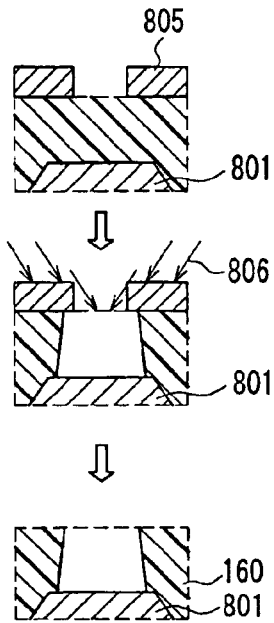
FIGS. 18A to 18C are process views showing a method for forming the shape of the element according to Embodiment 4 of the present invention.
Figure 18B:
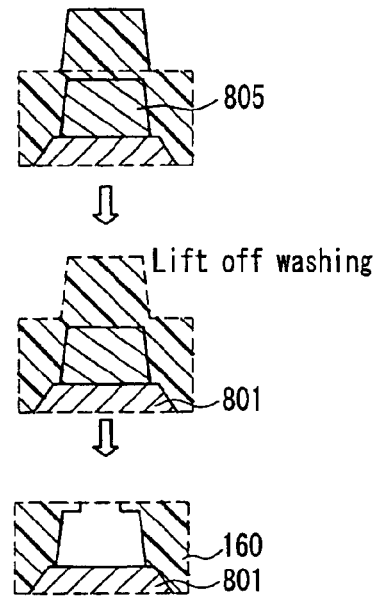
Figure 18C:
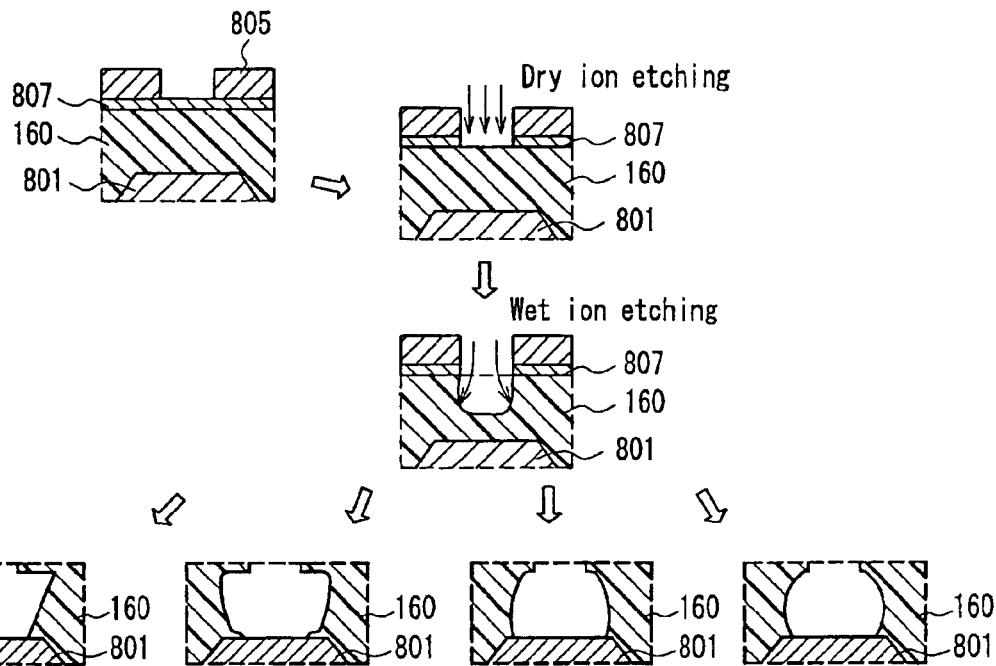

The shapes of elements shown in FIGS. 17A to 17F can be realized by the methods shown in FIGS. 18A to 18C. In FIG. 18A, the structure that is the same as the shape shown in FIG. 17A can be realized by designating the shape by the photoresist 805 and allowing it to enter the pattern obliquely by highly straight physical etching such as an argon ion milling, etc.

In FIG. 18B, the structure that is the same as the shape shown in FIG. 17B can be realized by depositing the photoresist 805 that has designated in advance, depositing the interlayer insulator 160 thereon, and carrying out the lift off washing process to thus peel off the insulator on the top part of the resist. In the methods shown in FIGS. 18A and 18B, since the physical etching or reactive gas ion etching is used, this structure can be realized without so much depending upon the materials of the interlayer insulator 160.

In FIG. 18C, an insulator 807 that is more resistive to an etching agent to be used in the later process than the interlayer insulator 160 is deposited and then the photoresist 805 for designating the shape is formed thereon. Only the insulator 807 is etched by means of such as an argon ion milling etching capable of etching the insulator 807. Thereafter, by means of a wet chemical etching, a part of the interlayer insulator 160 is etched. Depending upon the combination of the material 160 to be etched and the etching agent, four types of structures shown in FIG. 18C can be realized. As an example, the same shape as those shown in FIGS. 17C and 17D can be realized by using SiO₂ for the inter layer insulator 160, SiN$_X$ for the insulator 807 and fluoroxide as an etching agent.

That is, according to this Embodiment in which a part of the upper surface of the ferromagnetic layer 801 is covered, the object of the present invention can be achieved in that the shape of the end of the interlayer insulator 160 determining the degree of the electric contact between the electric conductor 802 used as an electrode and the ferromagnetic layer 801 can be formed so as to restrict variations in the MR values, the junction resistance value or the bias dependency of such values.

(Embodiment 5)

Figure 19A:
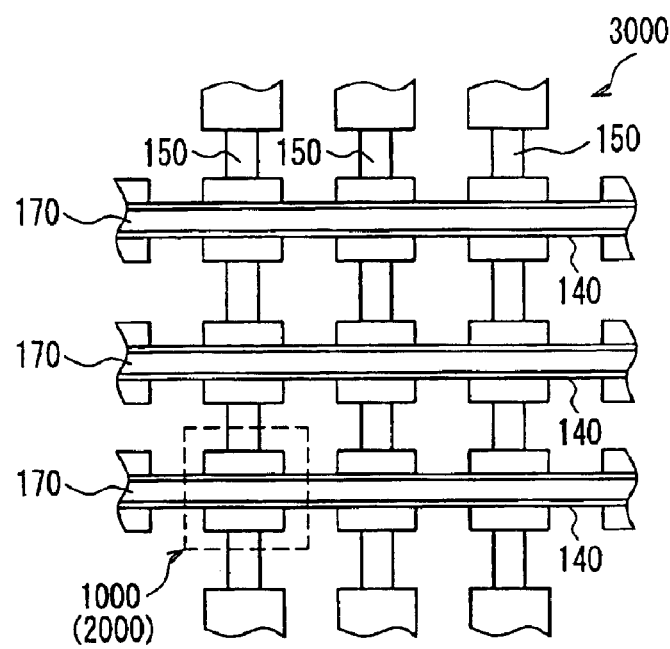
FIG. 19A is a top view showing an MRAM device according to Embodiment 5 of the present invention.
Figure 19B:
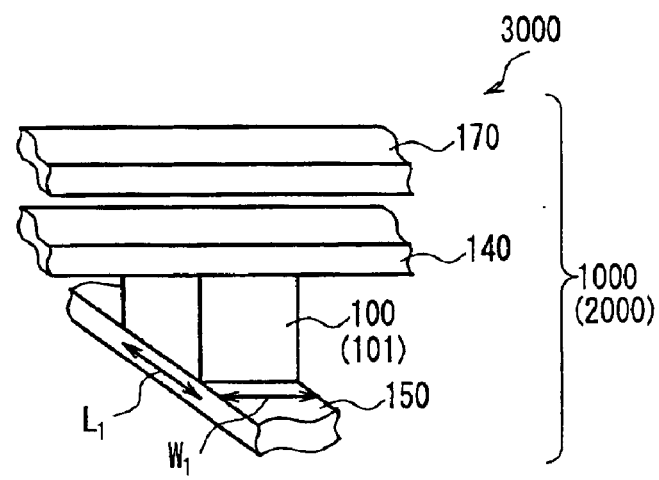
FIG. 19B is a perspective view showing a part of the MRAM device according to Embodiment 5 of the present invention.

FIGS. 19A and 19B show an MRAM device 3000 according to Embodiment 5 of the present invention. FIG. 19A is a top view showing the MRAM device 3000, and the FIG. 19B is a perspective view showing a part of the MRAM device 3000. The same component elements as those shown in the magnetoresistance storage elements 1000 and 2000 respectively shown in Embodiments 1 and 2 are given the same reference numbers and detailed explanations therefore are omitted herein. Herein, the shape of the MR element part 100 (101) is shown in a shape of parallelpiped, but in accordance with embodiments, it can be realized in a form of cylinder (or cylindroid), or a truncated pyramid or frustum. Furthermore, it is preferable in providing a shape anisotropy that the in-plane shape of the MR element part 100 (101) satisfies $L_1 > W_1$, wherein $W_1$ denotes a width and $L_1$ denotes a length in the direction of the plane. Furthermore, in this case, the electrode 140 is brought into contact with the MR element part 100 (101) with the configuration shown in Embodiments 3 and 4.

Figure 19C:
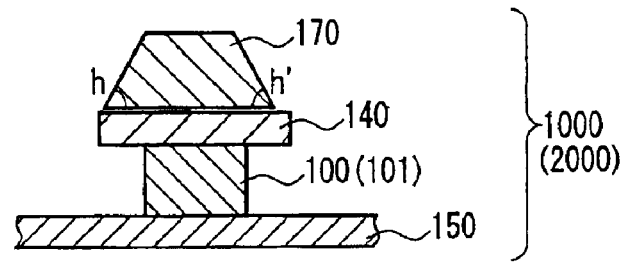
FIG. 19C is a cross-sectional view showing a part of the MRAM device according to Embodiment 5 of the present invention.

Furthermore, FIG. 19C is a cross-sectional view showing a more preferable conductive film 170 for applying a magnetic field to the MR element part 100 (101) by the conductive film 170, effectively. It is preferable that angles h and h' in FIG. 19C (angle represented by at least one angle in the square shaped conductive film 170) are acute angles. In the cross-sectional view of the conductive film 170, the angles h and h' are interior angles with respect to one side facing the MR element part 100 (101).

It is preferable that the cross-sectional shape of the conductive film 170 is formed in a shape shown in FIG. 19C because it is possible to increase effectively a part of the current flowing in the vicinity of the MR element part 100 (101) among the current uniformly flowing through the conductive film 170. Such a shape is particularly preferable when the aspect ratio (width/thickness) of the cross-sectional shape of the conductive film 170 is reduced as the MRAM device 3000 becomes fine.

In the case where the magnetic field is applied effectively, it is preferable that a free layer in the MR element part 100 (101) is arranged closer to the conductive film 170. Such an arrangement is preferable when using the resultant magnetic field at the conductive film 170 and the sense line 150 which are arranged perpendicular to each other because an operation margin for selecting the MR element as the MRAM device can easily be taken. This is because when the ratio of the magnetic field generated at the conductive film 170 and the magnetic field generated at the sense line 150 become 1:1 at the operation point (that is, in FIG. 20, in the case where θ=45° is satisfied), the magnetic field for rotating the magnetization may be reduced.

The MRAM device 3000 is configured by placing the magnetoresistance storage element 1000 or 2000 shown in Embodiments 1 and 2 in a matrix. Both the magnetoresistance storage elements 1000 and 2000 are the above-mentioned CPPMR element.

As shown in FIGS. 19A and 19B, in the MRAM using the CPPMR element, since the magnetoresistance storage elements are connected in parallel to each other, even if the number N of the magnetoresistance storage elements is increased, the S/N ratio hardly is reduced.

Figure 21A:
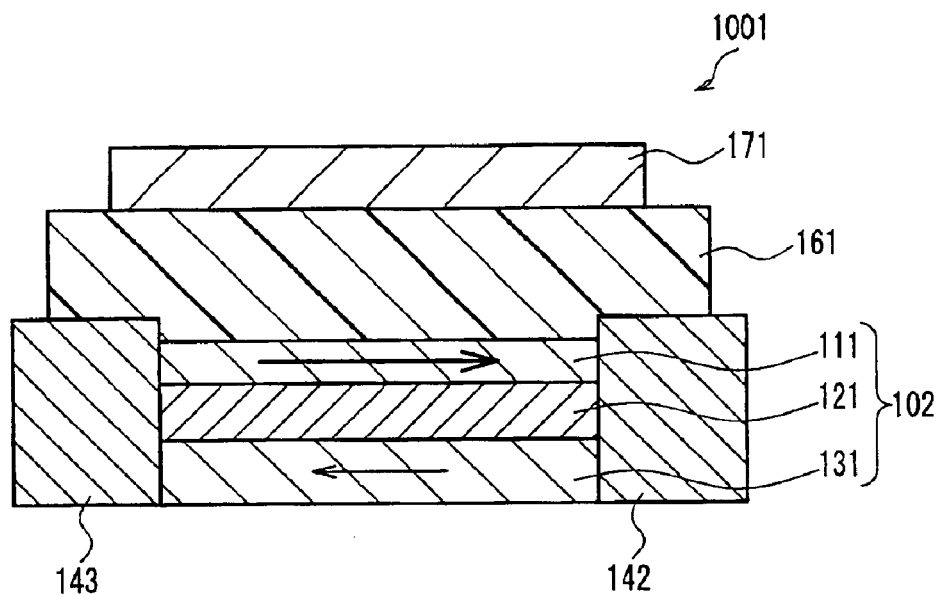
FIG. 21A is a cross-sectional view showing a magnetoresistance storage element according to Embodiment 5 of the present invention.

FIG. 21A is a cross-sectional view showing the magnetoresistance storage element 1001 as another aspect of Embodiments of the present invention.

In the magnetoresistance storage element 1001, a MR element part 102 is formed of a hard magnetic film 111, a non-magnetic conductive film 121 and a soft magnetic film 131. The MR element part 102 is connected to conductive films 142 and 143 constituting the sense line and the bit line. Furthermore, the conductive film 171 constituting the word line is provided on the upper part of the MR element 102 via the insulating film 161. The magnetoresistance storage element 1001 having a configuration shown in FIG. 21A is a CIPMR element.

Figure 21B:
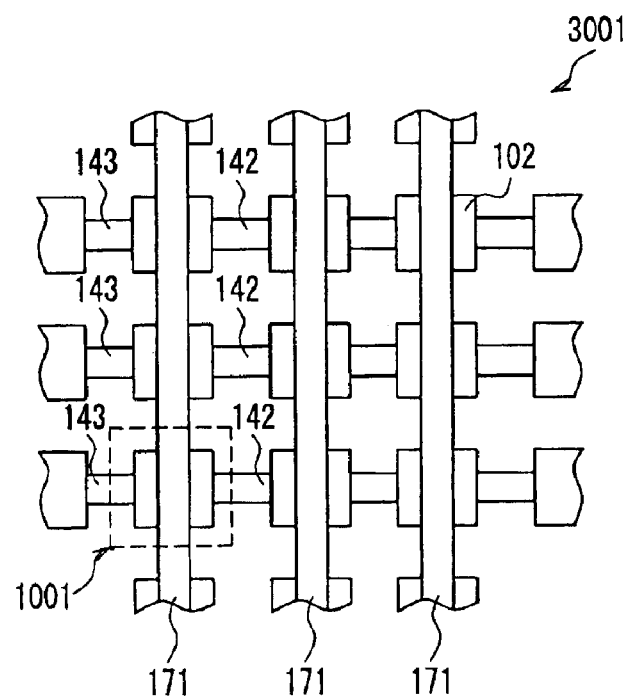
FIG. 21B is a perspective view showing a part of the MRAM device according to Embodiment 5 of the present invention.

As shown in FIG. 21B, the CIPMR element type magnetoresistance storage elements 1001 are arranged in a matrix, to thus configure an MRAM device 3001. At this time, the magnetoresistance storage elements are connected in series with each other. In the case where the magnetoresistance storage elements are connected in series with each other in this way, if the number N of the magnetoresistance storage elements is increased, although the MR ratio of each element is the same, the S/N ratio of the MRAM as a whole is thought to be reduced.

Note here that for most part in all the Embodiments of the present invention shown in the drawings, the MR element part is illustrated larger than the wiring part such as a sense line and a word line, etc. The same is true in FIGS. 19A to 19C and FIGS. 21A to 21B. However, this is shown like this for easy understanding, and the size relationship between the MR element part and the wiring part is not limited to the above-mentioned configuration. Furthermore, in order to apply the magnetic field to the MR element part effectively, it is preferable that the wiring part covers the MR part.

Since the above-mentioned MRAM devices 3000 and 3001 are storage elements using a magnetic field, this is different from DRAM that is a semiconductor element using the storage of electric charges and is nonvolatile. Furthermore, unlike a flush type element of semiconductor, the number of writing/read-out is not limited in principle and the time for writing/erasing is in as fast as a nano seconds (ns) order.

The operation principle of one magnetoresistance storage element is as mentioned in Embodiments 1 and 2. By the way, when an MRAM device is configured actually as shown in FIGS. 19A, 19B and 19C, it is necessary to arrange the magnetoresistance storage elements in a matrix. In this case, word lines are arranged in a matrix and a MR element part is provided in the vicinity of the crossing point in each word line. Note here that the word lines (conductive film 170 or 171) shown in FIGS. 19A, 19B and 21B are illustrated only in one direction of a row element or a column element in the matrix. The word lines arranged in a matrix are furthermore mentioned in detail in the below mentioned Embodiments.

A magnetic field generated by two word lines crossing each other in the vicinity of the MR element part in the address (N, M) selected at this time is applied to the MR element part. Furthermore, at this time, a sense line may be substituted for one of the two word lines.

In the case where the MRAM device is configured by the use of the magnetoresistance storage element 1000 as shown in FIG. 1, when the resultant magnetic field by the above-mentioned two word lines is beyond the value of a switching magnetic field represented by an asteroid-shaped curve of the hard magnetic film, information is written. Furthermore, when the resultant magnetic field is not beyond this value but beyond the value of a switching magnetic field of the soft magnetic film, information is read out in a nondestructive manner with respect to a desired storage element.

Furthermore, the case of the magnetoresistance storage element 2000 shown in FIG. 2 is basically the same in that information is written by inverting magnetization of the soft magnetic film by the resultant magnetic field. Furthermore, as to the read-out of the information of these storage elements, the information of the element part in the address (N, M) can be read out by allowing a current pulse to flow through the two word lines (or word line and sense line) in the vicinity of the element in the address (N, M) by the use of the change in resistance monitored via the sense line and bit line connected to the elements at the address (N, M).

Furthermore, as explained with reference to FIG. 4C in Embodiment 2, by comparing the resistance value with the reference resistor of the MR element part, it is possible to make the read-out of the information of the MR element part in the address (N, M) to be NDRO.

Furthermore, a switching element such as a transistor is arranged in a word line group and a sense line group, and a word line of N-row and M-column and a sense line (bit line) of N-row and M-column are selected so as to select a storage element in the address (N, M) via a signal for designating address. At this time, it is desirable that each storage element is provided with a diode or a transistor in order to prevent the reflection of the higher harmonics component in accordance with the inflow of the signal pulse via the other path or in accordance with the high speed of the signal pulse and to transfer signal pulses efficiently. Above all, in order to respond to the high speed pulse response, a MOS type transistor is used preferably as the above-mentioned transistor.

Furthermore, in accordance with the high density of the storage element, the problem of a leakage of a magnetic field generated by a word line leaking into the other part of the selected MR element part becomes significant. In order to reduce the interference effect on the part other than the selected MR element part due to the leakage magnetic field, a current pulse is allowed to flow through not only one pair of word lines generating a magnetic field to the address (N, M) but also at least one word line or a pair of word lines on both ends or located in the vicinity, thereby canceling the generated leakage magnetic field so as to reduce the effect.
(Embodiment 6)

FIGS. 22A to 22D show cross-sectional views showing a magnetoresistance storage element 4000 according to Embodiment 6 of the present invention.

In the magnetoresistance storage element 4000, a MR element part 200 is formed of hard magnetic films 112, 113 and 114, soft magnetic films 132, 133 and 134, non-magnetic insulating films 122, 123 and 124, and non-magnetic films 222 and 223. Furthermore, a conductive film 172 constituting a word line is provided on the upper part of the MR element part 200 via the insulating film 162.

The MR element part 200 has a structure in which a patterned structure of soft magnetic film/non-magnetic insulating film/hard magnetic film is laminated via the non-magnetic film several times. In the magnetoresistance storage element 4000, the number of laminations is three. Note here that the number of laminations may be set to an arbitrary number.

Figure 22A:
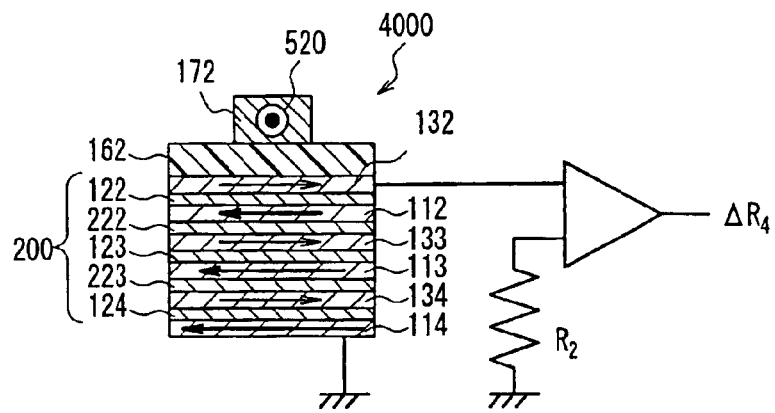
FIGS. 22A to 22D are cross-sectional views showing a magnetoresistance storage element according to Embodiment 6 of the present invention.
Figure 22B:
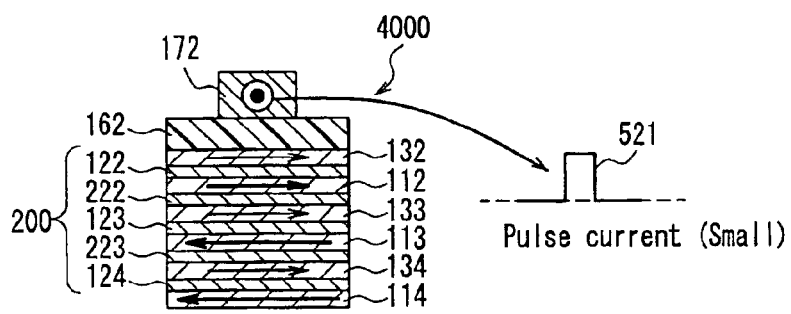
Figure 22C:
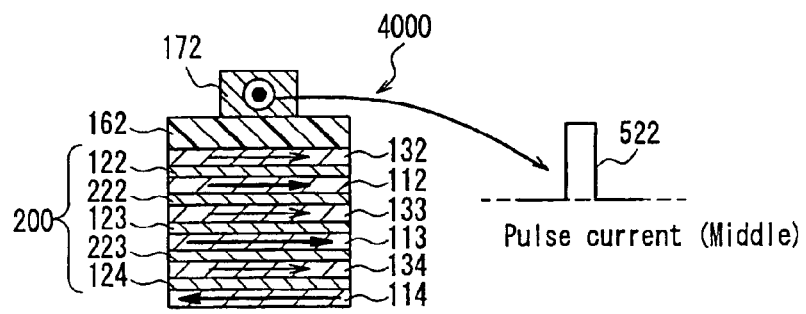

In this Embodiment, the hard magnetic films 112, 113 and 114 having different coercive forces respectively are used. As a result, since there are a plurality of threshold values in the magnetic field at the time of recording, a multivalued storage in one magnetoresistance storage element 4000 can be realized. In order to vary the coercive forces of each hard magnetic film 112, 113 and 114, each composition may be changed, or each thickness may be changed. In this case, as shown in FIG. 22A, by reading out a signal by using a method for detecting the difference $\Delta R_4$ between the resistance value of the MR element part 200 and the reference resistance $R_2$, it is possible to read out the multivalued stored signals ("0", "1", "2" and "3", etc.), respectively.

Since in the magnetoresistance storage element 4000, the laminating number is three and the number of patterns of the magnetization direction of the MR element parts 200 is four, as shown in FIGS. 22A to 22D, four values ("0", "1", "2" and "3") can be stored in one magnetoresistance storage element 4000.

Figure 22D:
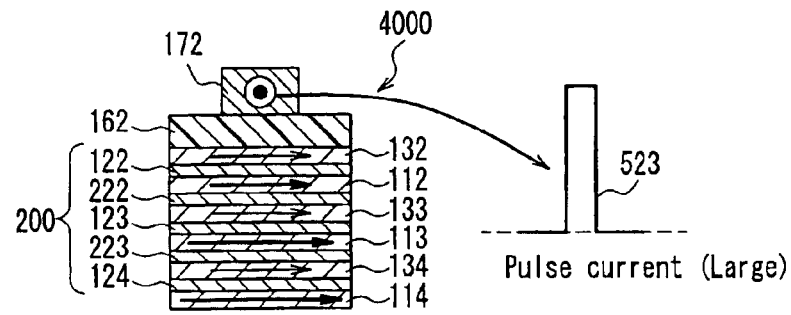

In the magnetoresistance storage element 4000, the magnetization of the hard magnetic films 112, 113 and 114 is inverted by a magnetic field generated by pulse currents 521, 522 and 523 flowing through a conductive film 172, and signals are written. In this Embodiment, the hard magnetic film 112 has the smallest coercive force and the hard magnetic film 114 has the largest coercive force. At this time, by adjusting the magnitude of a pulse current flow through the conductive film 172, it is possible to select a hard magnetic film whose magnetization is inverted from the hard magnetic films 112, 113 and 114. In this embodiment shown in FIGS. 22A to 22D, the value of the pulse current flowing through the conductive film 172 is increased from FIGS. 22A to 22B to 22C to 22D in this order. In FIG. 22A, the value of the pulse current flowing through the conductive film 172 is further smaller than the pulse current 521 in FIG. 22B. In FIG. 22A, the magnetization of none of the hard magnetic films 112, 113 and 114 is inverted. In FIG. 22D, the magnetization of all the hard magnetic films 112, 113 and 114 is inverted.

The signals are read out by a method of detecting the difference $\Delta R_4$ between the resistance value of the MR element part 200 and the reference resistance $R_2$ as mentioned above.

Furthermore, the signals may be read out by allowing a current to flow through the conductive film 172 and by reading out the change in the resistance value of the MR element part 200. In this case, the change in the resistance value of the MR element part 200 can be detected by, for example, comparing this resistance value with the reference resistance value $R_2$.

Furthermore, the soft magnetic films 132, 133 and 134 having different coercive forces may be used. In this case, by adjusting the magnitude of the pulse current flowing through the conductive film 172 more precisely, and setting a soft magnetic film that is to be subjected to magnetization inversion and a soft magnetic film that is not to be subjected to magnetization inversion in the soft magnetic films 132, 133 and 134, it is possible to allow further a larger number of signals to be stored in one magnetoresistance storage element 4000. Furthermore, it is preferable in this case that signals are read out by a method for detecting the difference $\Delta R_4$ between the resistance value of the MR element part 200 and the reference resistance $R_2$.

Furthermore, the magnetization direction of all the hard magnetic films are fixed and the magnetization of only the soft magnetic film may be inverted so as to store signals as shown in Embodiment 2 of the present invention.

(Embodiment 7)

As Embodiment 7 of the present invention, the MR element part 100 (FIG. 1) shown in Embodiment 1 will be explained in detail. FIGS. 23A to 23G show cross-sectional views and perspective views of the MR element part 100 in Embodiment 7 of the present invention.

Figure 23A:
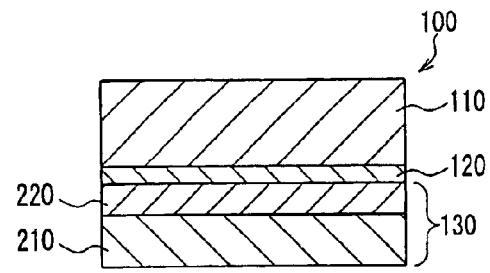
FIGS. 23A to 23D are cross-sectional views showing a MR element part according to Embodiment 7 of the present invention.

In the MR element part 100 shown in FIG. 23A, in order to increase the MR ratio, a soft magnetic film 130 as a free layer includes an interface magnetic film 220 provided on an interface to the non-magnetic insulating film 120 and an amorphous magnetic film 210. Since the free layer requires a soft magnetic property, a Ni-rich material may be used. However, in this Embodiment, as the interface magnetic film 220, a Co-rich material is used, and as the amorphous magnetic film 210, CoFeB or CoMnB, etc. is used. With such a configuration, even if the thickness of the soft magnetic film 130 is 2 nm or less, a high MR ratio can be obtained without losing the soft magnetic property. Note here that the magnetoresistance storage element using the free layer shown in this Embodiment also is excellent in thermal stability.

It is preferable that as the interface magnetic film 220, an alloy material containing at least one atom selected from Ni, Co, and Fe as a main component is employed. Furthermore, in the case of using an alloy material including Ni—Co—Fe as a main component, it is desirable that the atomic composition ratio of the interface magnetic film 220 is represented by $Ni_xCo_yFe_z$ wherein x: 0–0.4, y: 0.2–0.95 and z: 0–0.5 are satisfied.

As shown in this Embodiment, as the soft magnetic film 130 (free layer), by using the interface magnetic film 220 and the amorphous magnetic film 210, it is possible to realize the magnetoresistance storage element having a free layer having a magnetically effective thickness of 2 nm or less.

At this time, if the film thickness of the interface magnetic film 220 is large, the soft magnetic property is deteriorated and the MR ratio is lowered. Therefore, it is necessary that the film thickness of the interface magnetic film 220 is 2 nm or less, and desirably 1.2 nm or less. Furthermore, in order to operate the interface magnetic film 220 effectively, at least 0.2 nm or more of film thickness is necessary, and desirably the film thickness is 0.8 nm or more. As the materials for the interface magnetic film 220, Co or Co—Fe alloy containing Co with high concentration can be used.

Figure 23B:
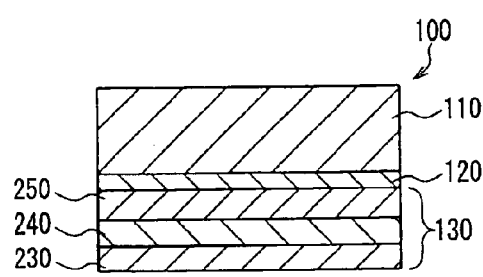

FIG. 23B shows the MR element part 100 in the case where an exchange-coupling type ferrimagnetic film is used as the soft magnetic layer 130 (free layer). Two ferromagnetic films 230 and 250 contained in the soft magnetic film 130 are magnetically exchange-coupled with each other via the non-magnetic film 240. At this time, by setting the film thickness of the non-magnetic film 240 to be an appropriate value (for example, in the case where Ru is used, the film thickness is 0.6 nm or more and 0.8 nm or less), this exchange-coupling film can be made to be anti-ferromagnetic. The MR element part 100 shown in FIG. 23B is characterized in that the film thickness of each of the ferromagnetic films 230 and 250 which are anti-ferromagentically exchange-coupled via the non-magnetic film 240 (for example, Ru) is set to be different from each other, or the magnitude of the saturation magnetization is made to be different from each other.

It is desirable that as the non-magnetic film 240 of the soft magnetic film 130 having an exchange-coupling type ferrimagnetic film structure shown in FIG. 23B, a non-magnetic metal film susceptible to exchange-coupling between the magnetic films is used. For example, Cu, Ag, and Au are used. Furthermore, by taking the thermal stability of the interface into account, Ru, Rh, Ir, Re, etc. are more desirable, and in particular, Ru is excellent. Furthermore, as the metal magnetic film used for the exchange-coupling type ferrimagnetic film, a metal magnetic film containing as a main component at lest one or two kinds or more of elements selected from Ni, Co, and Fe is desirable.

The magnitude of the saturation magnetization of the ferromagnetic substance is determined by multiplying the magnitude of the magnetic moment unique to a material for determining the magnetization by the volume of the ferromagnetic substance (corresponding to the number of the magnetic moment included in the ferromagnetic substance). In the case of the configuration shown in FIG. 23B, the sizes of the two ferromagnetic films 230 and 250 included in the exchange-coupling ferrimagnetic film are substantially the same. Therefore, the magnitudes of the saturation magnetization in the respective plane direction of the two ferromagnetic films 230 and 250 are determined by the strength of the magnetic moment unique to the respective materials and the film thickness. In the free layer (soft magnetic film 130) formed of such an exchange-coupling type ferrimagnetic film, the magnetically effective film thickness that plays a role as a free layer is the difference of the film thickness (magnetization) between the ferromagnetic films 230 and 250. To thin the magnetically effective film thickness exhibits an effect of enhancing the sensitivity of the device.

In the configuration of the MR element part 100 as shown in FIG. 23B, in the case where the magnitude of the magnetization is made to be different depending on the thickness of a ferromagnetic film, in particular, it is preferable that the difference of the film thickness between the ferromagnetic films 230 and 250 is 2 nm or less. At this time, in the above-mentioned sense, it is possible to realize a magnetoresistance element having a free layer that is the magnetically effective film thickness of 2 nm or less.

In the case where the magnetization is inverted in a free layer in which the difference of the film thickness between the two ferromagnetic films is 2 nm or more, in accordance with the increase in the anti-magnetic field component, a stronger external magnetic field is required. In the case of configuring MRAM, the external magnetic field is generated by the use of a word line (or a sense line) and applied to the MR element part. Assuming that the possible amount of current that is allowed to flow through the word line is at most 50 $MA/cm^2$ even if copper (Cu) having a low resistance is used, when the operation margin is taken into account in view of the stable operation of the device, the difference of the thickness of the ferromagnetic film estimated by the possible generated external magnetic field is preferably of several nm order or less. According to the configuration of the present invention as shown in FIG. 23B, it was found that the difference of the thickness between the ferromagnetic films 230 and 250 is the most preferably 2 nm or less. Furthermore, when the effective thickness as the free layer is 0.2 nm or less, the soft property as the free layer is deteriorated. Therefore, it is preferable that the effective thickness as the free layer is 0.2 nm or more.

Furthermore, the magnetization rotation response of the soft magnetic film 130 is carried out as a rotation of the effective magnetization generated by the difference of magnetization of the two ferromagnetic films with the remaining the magnetization direction of the ferromagnetic films 230 and 250 to be in not-parallel with respect to the application of the external magnetic field. This is because the magnetization rotation braking the anti-parallel state of the magnetization of the two ferromagnetic films due to the application of the magnetic field is required to overcome the exchange-coupling between the two ferromagnetic films 230 and 250, so that a higher external magnetic field is required as compared with the magnetization rotation with the anti-parallel state as mentioned above and thus it is not preferable. In this Embodiment, as shown in FIG. 23D, with respect to the external magnetic field, the magnetization of the two ferromagnetic films 230 and 250 is rotated with the magnetic vectors of the two ferromagnetic films 230 and 250 to be kept in anti-parallel, and thereby the magnetoresistance effect element can be operated effectively with a low magnetic field.

Figure 23C:
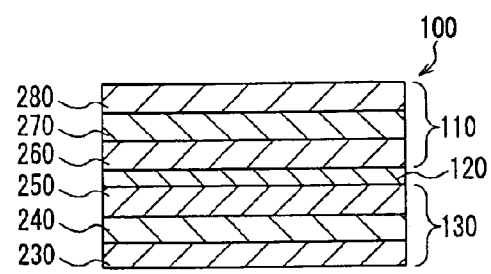
Figure 23D:
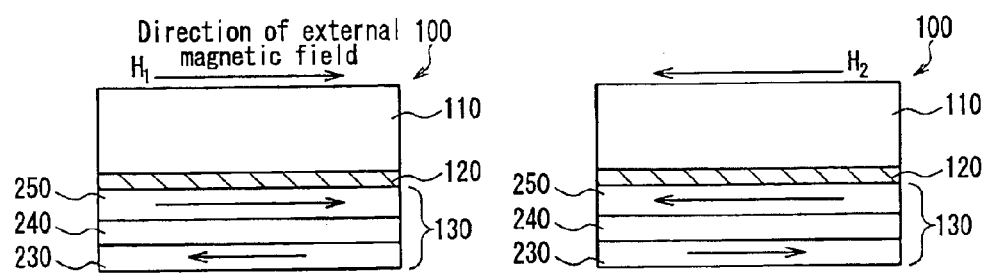
Figures 23E, 23F, 23G:
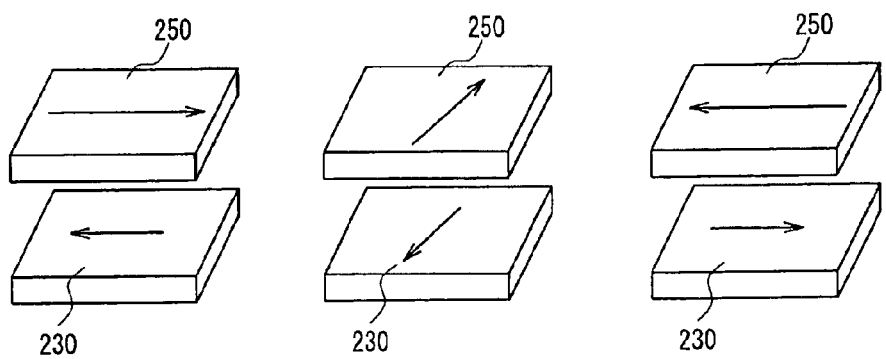
FIGS. 23E to 23G are perspective views showing a ferromagnetic film according to Embodiment 7 of the present invention.

FIG. 23D shows a state in which the magnetization directions of the ferromagnetic films 230 and 250 are changed when the direction in which the magnetic field is applied from the external magnetic field changes from $H_1$ to $H_2$. FIGS. 23E to 23G are perspective views schematically showing a state in which the magnetization direction of the ferromagnetic films 230 and 250 are changed when the direction in which the magnetic field is applied from the external magnetic field changes from $H_1$ to $H_2$ in FIG. 23D. Note here that in FIGS. 23E to 23G, the component elements other than the ferromagnetic films 230 and 250 are omitted for easy explanation. When the direction in which the magnetic field is applied changes from the external magnetic field $H_1$ to $H_2$, the directions of the magnetization of the ferromagnetic films 230 and 250 are changed as shown in FIGS. 23E to 23G. FIG. 23F shows a middle state in which the magnetization directions is changed from the ferromagnetic films 230 and 250. The magnetization rotation response of the soft magnetic film 130 is carried out as a rotation of the effective magnetization generated by the difference in the magnetization between the two magnetization with the two magnetization directions of the ferromagnetic films 230 and 250 kept in anti-parallel with each other.

Furthermore, in a RAM using the magnetoresistance effect element such as a MRAM device, in accordance with becoming finer in a sub-micron order, the deterioration of the processing accuracy or the state in which the processed element itself is easily affected by each particle in the magnetic film is seen, thus making it difficult to make the magnetic layer of the element to be single magnetic domain. As in the present invention, by configuring the free layer in an exchange-coupling type ferrimagnetic structure, the effect of making the free layer to make a single magnetic domain can be obtained.

Furthermore, the advantage in which the single magnetic domain is achieved and the property in which two ferromagnetic layers are connected magnetically with an antiferromagnetic exchange-coupling energy are combined, and thus the magnetoresistance effect element of the present invention has an excellent property in thermal stability.

Furthermore, the configuration of the exchange-coupling type ferrimagnetic film used for the above-mentioned free layer may be used for the hard ferromagenetic film 110 that is a fixed layer. In this case, in the non-magnetic film 270 as shown in FIG. 23C, as mentioned above, the non-magnetic metal film that easily generates the exchange-coupling between the ferromagnetic films 260 and 280 is desirable and Cu, Ag, Au are used. From the viewpoint of the thermal stability of the interface, Ru, Rh, Ir, Re, etc. are desirable, and Ru is particularly excellent.

Furthermore, also as a metal magnetic film used for the exchange-coupling type ferrimagnetic film, as mentioned above, a metal magnetic film containing at least one or two or more kinds of elements from Ni, Co, and Fe as a main component is desirable. Also in this case, when the non-magnetic film 270 has an appropriate thickness (0.4 to 1 nm), on the ferromagnetic substance that is in contact with the non-magnetic film 270, an antiferromagnetic exchange-coupling occurs. In particular, in the case where the Ru is used as the non-magnetic film 270, the film thickness of the non-magnetic film 270 is preferably in the range from 0.6 to 0.8 nm. Furthermore, by allowing the antiferromagentic film (magnetization spinning suppression layer) 180 to be in the vicinity of the ferromagnetic films 260 and 280, the effect of enhancing a pinning effect can be obtained.

The configuration of the MR element part 100 shown in this Embodiment is applied to the MR element part 101 (FIG. 3) and 102 (FIG. 21) shown in Embodiments 2 and 3.

As the non-magnetic insulating film 120, oxides such as $Al_2O_3$ and MgO, or carbide, nitride are excellent. Alternatively, a wide gap semiconductor having an energy gap value of 2 eV to 6 eV is also preferable.

Furthermore, in particular, when a metal is used for the non-magnetic film 121 (FIG. 21A), Cu, Ag, Au, Ru, etc. may be used. In particular, Cu is excellent.

As the film thickness of the non-magnetic film 121, in order to weaken the mutual effect between magnetic films, at least 0.9 nm or more is necessary. Furthermore, when the non-magnetic film 121 becomes thick, the MR ratio is deteriorated. Therefore, the film thickness should be 10 nm or less, and desirably 3 nm or less. Furthermore, in the case where the film thickness is 3 nm or less, the flatness of each layer becomes important and if the flatness is insufficient, magnetic connection occurs so as to deteriorate the MR ratio and to lower the sensitivity between two ferromagnetic films. Therefore, it is desirable that convex and concave portions on the interface between the ferromagnetic film and the non-magnetic film be 0.5 nm or less.

In order to secure the insulation property, the film thickness of the non-magnetic insulating film 120 is required to be at least 0.3 nm or more. Furthermore, if the film thickness of the non-magnetic insulating film 120 is too large, the tunnel current does not flow. Therefore, it is desirable that the film thickness is 3 nm or less. Also in this case, the flatness of each layer is important, and if the flatness is deteriorated, the non-magnetic insulating film 120 is broken, thus causing a tunnel leakage. Alternatively, between the two ferromagnetic films (hard magnetic film 110 and the soft magnetic film 130), a magnetic connection occurs, so that the MR ratio of the MR element device 100 and the sensitivity are deteriorated. Therefore, it is desirable that the convex and concave portion on the interface between the ferromagnetic film and the non-magnetic film is 0.5 nm or less, and more preferably 0.3 nm or less.

The MR element parts 100, 101 and 102 shown in this Embodiment may be used as the magnetoresistance effect element similar to Embodiments 1 and 2.

(Embodiment 8)

As Embodiment 8 of the present invention, a method for forming the magnetoresistance storage element 1000 as shown in Embodiment 1 will be explained.

With reference to FIG. 1, as a target for sputtering, $Ni_{0.68}Co_{0.2}Fe_{0.12}$ (for the soft magnetic film 130), Al (for the non-magnetic insulating film 120), $Al_2O_3$ (for the non-magnetic insulation film 120) and $Co_{0.75}Pt_{0.25}$ (for the hard magnetic film 110) (herein, all the compositions are based on the atomic ratio) were used so as to form a sandwich type MR element part 100 as shown in FIG. 1 on a substrate (not shown) by a multiple-sputtering device. A basic configuration of the MR element device 100 is NiCoFe (15)/Al$_2$O$_3$ (1.5)/CoPt (10) (in the explanation for such a configuration element, the number written in parentheses represents a thickness (nm) and "/" represents a combination of component materials). Note here that each film thickness is controlled by a shutter.

As the method for forming the film of Al$_2$O$_3$ (non-magnetic insulation film 120), a method (method A) for forming a film of Al, followed by the oxidization process, and a method (method B) for sputtering Al$_2$O$_3$ as it is were employed and each non-magnetic insulating film 120 was investigated. As the above-mentioned oxidation process of Al, a natural oxidation inside a vacuum bath; a natural oxidation inside a vacuum bath under heating; or an oxidation in plasma inside a vacuum bath was carried out, respectively. In all the processes, an excellent non-magnetic insulating film could be obtained.

After the MR element part 100 was formed, when CoPt of the hard magnetic film 110 was magnetized, when the MR property of the MR element part 100 was measured at room temperature with 100 Oe of magnetic field applied, the MR ratio was 30% and 18% respectively in the above-mentioned methods A and B. The magnetic field width in which MR was generated was 5 Oe and 10 Oe, respectively. The junction area at this time was about 0.25 square micrometers. Among this, by the use of the method A in which the MR ratio was high, the magnetoresistance storage element 1000 as shown in FIG. 1 was formed. For the conductive films 140 and 150 for the sense line and the bit line, Pt or Au was used; and for the conductive film 170 for the word line, Al, AuCr, Ti/Au, Ta/Pt, Cr/Cu/Pt/Ta, TiW, or the like, was used. For insulation between the MR element part 100 and the conductive film 170, CaF$_2$ or SiO$_2$ was used. Furthermore, Si$_3$N$_4$ also was used.

The magnetoresistance storage element 1000 formed as mentioned above was evaluated as follows.

Figure 24A:
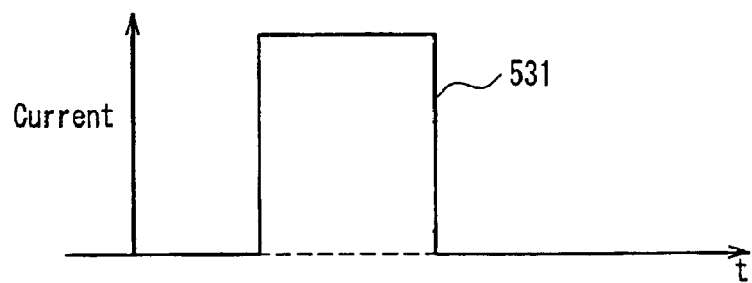
FIGS. 24A and 24B are views showing an operation of a magnetoresistance storage element according to Embodiment 8 of the present invention.

Firstly, a pulse current 531 as shown in FIG. 24A was allowed to flow through the conductive film 170 (word line) so as to magnetize the hard magnetic film 110 in one direction. Next, a pulse current 532 as shown in the upper graph of FIG. 24B was allowed to flow also through the conductive film 170, and the change in voltage of the storage element ($\Delta R_S/\Delta t$), which was measured through the conductive films 140 and 150 (sense line and bit line), was monitored. From the results of the change in voltage ($\Delta R_S/\Delta t$), as in the lower graph of FIG. 24B, it was found that a pulse 533 corresponding to the storage information was detected and the desirable magnetoresistance storage element 1000 using an insulator for a non-magnetic film was realized.

(Embodiment 9)

As Embodiment 9 of the present invention, a method for forming the magnetoresistance storage element 2000 as shown in Embodiment 2 will be explained.

The magnetoresistance storage element 2000 as shown in FIG. 3B was formed by the same method as mentioned in Embodiment 8.

As a target, Co$_{0.9}$Fe$_{0.1}$ (for the soft magnetic film 130), Al (for the non-magnetic insulating film 120), Ni$_{0.2}$Fe$_{2.8}$O$_4$ (for the ferromagnetic film 190), and IrMn (for the magnetization spinning suppression layer as the antiferromagnetic film 180) were used so as to form a MR element part 101 having a basic configuration of Co$_{0.9}$Fe$_{0.1}$ (7)/Al$_2$O$_3$ (1.8)/Ni$_{0.2}$Fe$_{2.8}$O$_4$ (10)/IrMn (15). Note here that Al$_2$O$_3$ was formed in the above-mentioned method A.

When the MR property of the MR element part 101 was measured at room temperature with 100 Oe of magnetic field applied, the MR ratio was about 26%. The junction area at this time was about 0.7 square micrometers.

For the conductive films 140 and 150, Au was used; and for the conductive film 170, AuCr was used. For insulation between the MR element part 100 and the conductive film 170, SiO$_2$ was used. Note here that in this Embodiment, SiO$_2$ was used for insulation, but CaF$_2$ or Al$_2$O$_3$ can be used, or Si$_3$N$_4$ may be used.

The operation of the magnetoresistance storage element 2000 formed by the above-mentioned method was confirmed as follows.

Figure 25A:
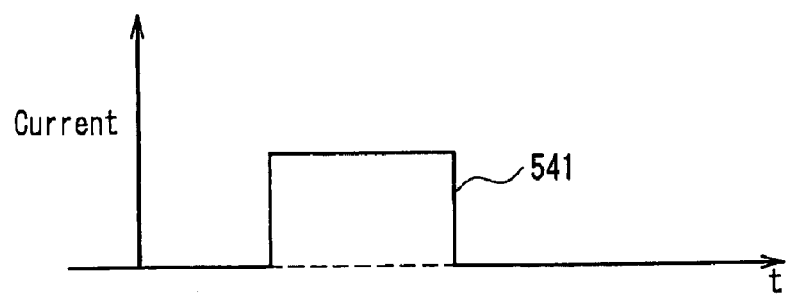
FIGS. 25A and 25B are views showing an operation of a magnetoresistance storage element according to Embodiment 9 of the present invention.

Firstly, a pulse current 541 as shown in FIG. 25A was allowed to flow in the conductive film 170 so as to magnetize the soft magnetic film 130 in one direction. Next, a pulse current 542 as shown in the upper graph of FIG. 25B was allowed to flow also in the conductive film 170 and the change in voltage ($\Delta V_1$) of the storage element, which was measured through the conductive films 140 and 150, was monitored. From the results of the change in voltage ($\Delta V_1$), as in the lower side graph in FIG. 25B, it was found that the pulse 543 corresponding to the storage information was detected and the desirable magnetoresistance storage element 2000 using an insulator for a non-magnetic film was realized.

(Embodiment 10)

As Embodiment 10 of the present invention, a method for forming the magnetoresistance storage element 100 as shown in Embodiment 7 will be explained.

The MR element part 100 as shown in FIG. 23A was formed by the same method as mentioned in Embodiment 8.

As a target, Co$_{0.9}$Fe$_{0.1}$ (for an interface magnetic film 220), Co (for the interface magnetic film 220 and hard magnetic film 110), Al (for the non-magnetic insulating film 120), and CoMnB (for an amorphous magnetic film 210) were used so as to form a MR element part having a configuration of CoMnB (1)/Co (1)/Al$_2$O$_3$ (1.5)/Co (2) and a MR element part having a configuration of CoFeB (1)/Co$_{0.9}$Fe$_{0.1}$ (1)/Al$_2$O$_3$ (1.5)/Co (2), as the MR element part 100. Note here that in both MR elements, Al$_2$O$_3$ was formed in the above-mentioned method A.

As a substrate (not shown) on which the MR element part 100 was provided, a Si substrate the surface of which was thermal-treated, or an Al$_2$O$_3$.TiC, etc. was used. On the substrate, as an under layer, a single-layered film of Ta, Cu, NiFe, Pt, etc. or laminated film thereof was formed in accordance with the purpose, and the above-mentioned MR element part 100 was formed thereon. Furthermore, as a cap layer on the upper side, a single-layered film of Ta, Cu, NiFe, Pt, etc. or a laminated film thereof was formed in accordance with the purpose.

When the MR property of the MR element parts 100 was measured at room temperature with 100 Oe of magnetic field applied, the MR ratio was about 32% and 29%, respectively. The junction area at this time was about 0.25 square micrometers.

Furthermore, by using the MR element part 100 formed as mentioned above, the magnetoresistance storage element 1000 shown in Embodiment 1 was configured. For the conductive films 140 and 150, Au and Cu were used; and for the conductive film 170, AuCr was used. For insulation between the MR element part 100 and the conductive film 170, SiO$_2$ was used. Note here that in this Embodiment, SiO$_2$ was used for insulation, but CaF$_2$, Al$_2$O$_3$ or Si$_3$N$_4$ may be used.

The operation of the magnetoresistance storage element 1000 formed in the above-mentioned method was confirmed by the same method as shown in FIG. 24 in Embodiment 8.

Figure 24B:
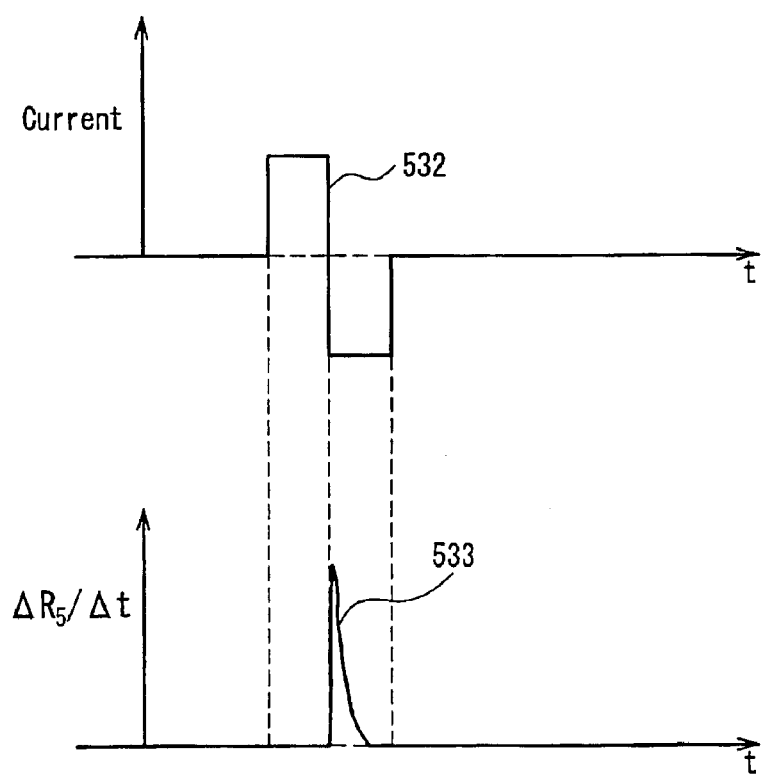

As a result, it was found that both of the magnetoresistance storage elements 1000 having the above-mentioned two kinds of MR element parts 100 could detect a pulse in accordance with the storage information as shown in FIG. 24B and that the magnetoresistance storage element 1000 of the present invention could be realized.

(Embodiment 11)

As Embodiment 11 of the present invention, a method for forming the magnetoresistance storage element 4000 as shown in Embodiment 6 will be explained.

The magnetoresistance storage element 4000 as shown in FIGS. 22A to 22D was formed by the same method as mentioned in Embodiment 8. As a target, $Ni_{0.68}Co_{0.2}Fe_{0.12}$ for the soft magnetic films 132, 133 and 134, and Al for the non-magnetic insulating films 122, 123 and 124 were used. Furthermore, for the hard magnetic films 112, 113 and 114 each having a different coercive force, $Co_{0.9}Fe_{0.1}$, Co, and $Co_{0.5}Fe_{0.5}$ were used so as to form a MR element part 200. The magnitude of the hard magnetic film is larger in the order of $Co_{0.9}Fe_{0.1} > Co > Co_{0.5}Fe_{0.5}$.

The formed MR element part 200 has a configuration of $Ni_{0.68}Co_{0.2}Fe_{0.12}$ (10)/$Al_2O_3$ (1.5)/$Co_{0.9}Fe_{0.1}$ (15)/Cu (15)/ $Ni_{0.68}Co_{0.2}Fe_{0.12}$ (10)/$Al_2O_3$ (1.5)/Co (15)/Cu (15)/ $Ni_{0.68}Co_{0.2}Fe_{0.12}$ (10)/$Al_2O_3$ (1.5)/$Co_{0.5}Fe_{0.5}$ (15) to form a three-junction array. Note here that in both MR elements, $Al_2O_3$ was formed in the above-mentioned method A. When the MR property of the MR element part 200 was measured at room temperature with 100 Oe of magnetic field applied, the MR ratio as an array was about 28%. The junction area at this time was about 0.25 square micrometers.

For the conductive film (the same conductive film as the conductive films 140 and 150 in Embodiment 1, not shown in FIGS. 22A to 22D) used for the sense line and the bit line, Au was used; and for the conductive film 172 used for the word line, AuCr was used. For insulation between the MR element part 200 and the conductive film 172, $SiO_2$ was used. Note here that in this Embodiment, $SiO_2$ was used for insulation, but $CaF_2$, $Al_2O_3$ or $Si_3N_4$ may be used.

The operation of the magnetoresistance storage element 2000 formed in the above-mentioned method was confirmed as follows.

Figure 26A:
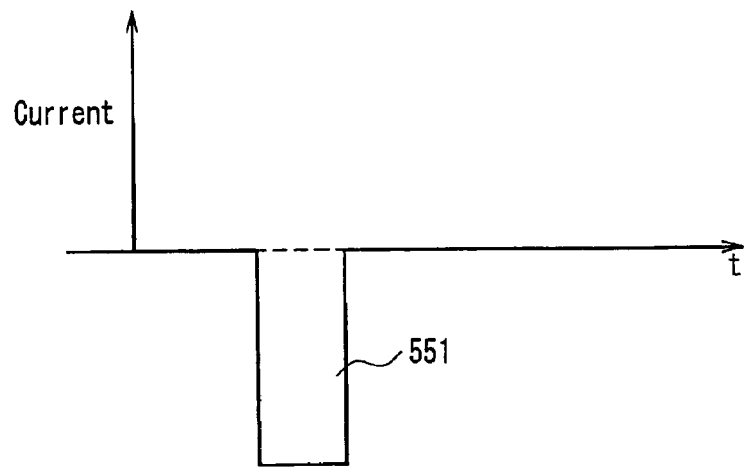
FIGS. 26A and 26B are views showing an operation of a magnetoresistance storage element according to Embodiment 11 of the present invention.
Figure 26B:
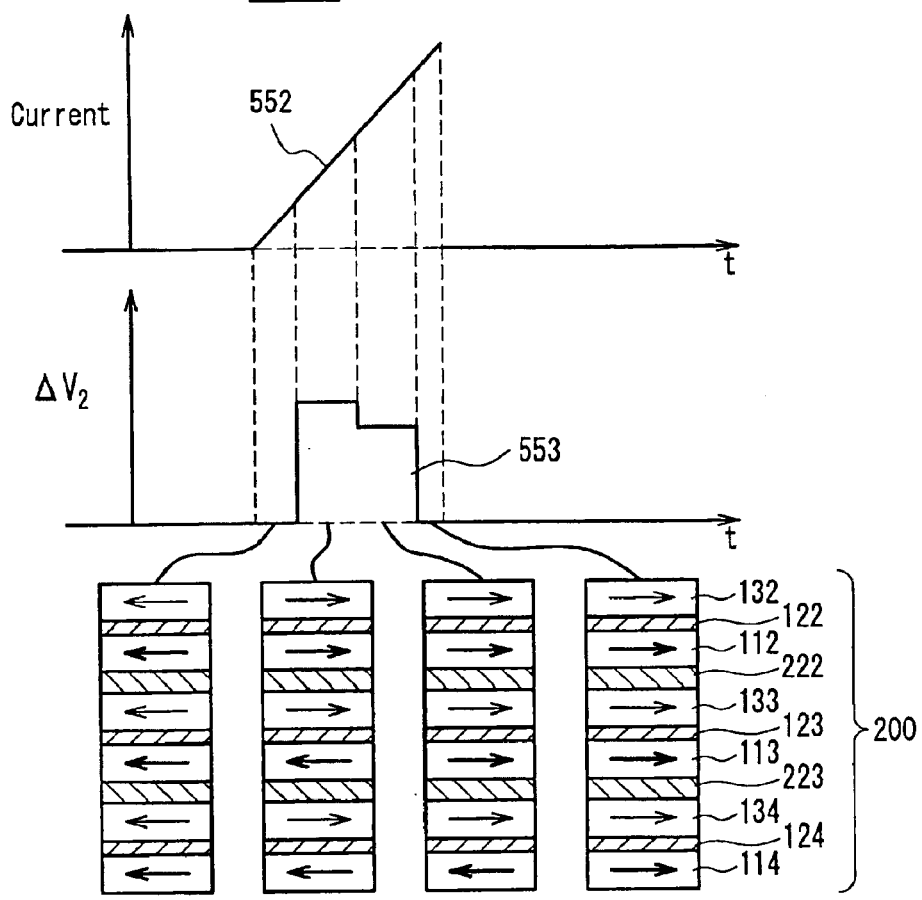

Firstly, as shown in FIG. 26A, a pulse current 551 was allowed to flow through the conductive film 172 so as to magnetize the hard magnetic film 112 in one direction. Next, by a rising inclined pulse current 552, the magnetization directions of the hard magnetic films 112, 113 and 114 are inverted in turn, respectively so as to monitor the change in voltage $\Delta V_2$ via the sense line and bit line. As a result, it was confirmed that the change in voltage 552 in accordance with the storage information was detected and the multi-value was recorded/read out in/from the magnetoresistance storage element 4000.

In the magnetoresistance storage element 4000 of the present invention, it is possible to carry out a multi-valued recording by applying an appropriate bias current. Furthermore, it is possible to detect the recorded information in accordance with the voltage change $\Delta V_2$ under constant bias current.

Note here that in this Embodiment, as the MR element part 200, in the configuration of $Ni_{0.68}Co_{0.2}Fe_{0.12}$ (10)/ $Al_2O_3$ (1.0)/$Co_{0.9}Fe_{0.1}$ (15)/$Al_2O_3$ (1.5)/$Ni_{0.68}Co_{0.2}Fe_{0.12}$ (10)/$Al_2O_3$ (1.0)/Co (15)/$Al_2O_3$ (1.5)/$Ni_{0.68}Co_{0.2}Fe_{0.12}$ (10)/$Al_2O_3$ (1.0)/$Co_{0.5}Fe_{0.5}$ (15), a three-junction array was used and examined, and thus it was confirmed that multi-valued recording and read out was possible.

(Embodiment 12)

As Embodiment 12 of the present invention, a method for forming the MR element part 100 as shown in Embodiment 5 will be explained.

The MR element part 100 as shown in FIG. 23B was formed by the same method as in the above-mentioned Embodiment 6.

As a target, $Co_{0.9}Fe_{0.1}$ or $Ni_{0.81}Fe_{0.19}$ for the ferromagnetic films 230 and 250 of a metal of an exchange-coupling type ferrimagnetic film, Ru for the non-magnetic film 240 of metal, Al for non-magnetic insulating film 120, and $Co_{0.9}Fe_{0.1}$ for the hard magnetic film 110 were used.

As the MR element part 100, a MR element part having a configuration of $Co_{0.9}Fe_{0.1}$ (1.9)/Ru (0.7)/$Co_{0.9}Fe_{0.1}$ (2.9)/ $Al_2O_3$ (1.2)/$Co_{0.9}Fe_{0.1}$ (20) and a MR element part having a configuration of $Ni_{0.81}Fe_{0.19}$ (3)/Ru (0.7)/$Ni_{0.81}Fe_{0.19}$ (2)/ $Al_2O_3$ (1.2)/$Co_{0.9}Fe_{0.1}$ (20) were formed. Note here that in both MR elements, $Al_2O_3$ was formed in the above-mentioned method A. When the MR property of the MR element part 200 was measured at room temperature with 100 Oe of magnetic field applied, the MR ratio as an array was about 25%. The junction area at this time was about 0.05 square micrometers.

It was confirmed that the MR element part of the Embodiment had a smaller coercive force as compared with the MR element part having a basic configuration of $Co_{0.9}Fe_{0.1}$ (4.8)/$Al_2O_3$ (1.2)/$Co_{0.9}Fe_{0.1}$ (20) or a basic configuration of $Ni_{0.81}Fe_{0.19}$ (5)/$Al_2O_3$ (1.2)/$Co_{0.9}Fe_{0.1}$ (20). This is because the effect of the anti-magnetic field is reduced by various configurations as shown in FIG. 23B.

Furthermore, by using the MR element part 100 formed as mentioned above, the magnetoresistance storage element 1000 shown in Embodiment 1 was configured. For the conductive films 140 and 150, Au and Cu were used; and for the conductive film 170, AuCr was used. For insulation between the MR element part 100 and the conductive film 170, $SiO_2$ was used. Note here that in this Embodiment, $SiO_2$ was used for insulation, but $CaF_2$, $Al_2O_3$ or $Si_3N_4$ may be used.

The operation of the magnetoresistance storage element 1000 formed in the above-mentioned method was confirmed by the same method as shown in FIGS. 24A and 24B in Embodiment 8. As a result, it was found that both of the magnetoresistance storage elements 1000 having the above-mentioned two kinds of MR element parts 100 could detect a pulse in accordance with the storage information as shown in FIG. 24B and that the magnetoresistance storage element 1000 of the present invention could be realized.

(Embodiment 13)

As Embodiment 13 of the present invention, a method for forming the magnetoresistance storage element 2000 as shown in Embodiment 2 will be explained. The magnetoresistance storage element 2000 according to this Embodiment has a soft magnetic film 130 shown in FIG. 23B of Embodiment 7.

The MR element part 101 (FIG. 3) having the soft magnetic film 130 shown in FIG. 23B of Embodiment 7 was formed by the same method as in Embodiment 6.

As a target, $Co_{0.9}Fe_{0.1}$ or $Ni_{0.81}Fe_{0.19}$ for the ferromagnetic films 230 and 250 of a metal of an exchange-coupling type ferrimagnetic film, Ru for the non-magnetic film 240 of a metal, Al for non-magnetic insulating film 120, $Co_{0.5}Fe_{0.5}$ for the ferromagnetic film 190 and IrMn for the magnetization spinning suppression layer an antiferromagnetic film 180 were used.

As the MR element part 101, a MR element part having a configuration of $Co_{0.9}Fe_{0.1}$ (1.9)/Ru (0.7)/$Co_{0.9}Fe_{0.1}$ (2.9)/ $Al_2O_3$ (1.2)/$Co_{0.5}Fe_{0.5}$ (20)/IrMn (30) and a MR element part having a configuration of $Ni_{0.81}Fe_{0.19}$ (3)/Ru (0.7)/ $Ni_{0.81}Fe_{0.19}$ (2)/$Al_2O_3$ (1.2)/$Co_{0.5}Fe_{0.5}$ (20)/IrMn (30) were formed. Note here that $Al_2O_3$ was formed in the above-mentioned method A.

When the MR property of the MR element part 101 was measured at room temperature with 100 Oe of magnetic field applied, the MR ratio as an array was about 30%. The junction area at this time was about 0.05 square micrometers.

It was confirmed that the MR element part 101 of this Embodiment had a smaller coercive force as compared with the MR element part 101 having a basic configuration of $Co_{0.9}Fe_{0.1}$ (4.8)/$Al_2O_3$ (1.2)/$Co_{0.5}Fe_{0.5}$ (20)/IrMn (30), or a configuration of $Ni_{0.81}Fe_{0.19}$ (5)/$Al_2O_3$ (1.2)/$Co_{0.5}Fe_{0.5}$ (20)/IrMn (30). This is because the effect of the antimagnetic field is reduced by the configuration including the soft magnetic film 130 as shown in FIG. 23B.

Furthermore, by using the MR element part 101 formed as mentioned above, the magnetoresistance storage element 2000 shown in Embodiment 2 was configured. For the conductive films 141 and 150, Au and Cu were used; and for the conductive film 170, AuCr was used. For insulation between the MR element part 101 and the conductive film 170, $SiO_2$ was used. Note here that in this Embodiment, $SiO_2$ was used for insulation, but $CaF_2$, $Al_2O_3$ or $Si_3N_4$ may be used.

Figure 25B:
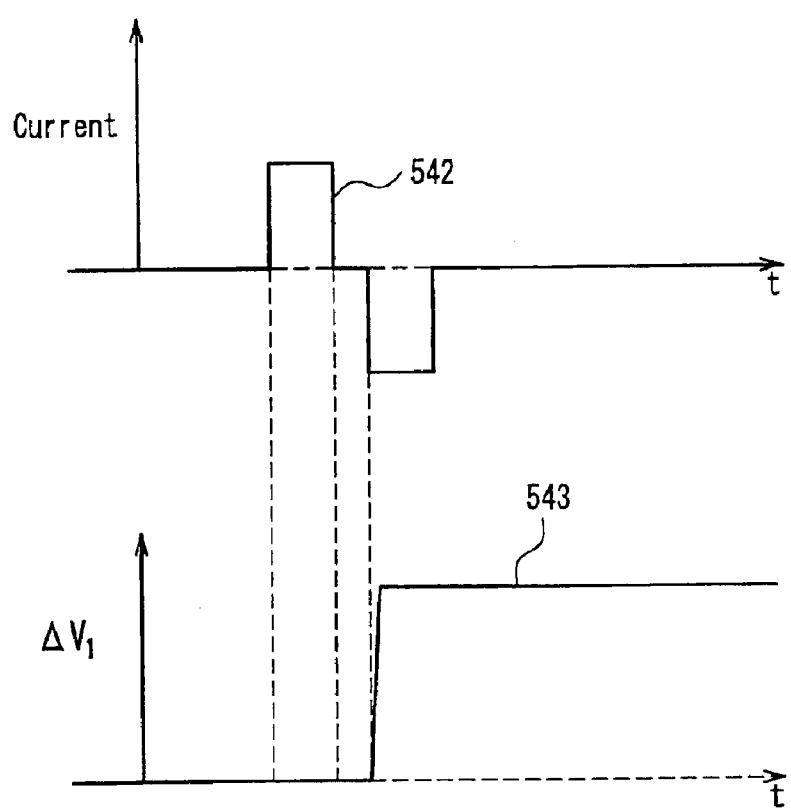

The operation of the magnetoresistance storage element 2000 formed in the above-mentioned method was confirmed by the same method as shown in FIGS. 25A and 25B in Embodiment 9.

As a result, it was found that the both of the magnetoresistance storage elements 2000 having the above-mentioned two kinds of MR element 20 part 101 could detect a change in voltage in accordance with the storage information as shown in FIG. 25B and that the magnetoresistance storage element 2000 of the present invention could be realized.

Note here that as the magnetization spinning suppression layer, IrMn was used. PtMn, a-$Fe_2O_3$, NiO may be used. Furthermore, NiO may be used. Furthermore, as the magnetization spinning suppression layer, a perovskite oxide such as $YFeO_3$, $SmFeO_3$ or the like may be used.

(Embodiment 14)

As Embodiment 14 of the present invention, a method for forming the magnetoresistance storage element 1000 shown in Embodiment 1 having a soft magnetic film 130 shown in FIG. 23B in Embodiment 7 will be explained.

The MR element part 100 having the soft magnetic film 130 shown in FIG. 23B of Embodiment 7 was formed by the same method as in the above-mentioned Embodiment 8. Furthermore, in this Embodiment, instead of the non-magnetic insulating film 120, the non-magnetic conductive film 121 (FIG. 21A) was used. That is, the magnetoresistance storage element 1000 of this Embodiment is a GMR element.

As a target, $Ni_{0.68}Co_{0.2}Fe_{0.12}$ for the ferromagnetic films 230 and 250, Cu for the non-magnetic film 121, and $Co_{0.9}Fe_{0.1}$ for the hard magnetic film 110 were used.

As the MR element part 100, a CPP structured MR element part containing $Co_{0.9}Fe_{0.1}$ (20)/Cu (3)/$Ni_{0.68}Co_{0.2}Fe_{0.12}$ (2)/Ru (0.7)/$Ni_{0.68}Co_{0.2}Fe_{0.12}$ (3) was formed.

When the MR property of the formed MR element part 100 was measured at room temperature with 100 Oe of magnetic field applied, the MR ratio was about 16%. The junction area at this time was about 0.05 square micrometers.

Furthermore, by using the MR element part 100 formed as mentioned above, the magnetoresistance storage element 1000 shown in Embodiment 1 was formed. For the conductive films 140 and 150, Au and Cu were used; and for the conductive film 170, AuCr was used. For insulation between the MR element part 100 and the conductive film 170, $SiO_2$ was used. Note here that in this Embodiment, $SiO_2$ was used for insulation, but $CaF_2$, $Al_2O_3$ or $Si_3N_4$ may be used.

The operation of the magnetoresistance storage element 1000 formed in the above-mentioned method was confirmed by the same method as shown in FIGS. 24A and 24B in Embodiment 8. As a result, it was found that a pulse corresponding to the storage information as shown in FIG. 24B was detected and the magnetoresistance storage element 1000 could be realized.

(Embodiment 15)

As Embodiment 15 of the present invention, a method for forming a magnetoresistance storage element 2000 shown in FIG. 3 of Embodiment 2 will be explained. The magnetoresistance storage element 2000 according to this Embodiment has a soft magnetic film 130 shown in FIG. 23B of Embodiment 7.

The MR element part 101 (FIG. 3) having the soft magnetic film 130 shown in FIG. 23B of Embodiment 7 was formed by the same method as in the Embodiment 8. Furthermore, in this Embodiment, instead of the non-magnetic insulating film 120, the non-magnetic conductive film 121 (FIG. 21A) was used. That is, the magnetoresistance storage element 2000 of this Embodiment is a GMR element.

As a target, $Ni_{0.68}Co_{0.2}Fe_{0.12}$ for the ferromagnetic films 230 and 250, Cu for the non-magnetic film 121, and $Co_{0.9}Fe_{0.1}$ for the ferromagnetic film 190 and PtMn for the magnetization spinning suppression layer as the antiferromagnetic film 180 were used.

As the MR element part 101, a CPP structured MR element part containing PtMn (30)/$Co_{0.9}Fe_{0.1}$ (20)/Cu (3)/$Ni_{0.68}Co_{0.2}Fe_{0.12}$ (2)/Ru (0.7)/$Ni_{0.68}Co_{0.2}Fe_{0.12}$ (3) was formed.

When the MR property of the formed MR element part 101 was measured at room temperature with 100 Oe of magnetic field applied, the MR ratio was about 19%. The junction area at this time was about 0.05 square micrometers.

Furthermore, by using the MR element part 101 formed as mentioned above, the magnetoresistance storage element 2000 shown in Embodiment 2 was configured. For the conductive films 141 and 150, Au and Cu were used; and for the conductive film 170, AuCr was used. For insulation between the MR element part 101 and the conductive film 170, $SiO_2$ was used. Note here that in this Embodiment, $SiO_2$ was used for insulation, but $CaF_2$, $Al_2O_3$ or $Si_3N_4$ may be used.

The operation of the magnetoresistance storage element 2000 formed in the above-mentioned method was confirmed by the same method as shown in FIGS. 25A and 25B in Embodiment 9.

As a result, it was found that both of the magnetoresistance storage elements 2000 having the above-mentioned two kinds of MR element parts 101 could detect a voltage change in accordance with the storage information as shown in FIG. 25B and that the magnetoresistance storage element 2000 of the present invention could be realized.

(Embodiment 16)

Figure 27A:
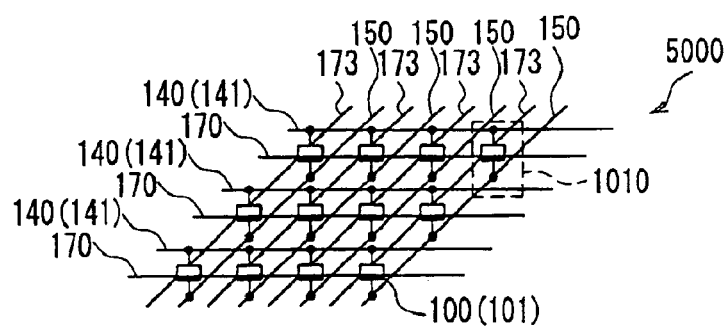
FIG. 27A is a perspective view showing an MRAM device according to Embodiment 16 of the present invention.
Figure 27B:
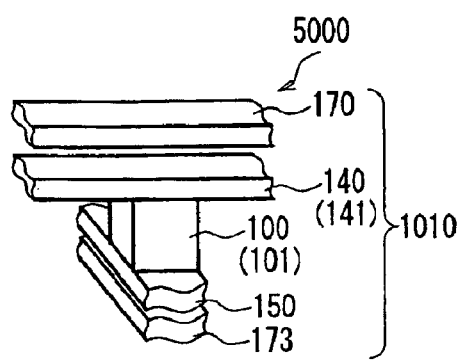
FIG. 27B is a perspective view showing a part of the MRAM device according to Embodiment 16 of the present invention.
Figure 27C:
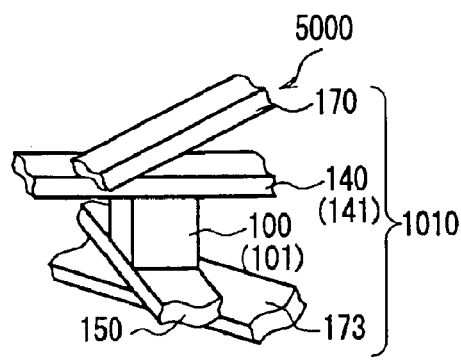
FIGS. 27C to 27E are perspective views showing a part of the MRAM device according to a modification of Embodiment 16 of the present invention.
Figure 27D:
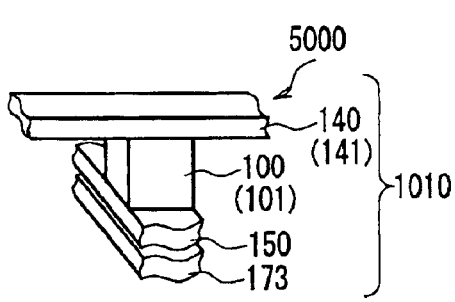
Figure 27E:
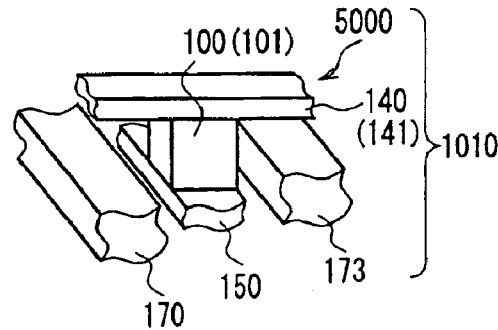
Figure 27F:
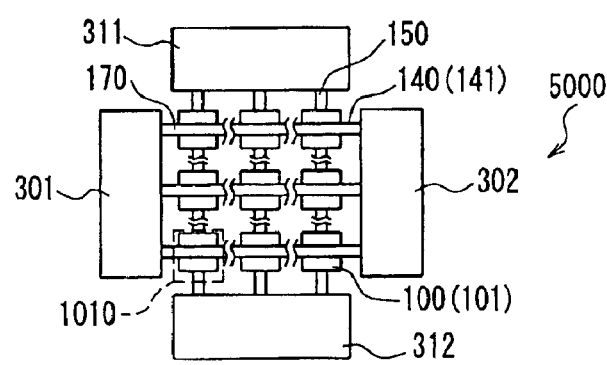
FIG. 27F is a top view showing the MR device according to Embodiment 16 of the present invention.

FIGS. 27A to 27F show a MRAM device 5000 according to Embodiment 16 of the present invention. FIGS. 27A to 27E are perspective views showing the MRAM device 5000 and a part thereof. FIG. 27F is a top view showing the MRAM device 5000. The same component elements of the magnetoresistance elements 1000 and 2000 explained in Embodiments 1, 2 and 5 are given the same numbers and the explanations therefor are omitted herein.

The MRAM device 5000 is a MRAM device in which a plurality of magnetoresistance storage elements 1010 are arranged in 256×256 matrix. Note here that any numbers of magnetoresistance storage elements 1010 can be arranged.

As shown in FIG. 27B, the magnetoresistance storage element 1010 has a configuration in which a word line 173 is further added into the configuration of the magnetoresistance storage element 1000 or 2000 as shown in FIG. 5B in Embodiment 5. The word lines 170 and 173 are preferably arranged along the upper and lower parts of the MR element 100 (or 101) as shown in FIG. 27B. However, the arrangement is not necessarily limited to the arrangement shown in FIG. 27B as long as the magnetic field can be applied to the MR element 100 (or 101) effectively. FIGS. 27C to 27E show the other embodiments of the word lines 170 and 173. Furthermore, an electrode 140 is brought into contact with the MR element part 100 (101) by the configuration shown in Embodiments 3 and 4.

FIG. 27C shows the arrangement in which the word lines 170 and 173 are displaced by a certain angle with respect to each other so that the magnetic field can be applied effectively to the MR element part 100 (or 101). Furthermore, FIG. 27D shows the case where the sense line 140 is substituted for the word line 170. FIG. 27E shows the case where the word lines 170 and 173 are placed at the side of the MR element part 100 (101). FIG. 27E shows the case where information is recorded to the MR element parts 100 (101) by using the resultant magnetic field generated by allowing a current to flow through both the word lines 170 and 173 in one direction and the resultant magnetic field of a sense line 140 (141) perpendicular to the word lines.

First of all, the case where the magnetoresistance storage element 1010 has a configuration in which the magnetoresistance storage element 1000 is provided with the word line 173 will be explained.

In this case, the MR element part 100 provided on the formed magnetoresistance storage element 1010 has a configuration of $Ni_{0.81}Fe_{0.19}$ (3)/Ru (0.7)/$Ni_{0.81}Fe_{0.19}$ (2)/$Al_2O_3$ (1.2)/$Co_{0.9}Fe_{0.1}$ (20) as mentioned in Embodiment 10. Furthermore, the MR element part 100 having a configuration of $Ni_{0.81}Fe_{0.19}$ (2)/Ru (0.7)/$Ni_{0.81}Fe_{0.19}$ (3)/$Al_2O_3$ (1.2)/ $Co_{0.9}Fe_{0.1}$ (20) also was formed.

For the conductive films 140 and 150, Au, Cu or Al was used; and for the conductive films 170 and 173, Cu was used. For insulation between the MR element part 101 and the conductive film 170, $SiO_2$ was used. Note here that in this Embodiment, $SiO_2$ was used for insulation, but $CaF_2$, $Al_2O_3$ or $Si_3N_4$ may be used.

The conductive films 140 and 150 (sense line and bit line), the conductive films 170 and 173 (word lines) are arranged in a matrix as shown in FIG. 27A. Furthermore, addressing switch parts 301 and 311 and signal detection parts 302 and 312 are arranged as shown in FIG. 27F. Note here that for easy explanation, the conductive film 173 is omitted in FIG. 27F. With the switch parts 301 and 311, arbitrary conductive films 140 and 150, conductive films 170 and 173 are selected. Furthermore, with signal detection parts 302 and 312, current value or voltage value of each conductive film is detected.

The information to be stored is written to the MR element part 100 by allowing a current pulse to flow through the conductive films 170 and 173 that correspond to a row element and a column element respectively and changing the state of magnetization with respect to only a certain MR element part 100.

The operation of wiring and reading out information to/from the MRAM device 5000 is basically the same as the operation shown in FIGS. 24A and 24B of Embodiment 8. The read-out operation with respect to the MRAM device 5000 in an arbitrary storage state was confirmed as follows.

By the switch parts 301 and 311, certain conductive films 140 and 150, and conductive films 170 and 173 are selected. While monitoring the resistance value of the MR element 100 corresponding to each of the selected conductive films, a magnetic field for inverting the magnetization of the soft magnetic film 130 (FIG. 1) is applied to the selected MR element 100. At this time, a pulse corresponding to the storage information as shown in FIG. 24B was detected via the signal detection part 302 or 312. Note here that since the storage state is stored, it was confirmed that the read-out operation was a NDRO operation. These results showed that the MRAM device 5000 of the present invention was realized.

Next, the case where the magnetoresistance storage element 1010 has a configuration in which the word line 173 is added in the magnetoresistance storage element 2000 shown in Embodiment 13 will be explained.

In this case, the MR element part 101 provided on the formed magnetoresistance storage element 1010 has a configuration of $Ni_{0.81}Fe_{0.19}$ (3)/Ru (0.7)/$Ni_{0.81}Fe_{0.19}$ (2)/$Al_2O_3$ (1.2)/$Co_{0.5}Fe_{0.5}$ (20)/IrMn (30) as mentioned in Embodiment 13. Furthermore, the MR element part 101 having a configuration of $Ni_{0.81}Fe_{0.19}$ (2)/Ru (0.7)/$Ni_{0.81}Fe_{0.19}$ (3)/ $Al_2O_3$ (1.2)/$Co_{0.5}Fe_{0.5}$ (20)/IrMn (30) also was formed.

For the conductive films 141 and 150, Au and Cu were used; and for the conductive films 170 and 173, AuCr was used. For insulation between the MR element part 101 and the conductive film 170, $SiO_2$ was used. Note here that in this Embodiment, $SiO_2$ was used for insulation, but $CaF_2$, $Al_2O_3$ or $Si_3N_4$ may be used.

The conductive films 141 and 150 (sense line and bit line), and the conductive films 170 and 173 (word line) are arranged in a matrix as shown in FIG. 27A. The storage is written to the MR element part 101 by allowing a current pulse to flow through the conductive films 170 and 173 that correspond to a row element and a column element respectively and changing the state of magnetization with respect to only a certain MR element part 101.

The operation of writing and reading out information to/from the MRAM device 5000 is basically the same as the operation shown in FIGS. 25A and 25B of Embodiment 9. The read-out operation with respect to the MRAM device 5000 in an arbitrary storage state was confirmed as follows.

By the switch parts 301 and 311, certain conductive films 141 and 150, and conductive films 170 and 173 are selected. While monitoring the resistance value of the MR element 100 corresponding to each of the selected conductive film, a magnetic field for inverting the magnetization of only the soft magnetic film 130 (FIG. 23B) is applied to the selected MR element. In this case, the magnetization direction of the soft magnetic film 130 means the direction designated by the difference between the effectively operating two ferromagnetic films 230 and 250 (FIG. 23B). As a result of monitoring, the voltage change corresponding to the storage information as shown in FIG. 25B was detected via the signal detection part 302 or 312.

These results showed that the MRAM device 5000 of the present invention was realized.

Also in this case, by bringing into contact with the MR element part 100 (101) configured shown in Embodiments 3 and 4, the through-put of chip capable of normally operating the MRAM device configured in 256×256 matrix was improved inside the 6-inch wafer. That is, it was confirmed that in the case where the covering rate was 5% or more and 60% or less, the degree of variations between elements in properties including the MR value, the junction resistance RA value and the bias dependency of both values was improved and that the operation stability of the MRAM device operating using these properties could be improved, showing that the present invention was effective.

(Embodiment 17)

As Embodiment 17 of the present invention, a method for forming the magnetoresistance storage element 2000 shown in Embodiment 2 having a soft magnetic film 130 shown in FIG. 23C of Embodiment 7 will be explained.

The MR element part 101 having the soft magnetic film 130 as shown in FIG. 23C of Embodiment 7 was formed by the same method as mentioned in Embodiment 8.

As a target, $Ni_{0.81}Fe_{0.19}$ for the ferromagnetic films 230 and 250 of a metal of an exchange-coupling type ferrimagnetic film, Ru for the non-magnetic film 240 of a metal, Al for the non-magnetic insulating film 120, $Co_{0.7}Fe_{0.3}$ for the ferromagnetic films 260 and 280 of a metal of another exchange-coupling type ferrimagnetic film and PtMn for the magnetization spinning suppression layer as an antiferromagnetic film 180 were used, respectively.

As the MR element part 101, a MR element part having a configuration of $Ni_{0.81}Fe_{0.19}$ (3)/Ru (3)/$Ni_{0.81}Fe_{0.19}$ (2)/$Al_2O_3$ (1.2)/$Co_{0.7}Fe_{0.3}$ (2)/Ru (0.7)/$Co_{0.7}Fe_{0.3}$ (3)/PtMn (2) was formed. Note here that $Al_2O_3$ was formed in the above-mentioned method A.

When the MR property of the MR element part 101 was measured at room temperature with 100 Oe of magnetic field applied, the MR ratio was about 36%. The junction area at this time was about 0.1 square micrometers.

It was confirmed that the MR element part 101 of this Embodiment had a smaller coercive force as compared with the MR element part having a basic configuration of $Ni_{0.81}Fe_{0.19}$ (5)/$Al_2O_3$ (1.2)/$Co_{0.7}Fe_{0.3}$ (2)/Ru (0.7)/$Co_{0.7}Fe_{0.3}$ (3)/PtMn (2). This is because the effect of the anti-magnetic field is reduced by employing a configuration as shown in FIG. 23C.

Furthermore, by using the MR element part 101 formed as mentioned above, the magnetoresistance storage element 2000 shown in Embodiment 2 was configured. For the conductive films 141 and 150, Au and Cu were used; and for the conductive film 170, AuCr was used. For insulation between the MR element part 101 and the conductive film 170, $SiO_2$ was used. Note here that in this Embodiment, $SiO_2$ was used for insulation, but $CaF_2$, $Al_2O_3$ or $Si_3N_4$ may be used.

The operation of the magnetoresistance storage element 2000 formed in the above-mentioned method was confirmed by the same method as shown in FIGS. 25A and 25B in Embodiment 7. As a result, it was found that the change of voltage in accordance with the storage information as shown in FIG. 25B is detected and the magnetoresistance storage element 2000 could be realized.

(Embodiment 18)

As Embodiment 18 of the present invention, another method for forming the magnetoresistance storage element 2000 shown in Embodiment 2 having a soft magnetic film 130 as shown in FIG. 23C of Embodiment 7 will be explained.

The MR element part 101 having the soft magnetic film 130 shown in FIG. 23C of Embodiment 7 was formed by the same method as in Embodiment 8.

As a target, $Ni_{0.81}Fe_{0.19}$ for the ferromagnetic films 230 and 250 of a metal of an exchange-coupling type ferrimagnetic film, Ru for the non-magnetic film 240 of a metal, Al for a non-magnetic insulating film 120, $Co_{0.9}Fe_{0.1}$ for the ferromagnetic films 260 and 280 of a metal of another exchange-coupling type ferrimagnetic film, and IrMn for the magnetization spinning suppression layer an antiferromagnetic film 180 were used, respectively. Furthermore, a MR element part 101 provided with a new ferromagnetic layer (not shown) in an interface between the non-magnetic insulating film 120 and the ferromagnetic film 250, and for this new ferromagnetic layer, $Co_{0.9}Fe_{0.1}$ was used.

As the MR element part 101, a MR element part having a configuration of $Ni_{0.81}Fe_{0.19}$ (3)/Ru (0.7)/$Ni_{0.81}Fe_{0.19}$ (2)/$Al_2O_3$ (1.2)/$Co_{0.9}Fe_{0.1}$ (2)/Ru (0.7)/$Co_{0.9}Fe_{0.1}$ (2)/IrMn (20), and a MR element part having a configuration of $Ni_{0.81}Fe_{0.19}$ (3)/Ru (0.7)/$Ni_{0.81}Fe_{0.19}$ (2)/$Co_{0.9}Fe_{0.1}$ (0.5)/$Al_2O_3$ (1.2)/$Co_{0.9}Fe_{0.1}$ (2)/Ru (0.7)/$Co_{0.9}Fe_{0.1}$ (2)/IrMn (20) were formed. Note here that $Al_2O_3$ was formed in the above-mentioned method A.

When the MR properties of the former MR element part 101 and the latter MR element part 101 including a new ferromagnetic layer were measured at room temperature with 100 Oe of magnetic field applied, the MR ratio of the former MR element part was about 35% and the MR ratio of the latter MR element part was about 37%. The junction area at this time was about 0.1 square micrometers in both MR element parts.

Furthermore, when the both MR element parts were subjected to heat treatment, the MR ratio of the latter MR element part was increased to about 41% by the heat treatment at about 280° C. This suggests that the new ferromagnetic layer formed of $Co_{0.9}Fe_{0.1}$ suppresses mutual diffusion of Ni and Al in $Ni_{0.81}Fe_{0.19}$ and $Al_2O_3$, so that a stable interface is realized. Note here that it is desirable that this $Co_{0.9}Fe_{0.1}$ layer was formed in the thickness of about 1 nm.

Furthermore, by using the MR element part 101 formed as mentioned above, the magnetoresistance storage element 2000 shown in Embodiment 2 was configured. For the conductive films 141 and 150, Au and Cu were used; and for the conductive film 170, AuCr was used. For insulation between the MR element part 101 and the conductive film 170, $SiO_2$ was used. Note here that in this Embodiment, $SiO_2$ was used for insulation, but $CaF_2$, $Al_2O_3$ or $Si_3N_4$ may be used.

The operation of the magnetoresistance storage element 2000 formed in the above-mentioned method was confirmed by the same method as shown in FIGS. 25A and 25B in Embodiment 9. As a result, it was found that the change of voltage in accordance with the storage information as shown in FIG. 25B was detected and the magnetoresistance storage element 2000 could be realized.

(Embodiment 19)

As Embodiment 19 of the present invention, a method for forming the magnetoresistance storage element 1000 shown in Embodiment 1 will be explained.

The MR element part 1000 shown in FIG. 1 was formed by the same method as in Embodiment 8.

As a target, $Ni_{0.8}Fe_{0.2}$ (for the soft magnetic film 130), Al (for the non-magnetic insulating film 120) and NiMnSb (for the hard magnetic film 110) were used so as to form a MR element part 100 having a configuration of $Ni_{0.8}Fe_{0.2}$ (15)/$Al_2O_3$ (1.2)/NiMnSb (50) on a sapphire c face substrate. Note here that $Al_2O_3$ was formed in the above-mentioned method A.

When the MR property of the MR element part 100 was measured at room temperature with 100 Oe of magnetic field applied, the MR ratio was about 40%. The junction area at this time was about 0.25 square micrometers.

Note here that in this Embodiment, the case of using the sapphire c face substrate was explained, but even if a magnesium oxide substrate (100) is used, an excellent NiMnAb film can be formed.

Furthermore, the example in which the NiMnSb was used as a material exhibiting high magnetization polarizability was mentioned. However, in the case where PtMnSb or PdMnSb is used, a high MR property can be exhibited almost similarly, and thus an excellent magnetoresistance element can be formed.

Furthermore, by using the MR element part 100 formed as mentioned above, the magnetoresistance storage element 1000 shown in Embodiment 1 was formed on the sapphire c face substrate. For the conductive films 140 and 150, Au and Cu were used; and for the conductive film 170, AuCr was used. For insulation between the MR element part 100 and the conductive film 170, $SiO_2$ is used. Note here that in this Embodiment, $SiO_2$ was used for insulation, but $CaF_2$, $Al_2O_3$ or $Si_3N_4$ may be used.

The operation of the magnetoresistance storage element 1000 formed in the above-mentioned method was confirmed by the same method as shown in FIGS. 24A and 24B in Embodiment 8. As a result, it was found that the pulse in accordance with the storage information as shown in FIG. 24B was detected and the magnetoresistance storage elements 1000 of the present invention could be realized.

(Embodiment 20)

As Embodiment 20 of the present invention, another method for forming the magnetoresistance storage element 1000 as shown in Embodiment 1 will be explained.

The magnetoresistance storage element 1000 as shown in FIG. 1 was formed by the same method as in Embodiment 8 mentioned above.

As a target, $Ni_{0.8}Fe_{0.2}$ (for the soft magnetic film 130), Al (for the non-magnetic insulating film 120) and PtMnSb (for the hard magnetic film 110) were used.

On a sapphire c face substrate, a MR element part 100 having a configuration of $Ni_{0.8}Fe_{0.2}$ (15) $Al_2O_3$ (1.2)/ PtMnSb (50) was formed. Note here that $Al_2O_3$ was formed in the above-mentioned method A.

First of all, on the sapphire c face substrate, PtMnSb was allowed to grow epitaxially under conditions where the film formation temperature was about 500° C. PtMnSb exhibited the (111) plane orientation due to the lattice matching with the sapphire c face substrate. Thereafter, an Al film was deposited so as to form $Al_2O_3$ by the above-mentioned method A. On $Al_2O_3$, $Ni_{0.8}Fe_{0.2}$ was deposited so as to form a MR element part 100 having a configuration of $Ni_{0.8}Fe_{0.2}$ (15)/$Al_2O_3$ (1.2)/PtMnSb (50).

When the MR property of the MR element part 101 was measured at room temperature with 100 Oe of magnetic field applied, the MR ratio was about 40%. The junction area at this time was about 0.25 square micrometers.

Note here that in this Embodiment, the case of using the sapphire c face substrate was explained, but even if a magnesium oxide substrate (100) is used, an excellent NiMnAb film can be formed. Furthermore, in this case, it was found that PtMnSb oriented to a (100) plane could be formed due to the lattice matching.

In this Embodiment, the example in which PtMnSb was used as a material exhibiting high magnetization polarizability was mentioned. However, in the case where NiMnSb or PdMnSb is used, a high MR property can be exhibited almost similarly, and thus an excellent magnetoresistance element can be formed.

Furthermore, by using the MR element part 100 formed as mentioned above, the magnetoresistance storage element 1000 shown in Embodiment 1 was formed on the sapphire c face substrate. For the conductive films 140 and 150, Au and Cu were used; and for the conductive film 170, AuCr was used. For insulation between the MR element part 100 and the conductive film 170, $SiO_2$ was used. Note here that in this Embodiment, $SiO_2$ was used for insulation, but $CaF_2$, $Al_2O_3$ or $Si_3N_4$ may be used.

The operation of the magnetoresistance storage element 1000 formed in the above-mentioned method was confirmed by the same method as shown in FIGS. 24A and 24B in Embodiment 8. As a result, it was found that the pulse in accordance with the storage information as shown in FIG. 24B was detected and the magnetoresistance storage elements 1000 of the present invention could be realized.

(Embodiment 21)

As Embodiment 21 of the present invention, a method for forming the magnetoresistance storage element 2000 as shown in Embodiment 2 will be explained.

The magnetoresistance storage element 2000 shown in FIG. 3 was formed by the same method as in Embodiment 8 mentioned above.

As a target, $Ni_{0.8}Fe_{0.2}$ for the soft magnetic film 130, Al for the non-magnetic insulating film 120, PtMnSb for the ferromagnetic film 190 and $\alpha$-$Fe_2O_3$ for a magnetization spinning suppression layer as the antiferromagnetic layer 180 were used.

In manufacture, $\alpha$-$Fe_2O_3$ was allowed to grow on the sapphire c face substrate so as to form a MR element part 101 having a configuration of $Ni_{0.8}Fe_{0.2}$ (15)/$Al_2O_3$ (1.2)/ PtMnSb (25)/$\alpha$-$Fe_2O_3$(40). Note here that $Al_2O_3$ was formed by the above-mentioned method A.

When the MR property of the MR element part 101 was measured at room temperature with 100 Oe of magnetic field applied, the MR ratio was about 40%. The junction area at this time was about 0.25 square micrometers.

In this Embodiment, the example in which the PtMnSb was used as a material exhibiting high magnetization polarizability was mentioned. However, NiMnSb or CuMnSb also exhibits almost the same property and can manufacture a magnetoresistance element that exhibits an excellent MR property.

Furthermore, by using the MR element part 101 formed as mentioned above, the magnetoresistance storage element 2000 shown in Embodiment 2 was formed on the sapphire c face substrate. For the conductive films 141 and 150, Au and Cu were used; and for the conductive film 170, AuCr was used. For insulation between the MR element part 101 and the conductive film 170, $SiO_2$ was used. Note here that in this Embodiment, $SiO_2$ was used for insulation, but $CaF_2$, $Al_2O_3$ or $Si_3N_4$ may be used.

The operation of the magnetoresistance storage element 2000 formed in the above-mentioned method was confirmed by the same method as shown in FIGS. 25A and 25B in Embodiment 9. As a result, it was found that the change of voltage in accordance with the storage information as shown in FIG. 25B is detected and the magnetoresistance storage element 2000 could be realized.

(Embodiment 22)

As Embodiment 22 of the present invention, a method for forming the magnetoresistance storage element 2000 shown in Embodiment 2 having a soft magnetic film 130 shown in FIG. 23C in Embodiment 7 will be explained.

The MR element part 101 having a soft magnetic film 130 shown in FIG. 23C in Embodiment 7 was formed by the same method as in Embodiment 8 mentioned above.

As a target, $Ni_{0.81}Fe_{0.19}$ for the ferromagnetic films 230 and 250 of a metal of an exchange-coupling type ferrimagnetic film, Ru for the non-magnetic film 240 of a metal, Al for the non-magnetic insulating film 120, $Co_{0.9}Fe_{0.1}$ for the ferromagnetic films 260 and 280 of a metal of another exchange-coupling type ferrimagnetic film and IrMn for the magnetization spinning suppression layer as the antiferromagnetic film 180 were used.

As the MR element part 101, a MR element part having a configuration of $Ni_{0.81}Fe_{0.19}$ (3)/Ru (0.7)/$Ni_{0.81}Fe_{0.19}$ (2)/$Al_2O_3$ (1.2)/$Co_{0.9}Fe_{0.1}$ (2)/Ru (0.7)/$Co_{0.9}Fe_{0.1}$ (3)/IrMn (20) was formed. Note here that $Al_2O_3$ was formed in the above-mentioned method A.

When the MR property of the MR element part 101 was measured at room temperature with 100 Oe of magnetic field applied, the MR ratio was about 35%. The junction area at this time was about 0.05 square micrometers.

Furthermore, the magnetoresistance storage element 2000 shown in Embodiment 2 was formed by using the MR element part 101 formed as mentioned above. Furthermore, in this case, the electrode 141 is brought into contact with the MR element part 100 (101) in a configuration shown in Embodiments 3 and 4. For the conductive films 141 and 150, Cu was used; and also for the conductive film 170, Cu was used. For insulation between the MR element part 101 and the conductive film 170, $SiO_2$ was used. Note here that in this Embodiment, $SiO_2$ was used for insulation, but $CaF_2$, $Al_2O_3$ or $Si_3N_4$ may be used.

Figure 28:
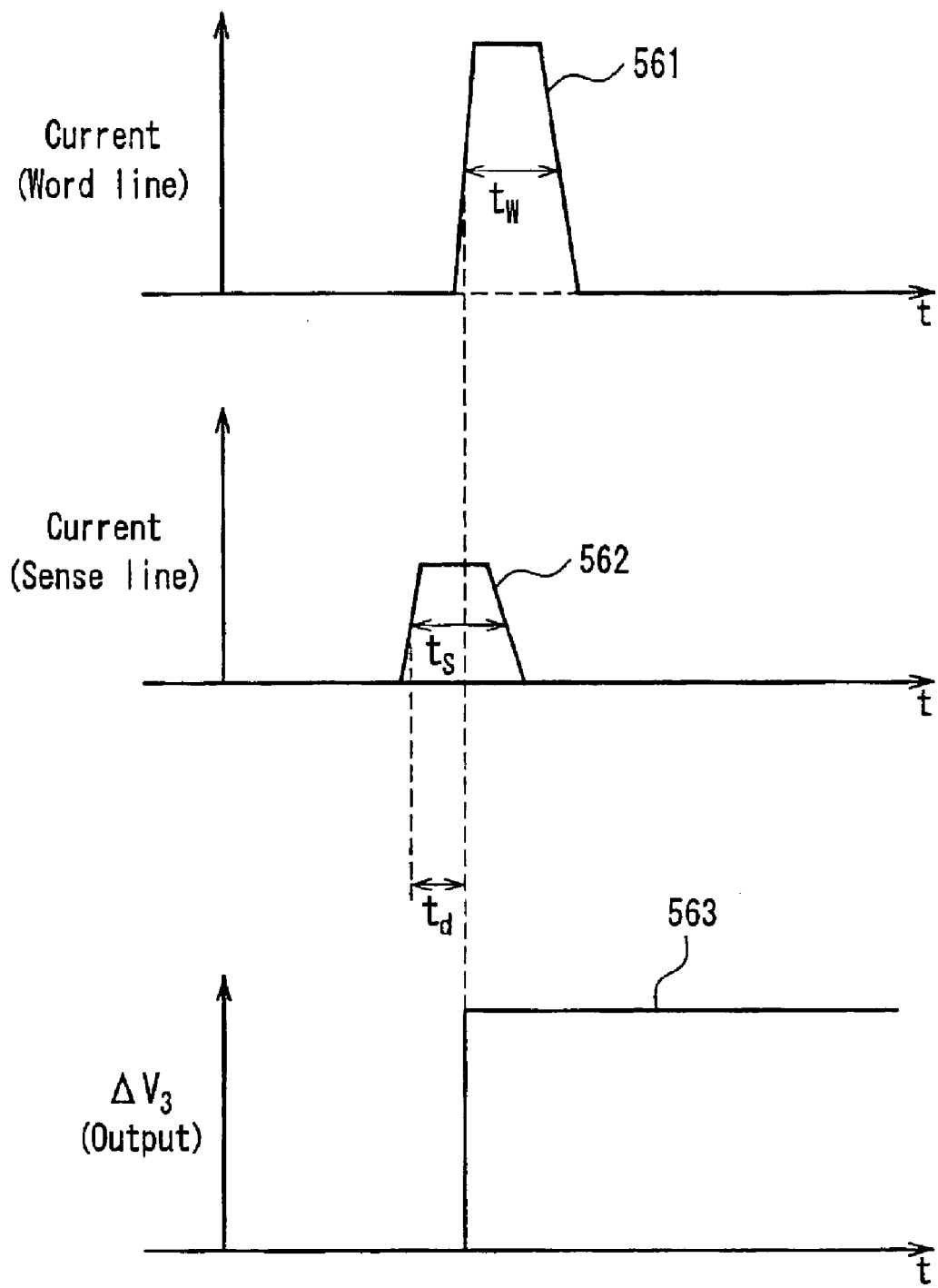
FIG. 28 is view showing an operation of a magnetoresistance storage element according to Embodiment 22 of the present invention.

In order to confirm the high-speed operation of the magnetoresistance storage element 2000 formed as mentioned above, current pulses 561 and 562 as shown in the graph in the upper part or middle portion in FIG. 28 are allowed to flow respectively to the conductive film 170 that is a word line and the conductive film 150 that is set to be a sense line, and the voltage change $\Delta V_3$ of the MR element part 101 was monitored. As a result, the voltage change 563 corresponding to the storage information as shown in the lower graph in FIG. 28 was detected.

As one example, this Embodiment shows a configuration in which the direction in which a magnetic field is generated due to the current application to the sense line is directed to the direction of the axis of hard magnetization; and the direction in which a magnetic field is generated due to the current application to the word line is directed to the direction of the axis of easy magnetization, respectively. That is, the MR element part 101 has a configuration in which the magnetization occurs more easily in the direction of a magnetic field generated from the sense line than in the direction of a magnetic field generated from the word line.

At this time, it was found that by changing the trigger timing of the pulse current applied to the sense line and the word line, a difference in the output voltage occurred. The magnitude of the applied current pulse to the word line was made to be larger than that to the sense line. It is preferable that the pulse width $t_s$ of the current applied to the sense line is 0.1 ns or more at minimum; the pulse width $t_w$ of the current applied to the word line is 0.1 ns or more; and the timing difference $t_d$ between the pulse of the current applied to the word line and the pulse of the current applied to the sense line is about 0.1 ns or more and 50 nm or less, respectively. It was found that by carrying out the operation for changing the trigger timing like this, the high MR ratio was secured and high output voltage was obtained.

Furthermore, such an output property shows that when the magnetization direction is rotated by 180°, not only by applying a magnetic field only in the direction of the axis of easy magnetization (or in the direction of the axis of hard magnetization), but also by applying a magnetic field in the direction of the axis of hard magnetization prior to applying a magnetic field in the direction of the axis of easy magnetization, a high output voltage can be obtained effectively. It can be thought that this operation makes it easy to apply the magnetic torque with respect to the magnetization inversion in the direction of the axis of easy magnetization.

This Embodiment employs a configuration in which a magnetic field is generated in the direction of the axis of hard magnetization by using a sense line and in the direction of the axis of easy magnetization by using a word line. However, the opposite arrangement may be possible.

Figure 20:
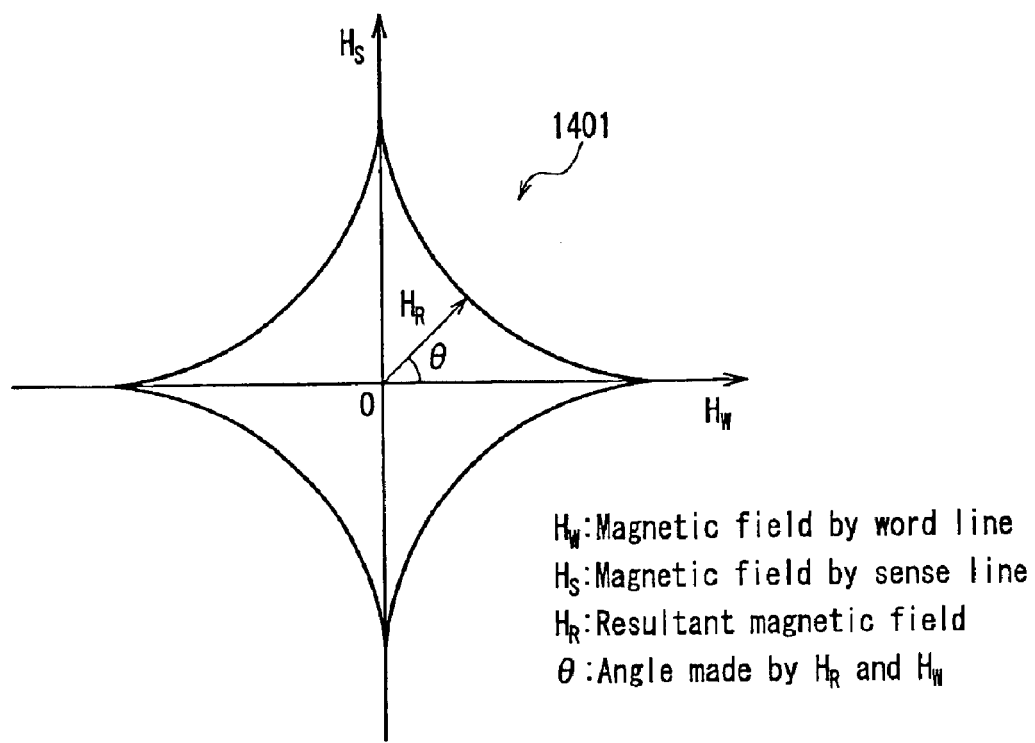
FIG. 20 is a view showing a curve of an asteroid type magnetic field of the present invention.

Furthermore, when a magnetic field is applied by using both the sense line and the word line which are substantially perpendicular to each other, by the asteroid type magnetic field curve 1401 as shown in FIG. 20, the magnitude $H_s$ of the magnetic field due to the sense line and the magnitude $H_w$ of the magnetic field due to the word line are determined. Therefore, by applying a magnetic field by using both the sense line and the word line that are perpendicular to each other (or two word lines perpendicular to each other), it is possible not only to select address of the storage element but also to reduce the value of the current flowing through the sense line and the word line for generating magnetic field.

Figure 29A:
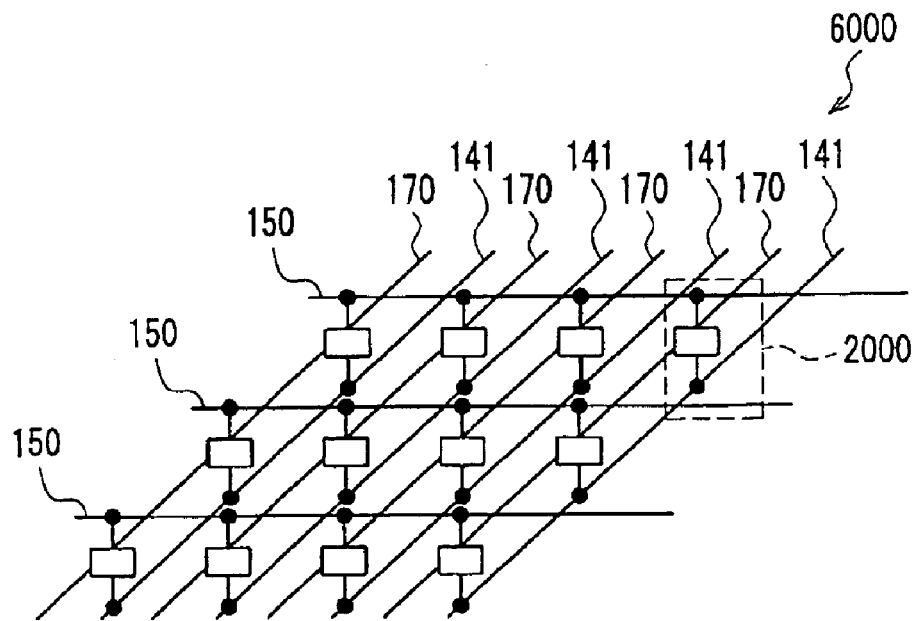
FIG. 29A is a perspective view showing an MRAM device according to Embodiment 22 of the present invention.
Figure 29B:
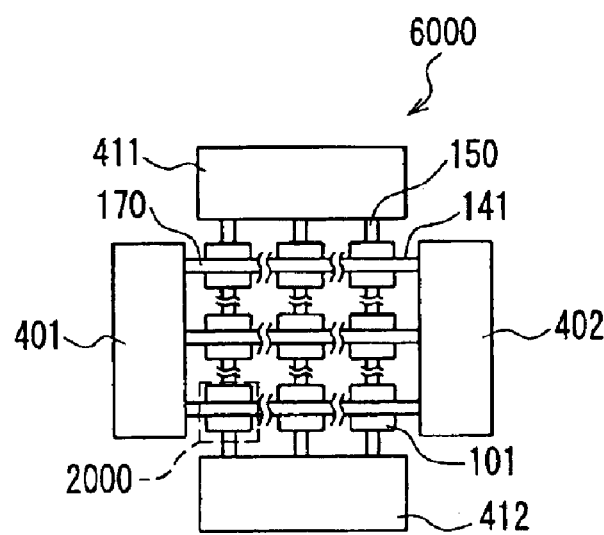
FIG. 29B is a top view showing the MRAM device according to Embodiment 22 of the present invention.

Next, as shown in FIG. 29A, a MRAM device 6000 was configured in which a plurality of the above-mentioned magnetoresistance storage elements 2000 are arranged in 512×512 matrix. Note here that any number of magnetoresistance storage elements 2000 can be arranged. As shown in FIG. 29B, addressing switches 401 and 411 and signal detection parts 402 and 412 are provided. With the switch parts 401 and 411, arbitrary conductive films 141, 150 and 170 are selected. Furthermore, with signal detection parts 402 and 412, the current value or voltage value of each conductive film is detected.

Preferably, the word line 170 is arranged along the upper part of the MR element part 101 as shown in FIG. 29B. However, the arrangement is not limited to this as long as the magnetic field can effectively be applied to the MR element part 101.

The conductive films 141 and 150 (bit line and sense line), the conductive films 170 and 173 (word lines) are arranged in a matrix as shown in FIG. 27A. Furthermore, addressing switch parts 401 and 411, and signal detection parts 402 and 412 are arranged as shown in FIG. 27B. With the switch parts 401 and 411, arbitrary conductive films 141, 150 and 170 are selected. Furthermore, with signal detection parts 402 and 412, the current value or voltage value of each conductive film is detected.

The storage is written into the MR element part 100 by allowing a current pulse to flow through the conductive films 150 and 170 that correspond to a row element and a column element respectively and changing the state of magnetization with respect to only a certain MR element part 101. In this Embodiment, the conductive 150 (sense line) is used instead of the conductive film 173 (word line) shown in Embodiment 16.

The read-out operation with respect to the MRAM device 6000 in an arbitrary storage state was confirmed as follows.

By the switch parts 401 and 411, certain conductive films 141, 150 and 170 are selected. Then, the resistance value of the MR element 101 corresponding to the selected conductive film was monitored. Then, similar to the read-out method shown in Embodiment 2, the difference value between the resistance value of the monitored corresponding MR element 101 and the reference resistance was monitored via a difference circuit (not shown, preferably it is incorporated into the signal detection parts 402 and 412) and the storage state could be read out in accordance with the difference value. These results showed that the MRAM device 6000 of the present invention was realized. Also in this case, it was confirmed that by the contact with the MR element part 100 (101) configured shown in Embodiments 3 and 4, the through-put of a chip capable of normally operating the MRAM device 6000 configured in 512×512 matrix was improved inside the 6-inch wafer. That is, it was confirmed that in the case where the covering rate is 5% or more and 60% or less, the degree of variations between elements in the magnetoresistance properties including the MR value, the junction resistance RA value and bias dependency of both values is improved, and that the operation stability of MRAM device operating using these properties could be improved. Thus, it was confirmed that the present invention was effective.

(Embodiment 23)

Figure 30A:
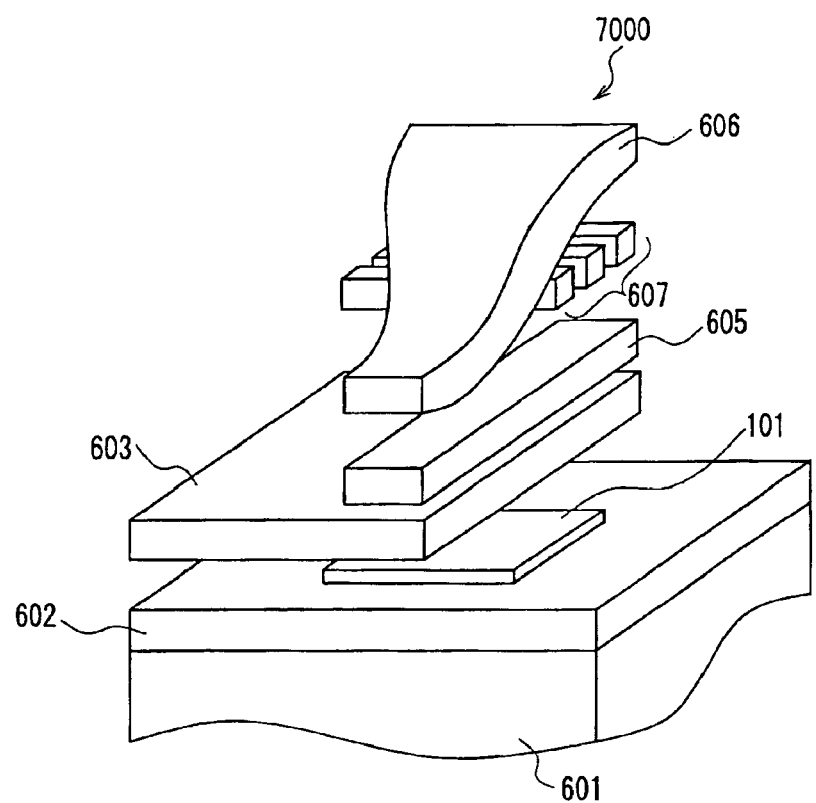
FIG. 30A is a perspective view showing a magnetoresistance effect head according to Embodiment 23 of the present invention.
Figure 30B:
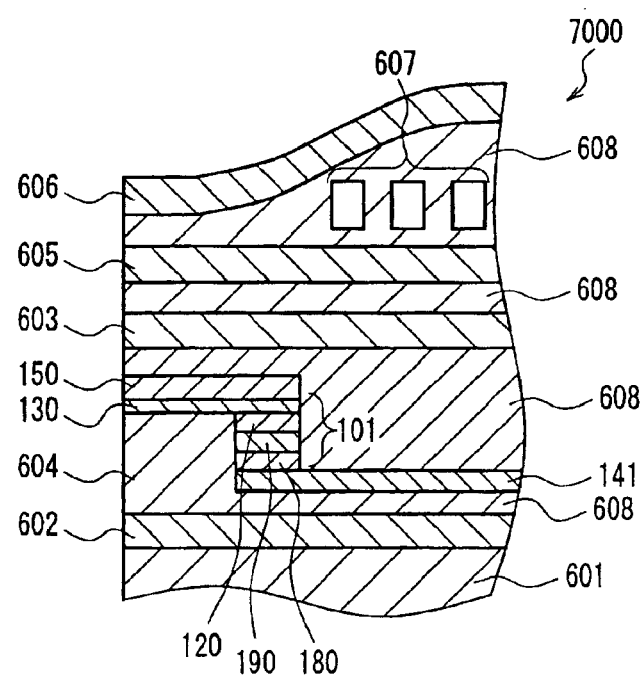
FIG. 30B is a cross-sectional view showing the magnetoresistance effect head according to Embodiment 23 of the present invention.

As Embodiment 23 of the present invention, FIGS. 30A and 30B show a magnetoresistance effect head 7000 provided with the MR element part 101 shown in Embodiment 2 (FIG. 3). FIG. 30A is a perspective view of the magnetoresistance effect head 7000, and FIG. 30B is a cross-sectional view showing a magnetoresistance effect head 7000. The MR element part 101 of the magnetoresistance effect head 7000 includes a soft magnetoresistance film 130 shown in Embodiment 7 (FIG. 23B). The same component elements as those of the magnetoresistance storage element 2000 explained in Embodiments 2 and 5 are given the same numbers and the explanations therefor are omitted herein.

The MR element part 101 was formed by the same method as in the above-mentioned Embodiment 8.

As a target, $Co_{0.9}Fe_{0.1}$ or $Ni_{0.81}Fe_{0.19}$ for the ferromagnetic films 230 and 250 of a metal of an exchange-coupling type ferrimagnetic film, Ru for the non-magnetic film 240 of a metal, Al for the non-magnetic insulating film 120, $Co_{0.9}Fe_{0.1}$ for the ferromagnetic film 190, and IrMn for the magnetization spinning suppression layer as an antiferromagnetic film 180 were used.

As the MR element part 101, a MR element part having a configuration of $Ni_{0.81}Fe_{0.19}$ (3)/Ru (0.7)/$Ni_{0.81}Fe_{0.19}$ (2)/$Al_2O_3$ (1.2)/$Co_{0.9}Fe_{0.1}$ (20)/IrMn (30) was formed. Note here that $Al_2O_3$ was formed in the above-mentioned method A.

When the MR property of the MR element part 101 was measured at room temperature with 100 Oe of magnetic field applied, the MR ratio was about 30%. The junction area at this time was about 0.25 square micrometers.

The magnetoresistance effect head 7000 is provided with such a tunnel junction type MR element part 101.

The magnetoresistance effect head 7000 includes a substrate 601 for slider formed of a sintered body containing $Al_2O_3$ and TiC, shield layers 602 and 603, recording magnetic poles 605 and 606 formed of NiFe alloy, a coil 607 formed of Cu, and a gap layer 608 between component elements formed of $Al_2O_3$ The film thicknesses of the shield layers 602 and 603 are respectively 1 $\mu$m. Furthermore, the film thickness of the recording magnetic poles 605 and 606 are respectively 3 $\mu$m. The film thickness of the gap layer 608 is 0.1 $\mu$m between the shield layers 602, 603 and the MR element part 101; and 0.2 $\mu$m between the recording magnetic poles 605 and 606. The interval between the conductive film 150 and the recording magnetic pole 605 is about 4 $\mu$m. The film thickness of the coil 607 is 3 $\mu$m.

In this configuration, the MR element part 101 is placed between the shield layers 602 and 603 and it is not exposed directly to the head surface 604.

A bias current is applied to the MR element part 101 through the conductive films 141 and 150. The soft magnetic layer 130 and the ferromagnetic film 190 are set so that the magnetization directions thereof are perpendicular to each other. The displacement of the magnetization direction in accordance with the reproduced signal could be read out with high sensitivity.

Figure 31A:
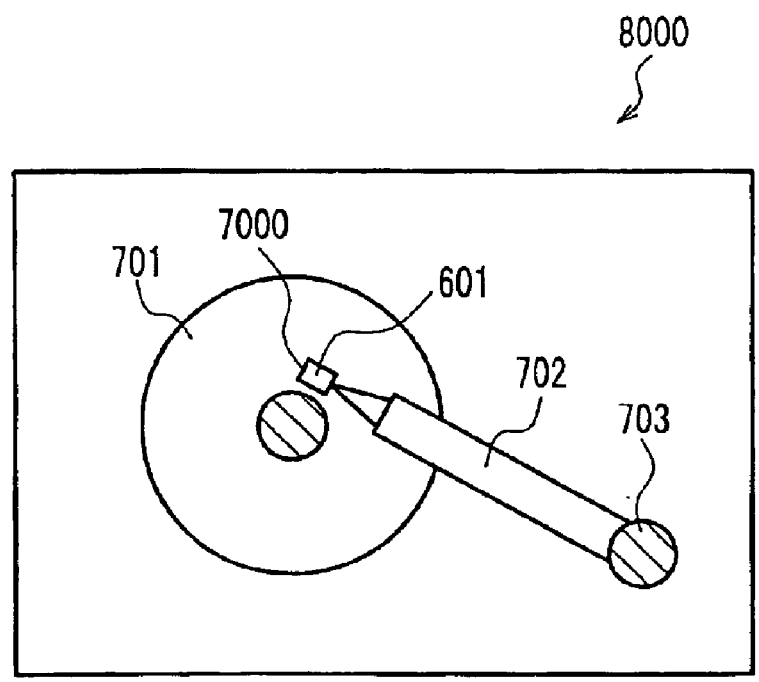
FIG. 31A is a top view showing a magnetic disk apparatus according to Embodiment 23 of the present invention.
Figure 31B:
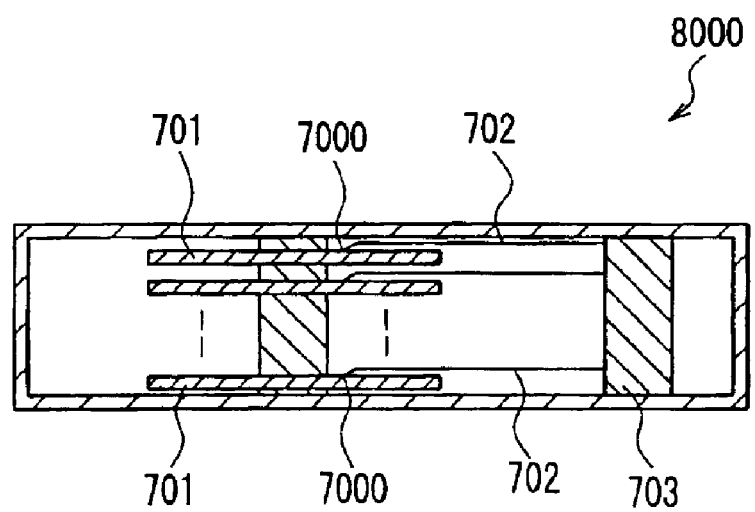
FIG. 31B is a cross-sectional view showing a magnetic disk apparatus according to Embodiment 23 of the present invention.

Furthermore, as shown in FIGS. 31A and 31B, a magnetic disk apparatus 8000 provided with the above-mentioned magnetoresistance effect head 7000 was formed. FIG. 31A is a top view showing a magnetic disk apparatus 8000 and FIG. 31B is a cross-sectional view showing a magnetic disk apparatus 8000.

The magnetic recording medium 701 is formed of a Co—Ni—Pt—Ta based alloy. The magnetoresistance effect head 7000 is supported by a magnetic head supporting part 702 and driven by the magnetic head driving part 703. The track width of the magnetoresistance effect head 7000 was set to be 5 $\mu$m. The magnetic disk apparatus 8000 includes a plurality of the above-mentioned configurations as shown in FIG. 31B.

The magnetoresistance effect head 7000 of the present invention has a higher resistance change rate than that of the GMR type magnetoresistance effect head that is a conventional CIPMR element. Therefore, the magnetoresistance effect head 7000 has high reproduction output and it is very effective as the reproduction magnetic head. From the formed magnetic disk apparatus 8000, it is possible to detect the voltage change in accordance with the information recorded in the magnetic recording medium 701 excellently. It was found that the magnetoresistance effect head 7000 of the present invention could be realized.

Note here that the MR element parts 100, 101, 102 and 200 shown in all Embodiments of the present invention can be used as the magnetoresistance effect head as in this Embodiment. In all these cases, it was confirmed that by the contact with the MR element part 100 (101) configured shown in Embodiments 3 and 4, the through-put of chips capable of normally operating the device was improved inside the 6-inch wafer. That is, it was confirmed that in the case where the covering rate is 5% or more and 60% or less, the degree of variations between elements in magnetoresistance properties including the MR value, the junction resistance RA value and the bias dependency of both values is improved, and that the operation stability of devices operating by the use of these properties could be improved. Thus, it wad confirmed that the present invention was effective.

INDUSTRIAL APPLICABILITY

As mentioned above, according to the present invention, it is possible to restrict variations between elements in magnetoresistance properties including the MR value, the junction resistance RA value, etc. in a fine patterned magnetoresistance element, magnetoresistance storage element and magnetic memory.

What is claimed is:

1. A magnetoresistance element, comprising:

a non-magnetic layer made of a non-magnetic insulating film;

a first ferromagnetic layer and a second ferromagnetic layer formed so as to sandwich the non-magnetic layer;

a first electric conductor formed so as to be brought into contact with substantially the center of the surface opposite to the non-magnetic layer of the first ferromagnetic layer;

a second electric conductor formed so as to be brought into contact with the surface opposite to the non-magnetic layer of the second ferromagnetic layer; and an insulator formed so as to cover at least the side surfaces of the first ferromagnetic layer and the non-magnetic layer;

wherein at least one of the first ferromagnetic layer and the second ferromagnetic layer is magnetized along the direction parallel to the first ferromagnetic layer and the second ferromagnetic layer, the magnetization of one of the first ferromagnetic layer and the second ferromagnetic layer is easily inverted by a magnetic field applied from the outside and another is not easily inverted by a magnetic field applied from the outside, the magnetoresistance element is operated by a current flowing from the first electric conductor to the second electric conductor through the first ferromagnetic layer, the non-magnetic layer and the second ferromagnetic layer, the first electric conductor and the second electric conductor are electrically insulated from each other by the insulator except that the first electric conductor is kept in electric contact with the second electric conductor by a current flowing through the first ferromagnetic layer, the non-magnetic layer and the second ferromagnetic layer, the insulator is formed so as to cover the peripheral edge of the surface of the first ferromagnetic layer, the ratio of the area of the surface covered with the insulator of the first ferromagnetic layer is 5% or more and 60% or less relative to the area of the entire surface of the first ferromagnetic layer, a current of at least $1\times10^5$ amperes/cm$^2$ flows from the first electric conductor to the second electric conductor through the first ferromagnetic layer, the non-magnetic layer and the second ferromagnetic layer, at the end of the insulator formed so as to cover the peripheral edge of the surface of the first ferromagnetic layer, a curve having a radius of curvature of 5 nm or more is formed, and the first electric conductor is curved along the curve and smoothly comes into contact with the first ferromagnetic layer.

2. A magnetoresistance storage element, comprising:

a non-magnetic layer made of a non-magnetic insulating film;

a first ferromagnetic layer and a second ferromagnetic layer formed so as to sandwich the non-magnetic layer;

a first electric conductor formed so as to be brought into contact with substantially the center of the surface opposite to the non-magnetic layer of the first ferromagnetic layer;

a second electric conductor formed so as to be brought into contact with the surface opposite to the non-magnetic layer of the second ferromagnetic layer; and an insulator formed so as to cover at least the side surfaces of the first ferromagnetic layer and the non-magnetic layer;

wherein at least one of the first ferromagnetic layer and the second ferromagnetic layer is magnetized along the direction parallel to the first ferromagnetic layer and the second ferromagnetic layer, the magnetization of one of the first ferromagnetic layer and the second ferromagnetic layer is easily inverted by a magnetic field applied from the outside and another is not easily inverted by a magnetic field applied from the outside, the magnetoresistance storage element is operated by a current flowing from the first electric conductor to the second electric conductor through the first ferromagnetic layer, the non-magnetic layer and the second ferromagnetic layer, the magnetoresistance storage element has at least two or more magnetization stable states in which the magnetization direction of the first ferromagnetic layer and the magnetization direction of the second ferromagnetic layer are parallel or non-parallel to each other, thereby exhibiting at least two or more storage states, the first electric conductor and the second electric conductor are electrically insulated from each other by the insulator except that the first electric conductor is kept in electric contact with the second electric conductor by a current flowing through the first ferromagnetic layer, the non-magnetic layer and the second ferromagnetic layer, the insulator is formed so as to cover the peripheral edge of the surface of the first ferromagnetic layer, the ratio of the area of the surface covered with the insulator of the first ferromagnetic layer is 5% or more and 60% or less relative to the area of the entire surface of the first ferromagnetic layer, a current of at least $1\times10^5$ amperes/cm$^2$ flows from the first electric conductor to the second electric conductor through the first ferromagnetic layer, the non-magnetic layer and the second ferromagnetic layer, at the end of the insulator formed so as to cover the peripheral edge of the surface of the first ferromagnetic layer, a curve having a radius of curvature of 5 nm or more is formed, and the first electric conductor is curved alone the curve and smoothly comes into contact with the first ferromagnetic layer.

3. A magnetic memory, comprising:

a non-magnetic layer made of a non-magnetic insulating film;

a first ferromagnetic layer and a second ferromagnetic layer formed so as to sandwich the non-magnetic layer;

a first electric conductor formed so as to be brought into contact with substantially the center of the surface opposite to the non-magnetic layer of the first ferromagnetic layer;

a second electric conductor formed so as to be brought into contact with the surface opposite to the non-magnetic layer of the second ferromagnetic layer;

an insulator formed so as to cover at least the side surfaces of the first ferromagnetic layer and the non-magnetic layer; and a non-magnetic conductive layer provided for inverting the magnetization of only the first ferromagnetic layer, or the magnetization of both the first ferromagnetic layer and the second ferromagnetic layer and arranged in a position that is not in electric contact with the first ferromagnetic layer, the second ferromagnetic layer, the first electric conductor and the second electric conductor;

wherein at least one of the first ferromagnetic layer and the second ferromagnetic layer is magnetized along the direction parallel to the first ferromagnetic layer and the second ferromagnetic layer, the magnetization of one of the first ferromagnetic layer and the second ferromagnetic layer is easily inverted by a magnetic field applied from the outside and another is not easily inverted by a magnetic field applied from the outside, the magnetic memory is operated by a current flowing from the first electric conductor to the second electric conductor through the first ferromagnetic layer, the non-magnetic layer and the second ferromagnetic layer, the magnetic memory has at least two or more magnetization stable states in which the magnetization direction of the first ferromagnetic layer and the magnetization direction of the second ferromagnetic layer are parallel or non-parallel to each other, thereby exhibiting at least two or more storage states, the first electric conductor and the second electric conductor are electrically insulated from each other by the insulator except that the first electric conductor is kept in electric contact with the second electric conductor by a current flowing through the first ferromagnetic layer, the non-magnetic layer and the second ferromagnetic layer, the insulator is formed so as to cover the peripheral edge of the surface of the first ferromagnetic layer, the ratio of the area of the surface covered with the insulator of the first ferromagnetic layer is 5% or more and 60% or less relative to the area of the entire surface of the first ferromagnetic layer, a current of at least $1\times10^5$ amperes/cm$^2$ flows from the first electric conductor to the second electric conductor through the first ferromagnetic layer, the non-magnetic layer and the second ferromagnetic layer, at the end of the insulator formed so as to cover the peripheral edge of the surface of the first ferromagnetic layer, a curve having a radius of curvature of 5 nm or more is formed, and the first electric conductor is curved along the curve and smoothly comes into contact with the first ferromagnetic layer.

* * * * *